(12) United States Patent
Hirata et al.

(10) Patent No.: US 11,018,110 B2
(45) Date of Patent: May 25, 2021

(54) SEMICONDUCTOR DEVICE, MANUFACTURING METHOD, AND SOLID-STATE IMAGING DEVICE

(71) Applicant: SONY SEMICONDUCTOR SOLUTIONS CORPORATION, Kanagawa (JP)

(72) Inventors: Akiko Hirata, Kanagawa (JP); Tadayuki Kimura, Kanagawa (JP); Yasufumi Miyoshi, Tokyo (JP); Katsunori Hiramatsu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 14 days.

(21) Appl. No.: 16/337,120

(22) PCT Filed: Oct. 10, 2017

(86) PCT No.: PCT/JP2017/036649
§ 371 (c)(1),
(2) Date: Mar. 27, 2019

(87) PCT Pub. No.: WO2018/079243
PCT Pub. Date: May 3, 2018

(65) Prior Publication Data
US 2020/0035643 A1    Jan. 30, 2020

(30) Foreign Application Priority Data
Oct. 24, 2016    (JP) .............................. JP2016-207539

(51) Int. Cl.
*H01L 23/00* (2006.01)
*H01L 27/146* (2006.01)

(52) U.S. Cl.
CPC .............. *H01L 24/89* (2013.01); *H01L 24/03* (2013.01); *H01L 24/05* (2013.01); *H01L 24/08* (2013.01);
(Continued)

(58) Field of Classification Search
CPC ......... H01L 24/89; H01L 24/03; H01L 24/05; H01L 24/08; H01L 24/06; H01L 27/14636; H01L 27/1469
See application file for complete search history.

(56) References Cited

U.S. PATENT DOCUMENTS

2010/0117109 A1* 5/2010 Unno ...................... H01L 33/44
257/98
2012/0139127 A1   6/2012 Beyne
(Continued)

FOREIGN PATENT DOCUMENTS

CN         103503122 A     1/2014
CN         104718611 A     6/2015
(Continued)

OTHER PUBLICATIONS

International Search Report and Written Opinion of PCT Application No. PCT/JP2017/036649, dated Nov. 28, 2017, 08 pages of ISRWO.

*Primary Examiner* — Seahvosh Nikmanesh
(74) *Attorney, Agent, or Firm* — Chip Law Group

(57) ABSTRACT

The present technology relates to a semiconductor device, a manufacturing method, and a solid-state imaging device which are capable of suppressing a decrease in bonding strength and preventing a poor electrical connection or peeling when two substrates are bonded to each other. Provided is a semiconductor device, including: a first substrate including a first electrode including a metal; and a second substrate bonded to the first substrate and including a second electrode including a metal. An acute-angled
(Continued)

concavo-convex portion is formed on a side surface of a groove in which the first electrode is formed and a side surface of a groove in which the second electrode metal-bonded to the first electrode is formed. The present technology can be, for example, applied to a solid-state imaging device such as a CMOS image sensor.

6 Claims, 40 Drawing Sheets

(52) U.S. Cl.
CPC .... *H01L 27/1469* (2013.01); *H01L 27/14634* (2013.01); *H01L 27/14636* (2013.01); *H01L 2224/031* (2013.01); *H01L 2224/0346* (2013.01); *H01L 2224/03616* (2013.01); *H01L 2224/05551* (2013.01); *H01L 2224/05557* (2013.01); *H01L 2224/05647* (2013.01); *H01L 2224/08111* (2013.01); *H01L 2224/08147* (2013.01); *H01L 2224/802* (2013.01); *H01L 2224/80035* (2013.01); *H01L 2224/80345* (2013.01); *H01L 2224/80357* (2013.01); *H01L 2224/80895* (2013.01); *H01L 2224/80896* (2013.01); *H01L 2224/80948* (2013.01); *H01L 2924/35121* (2013.01)

(56) References Cited

U.S. PATENT DOCUMENTS

| | | |
|---|---|---|
| 2013/0328186 A1 | 12/2013 | Uzoh et al. |
| 2014/0145338 A1 | 5/2014 | Fujii et al. |
| 2019/0103329 A1* | 4/2019 | Aoki .................... H01L 23/055 |
| 2020/0066936 A1* | 2/2020 | Hwang ................. G01N 21/33 |

FOREIGN PATENT DOCUMENTS

| | | |
|---|---|---|
| EP | 2463896 A1 | 6/2012 |
| EP | 2717300 A1 | 4/2014 |
| EP | 2859582 A2 | 4/2015 |
| JP | 2012-124484 A | 6/2012 |
| JP | 2012-244101 A | 12/2012 |
| JP | 2013-165099 A | 8/2013 |
| JP | 2015-525480 A | 9/2015 |
| JP | 2016-181531 A | 10/2016 |
| KR | 10-2014-0022039 A | 2/2014 |
| KR | 10-2015-0021996 A | 3/2015 |
| TW | 201308560 A | 2/2013 |
| TW | 201405739 A | 2/2014 |
| WO | 2012/161044 A1 | 11/2012 |
| WO | 2013/184921 A2 | 12/2013 |
| WO | 2016/152513 A1 | 9/2016 |

* cited by examiner

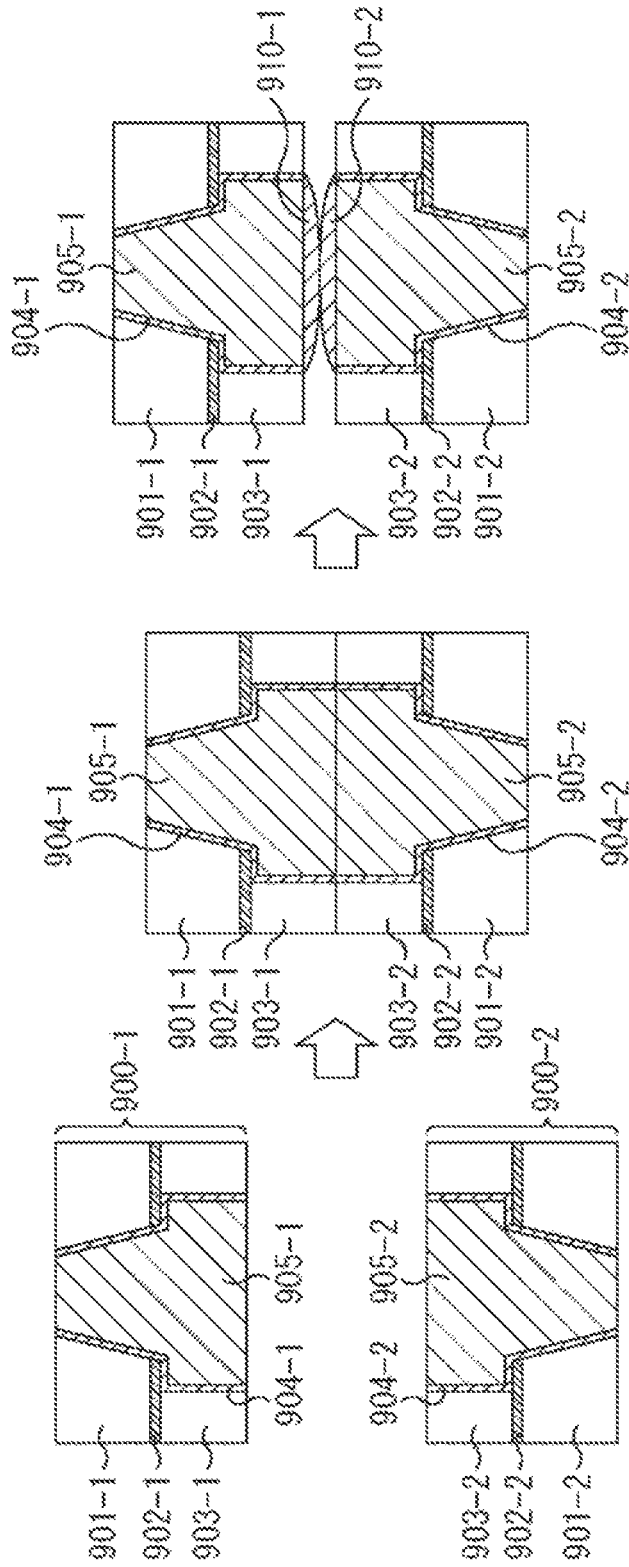

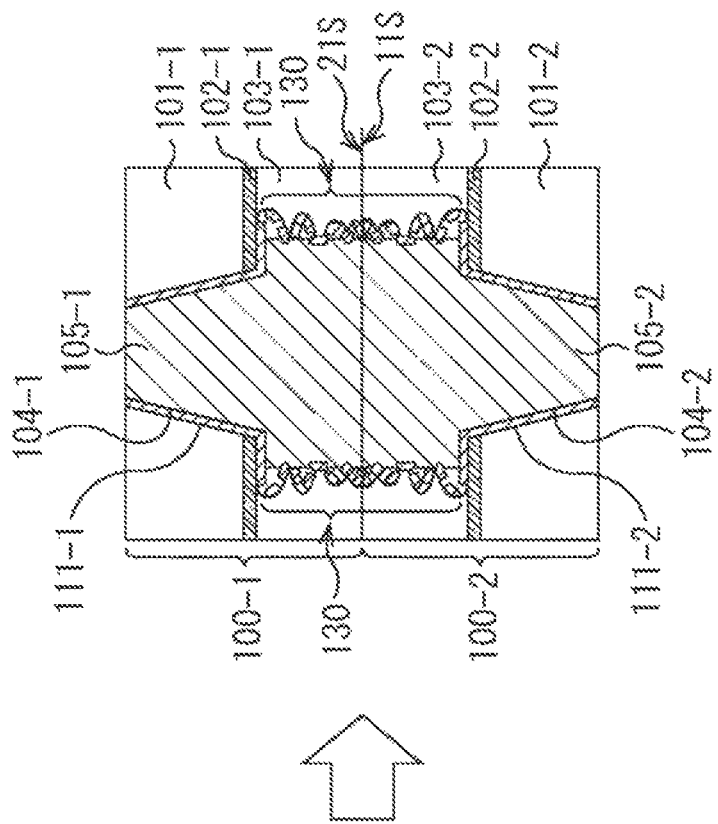
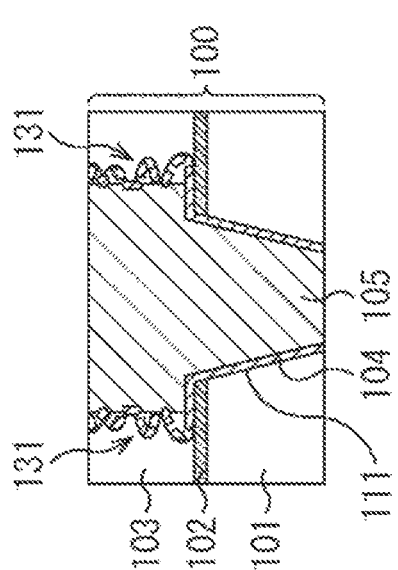
FIG. 3B
FIG. 3A

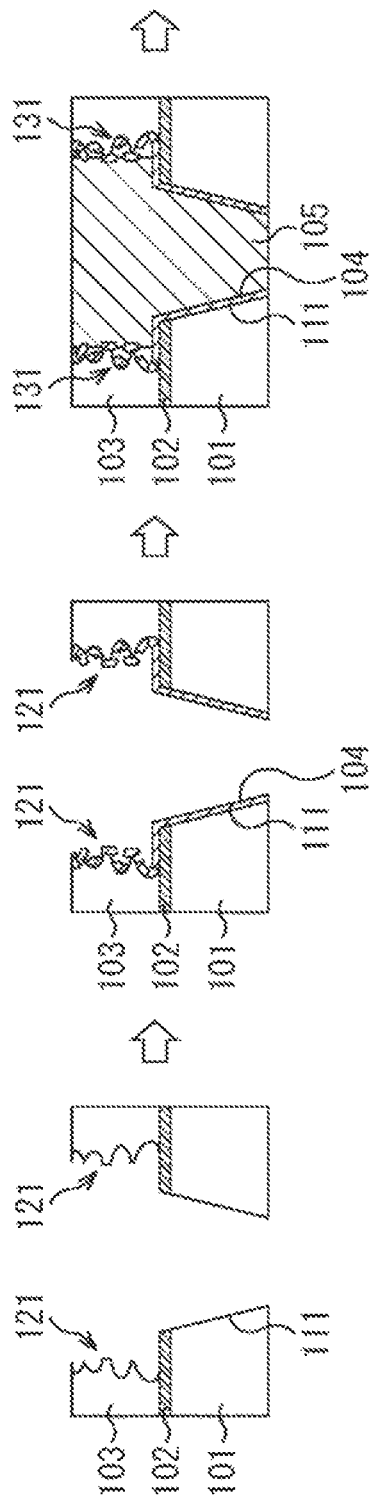

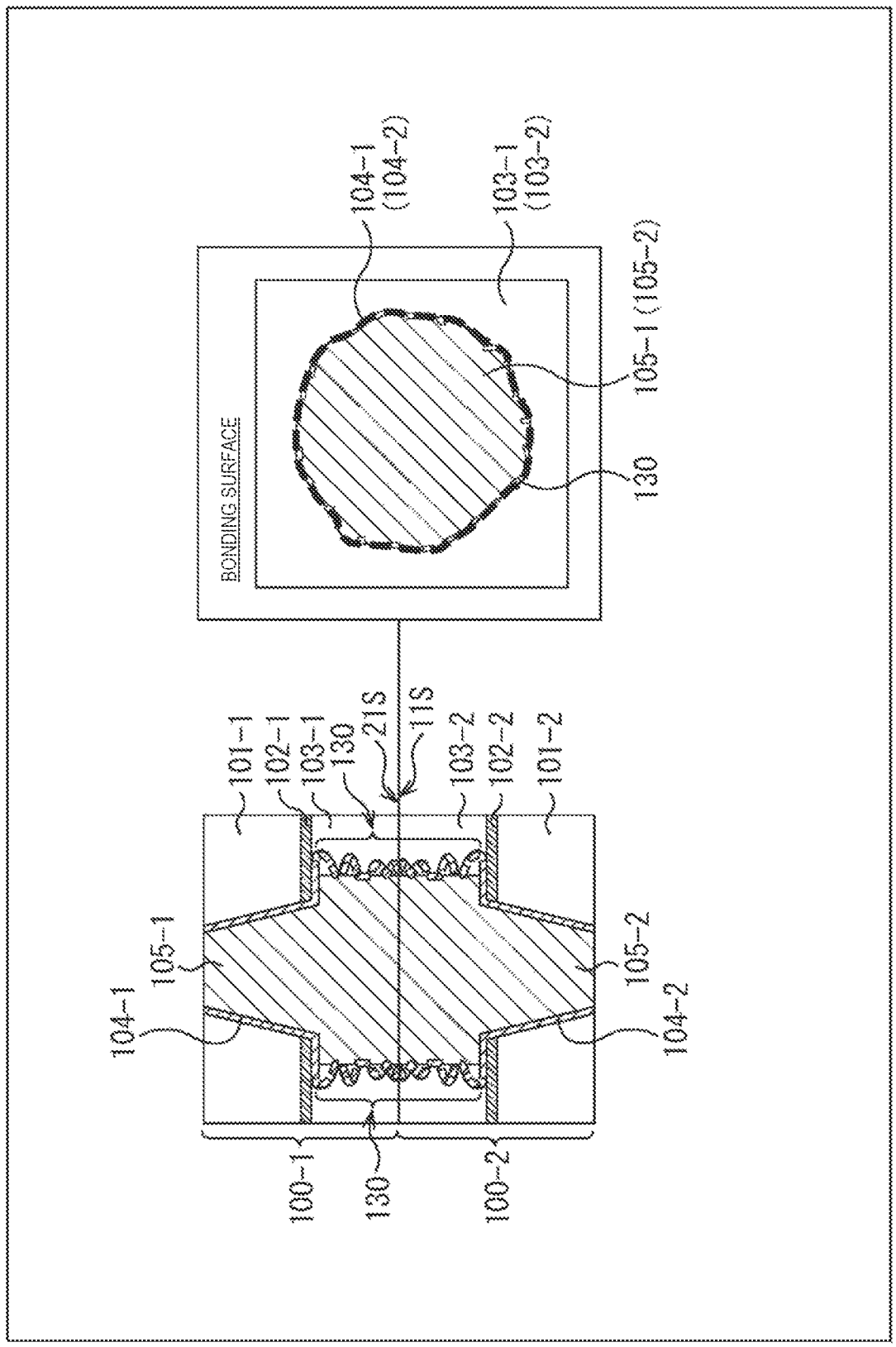

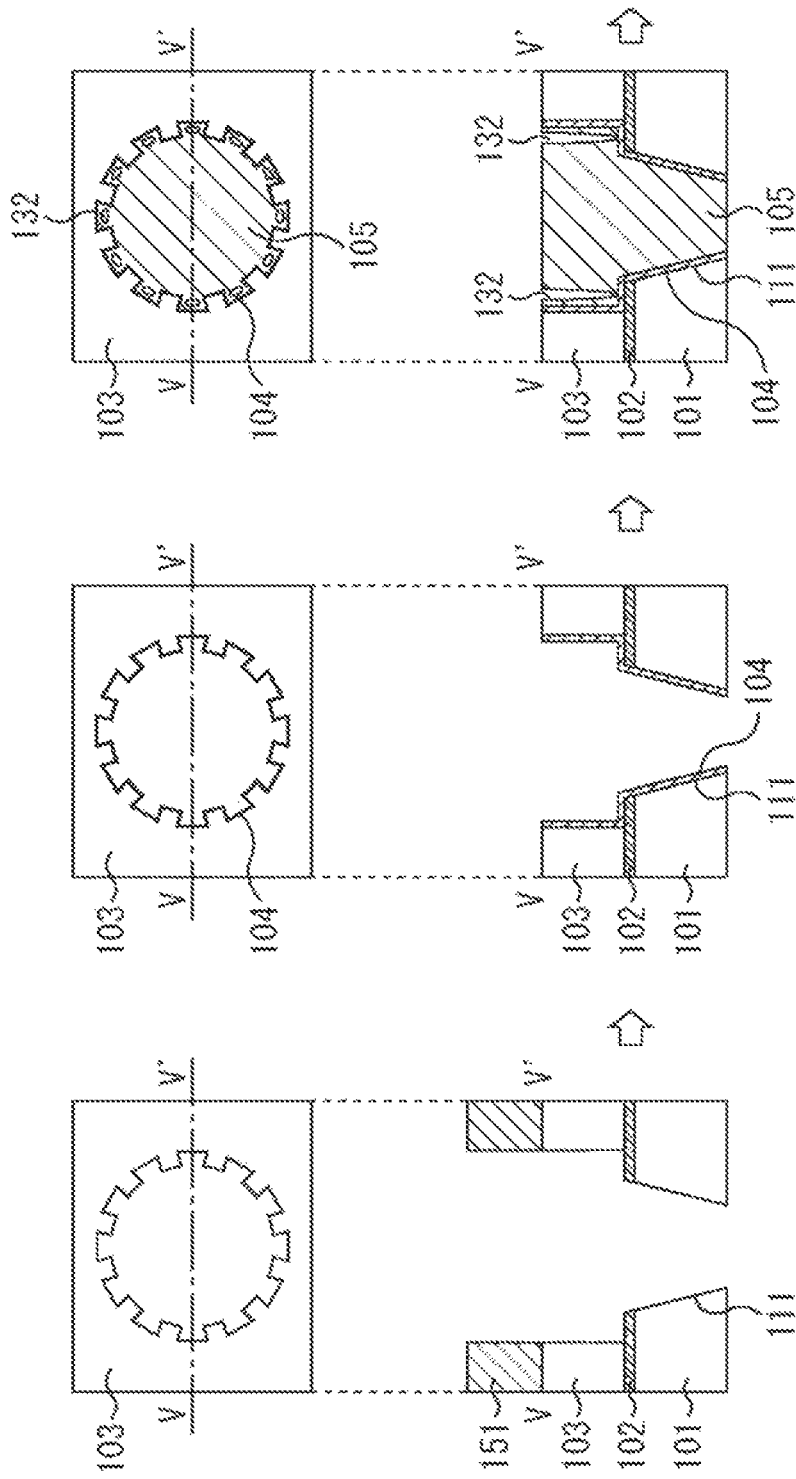

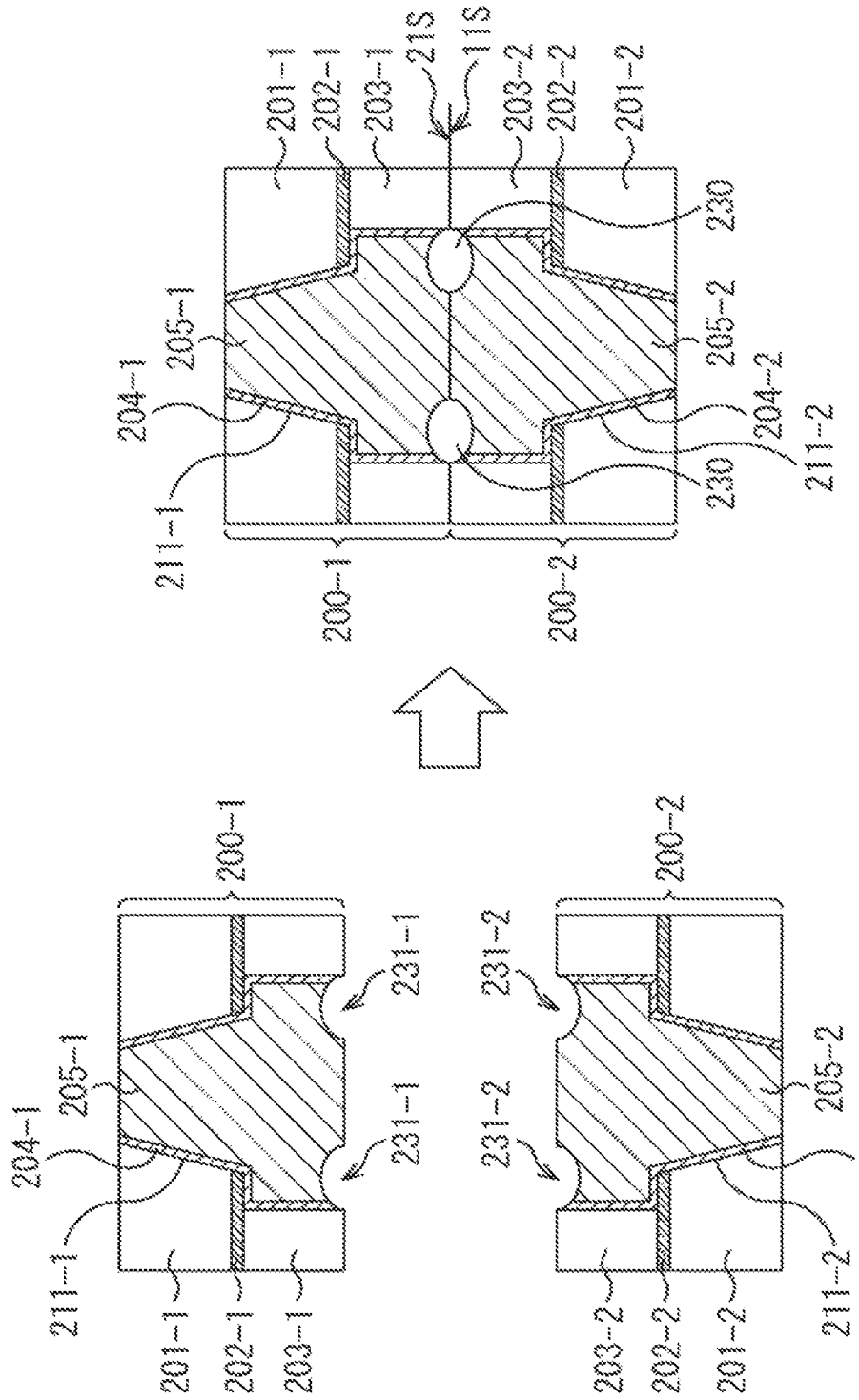

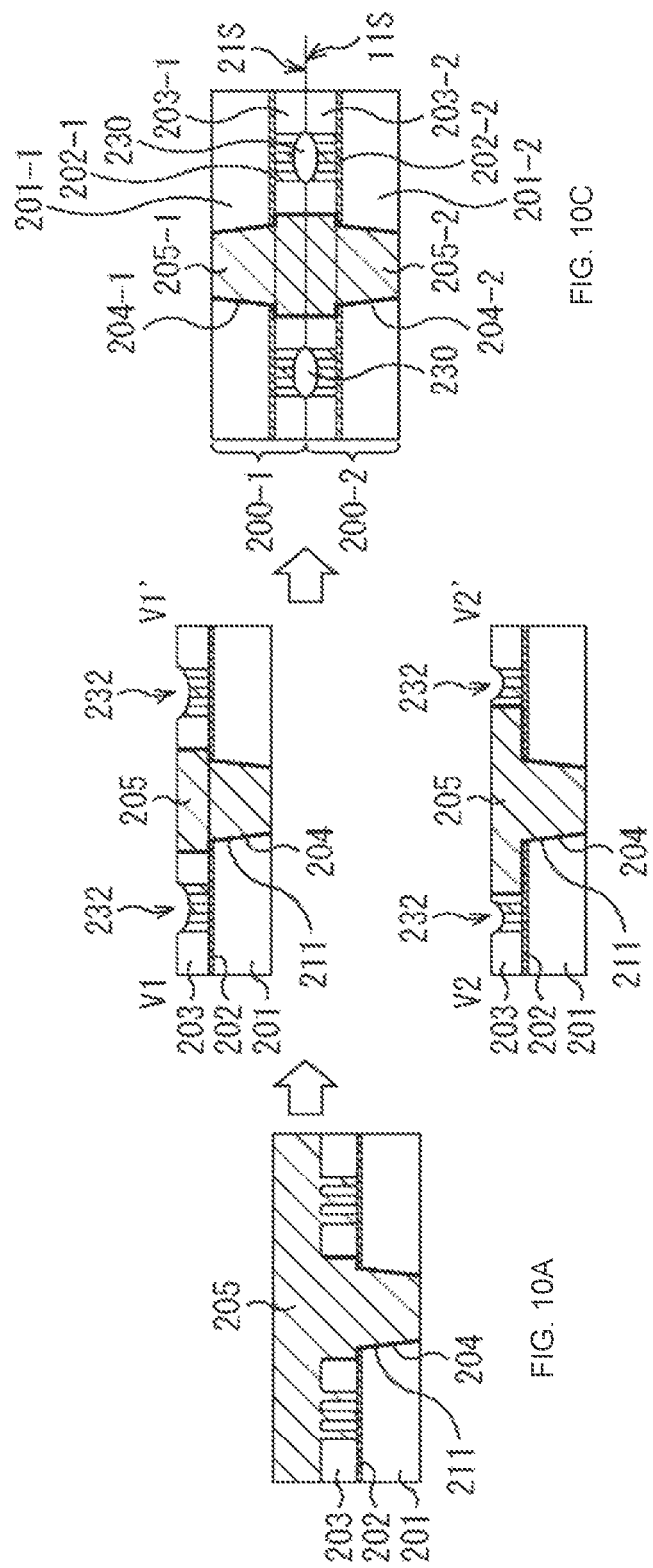

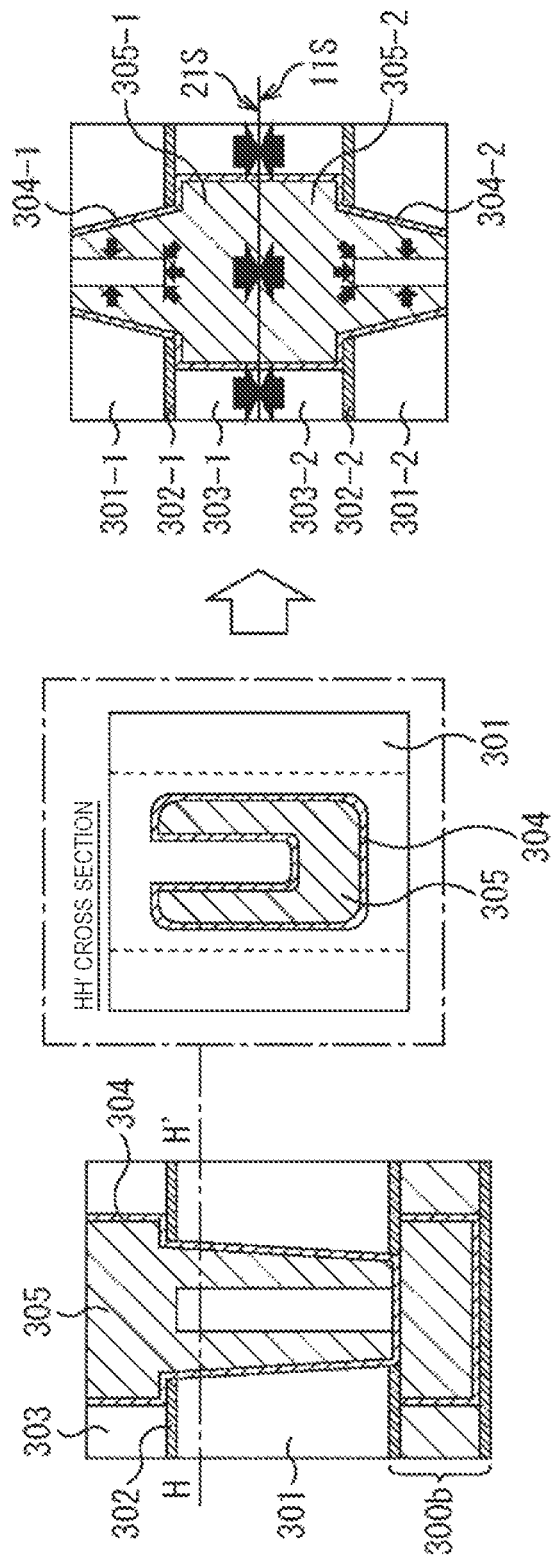

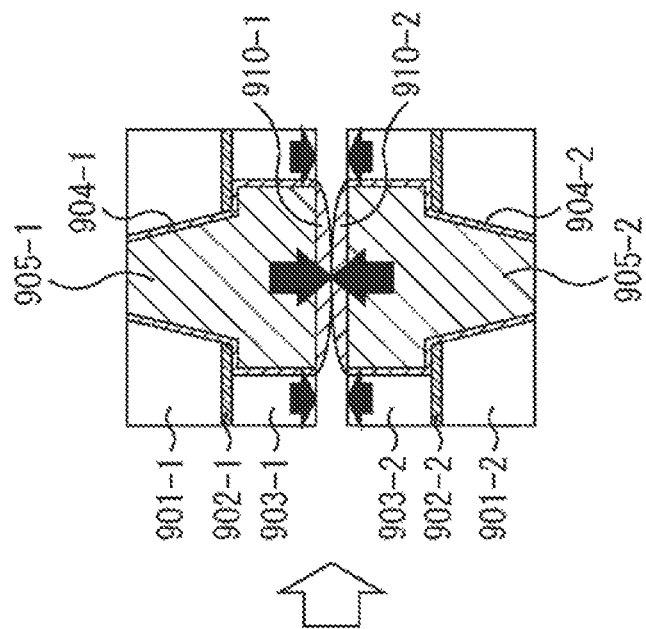
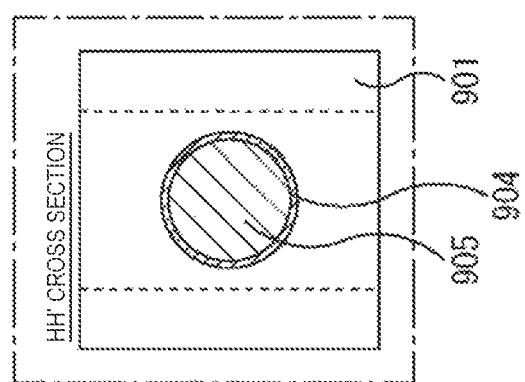
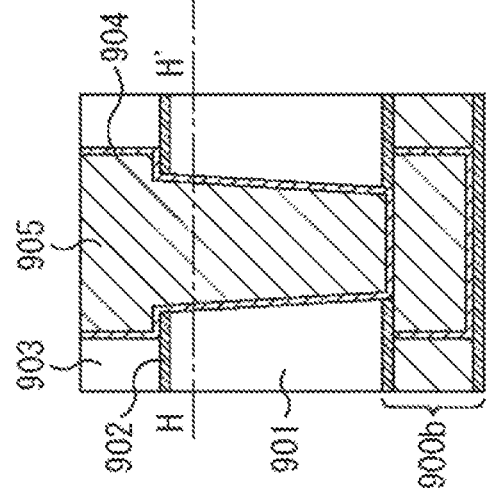
FIG. 15A
FIG. 15B

H-H' CROSS SECTION

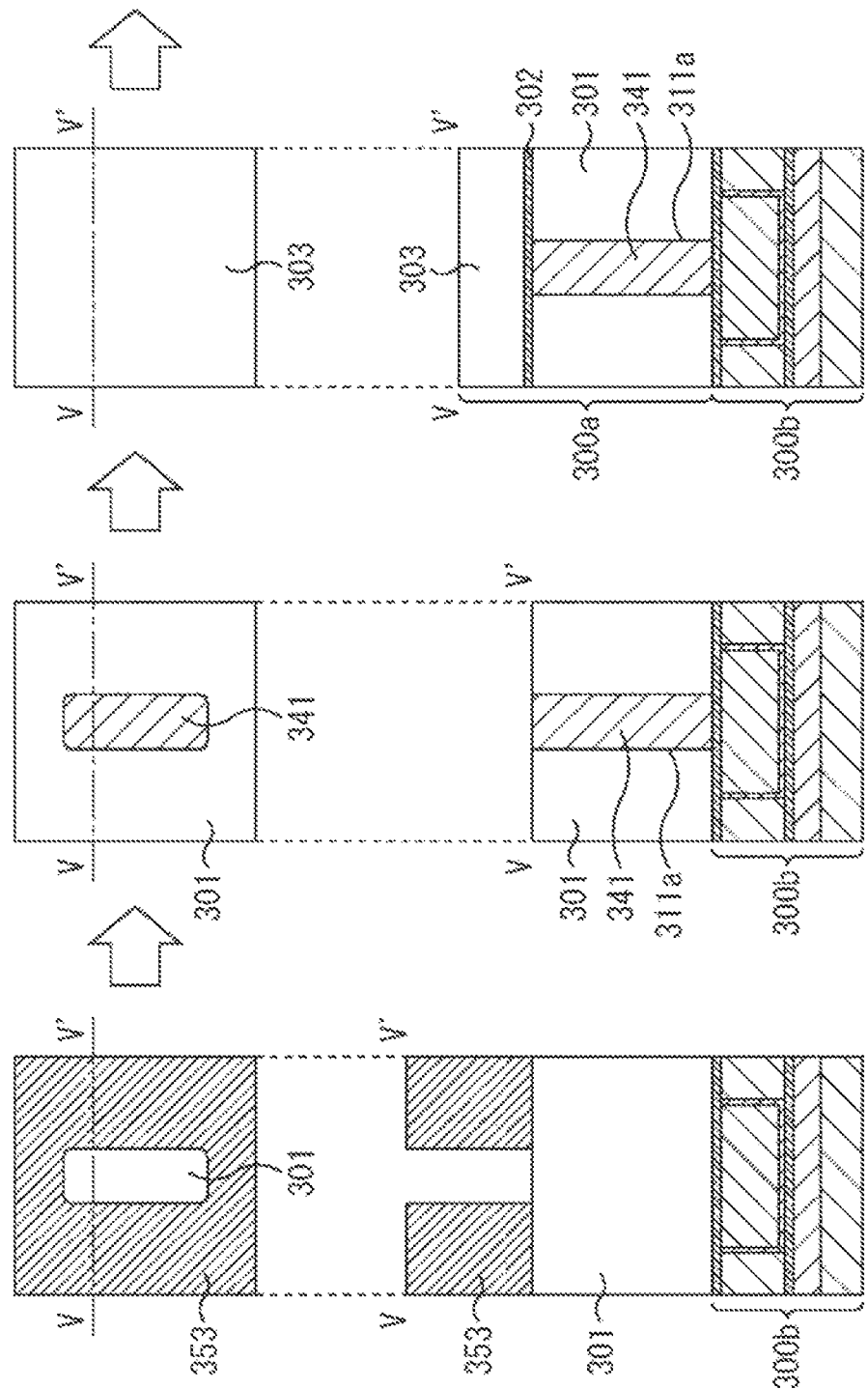

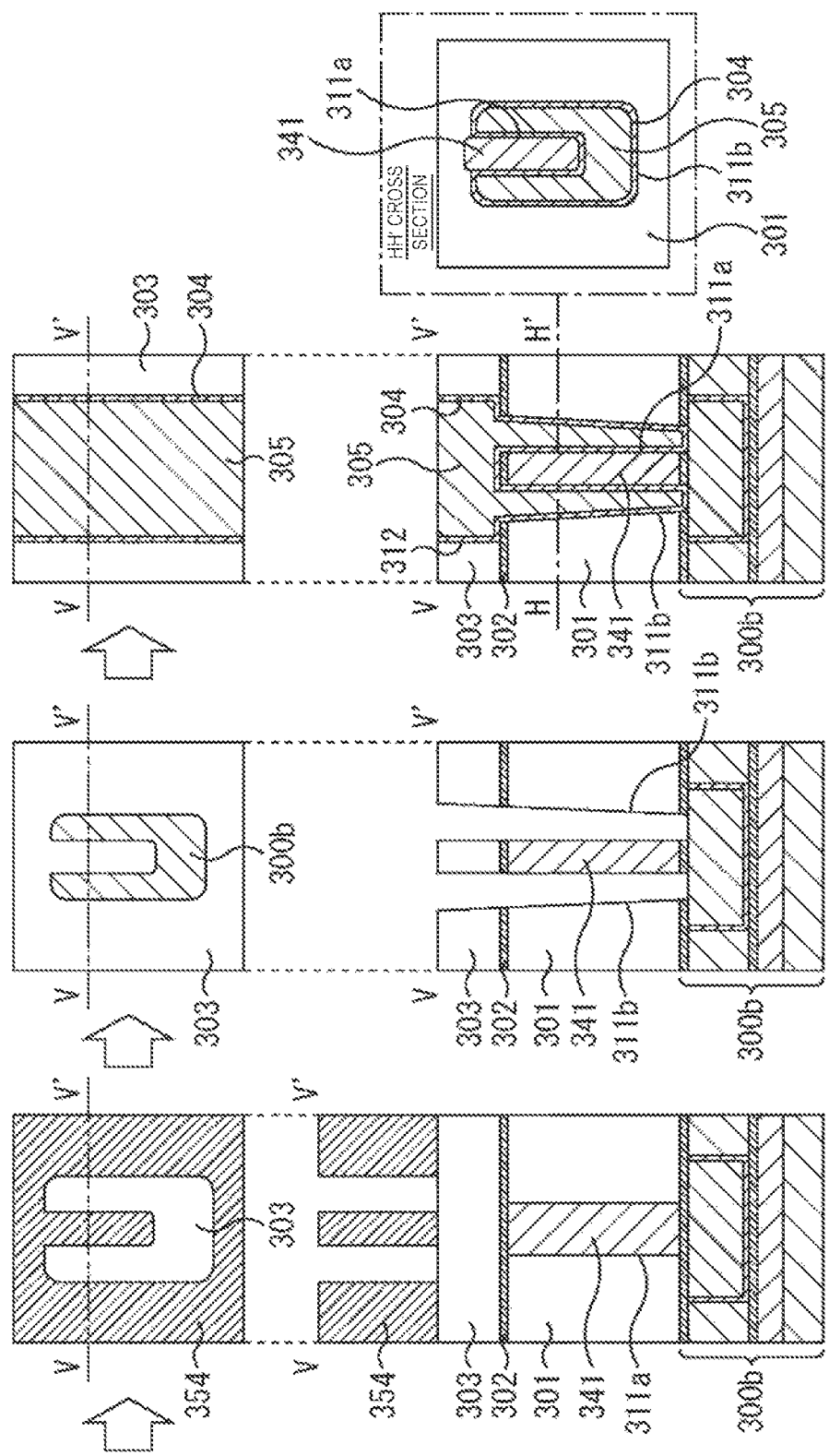

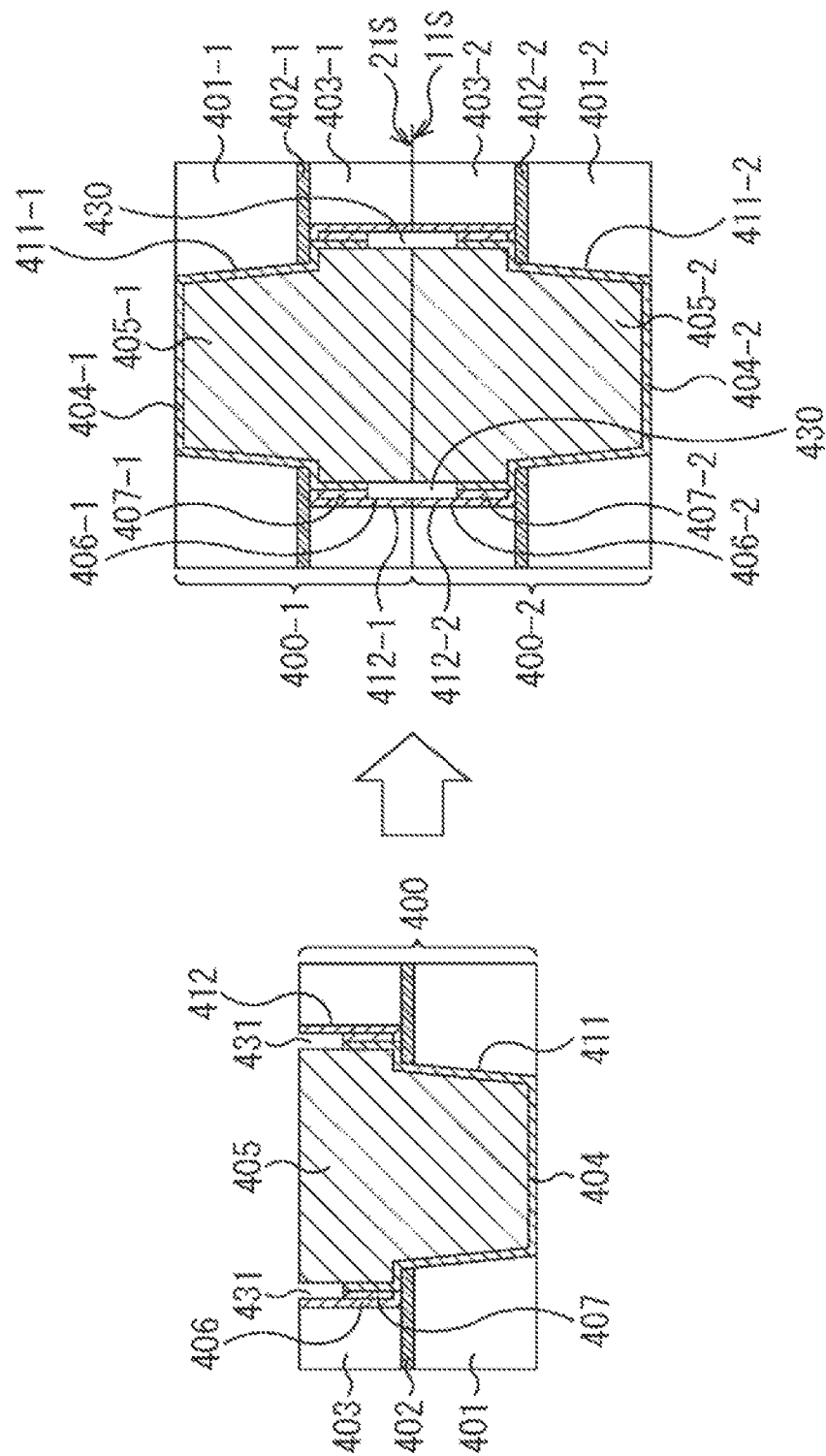

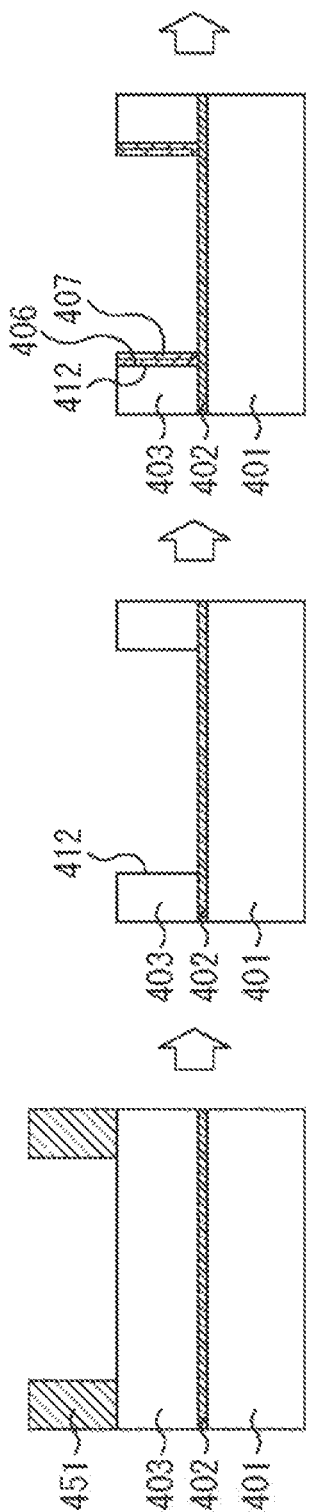

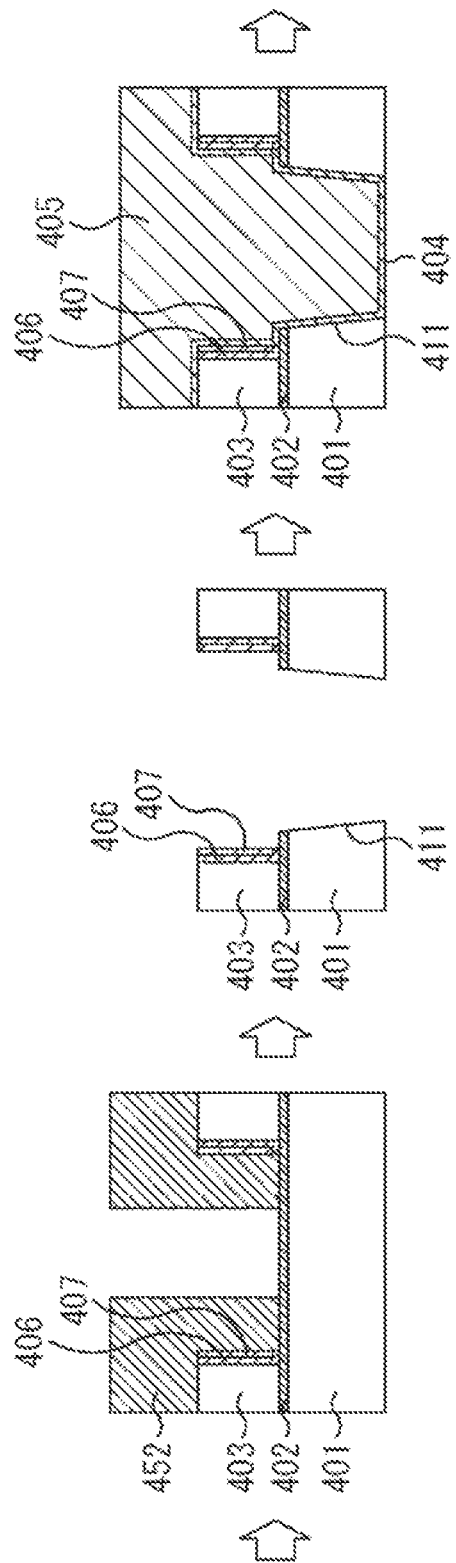

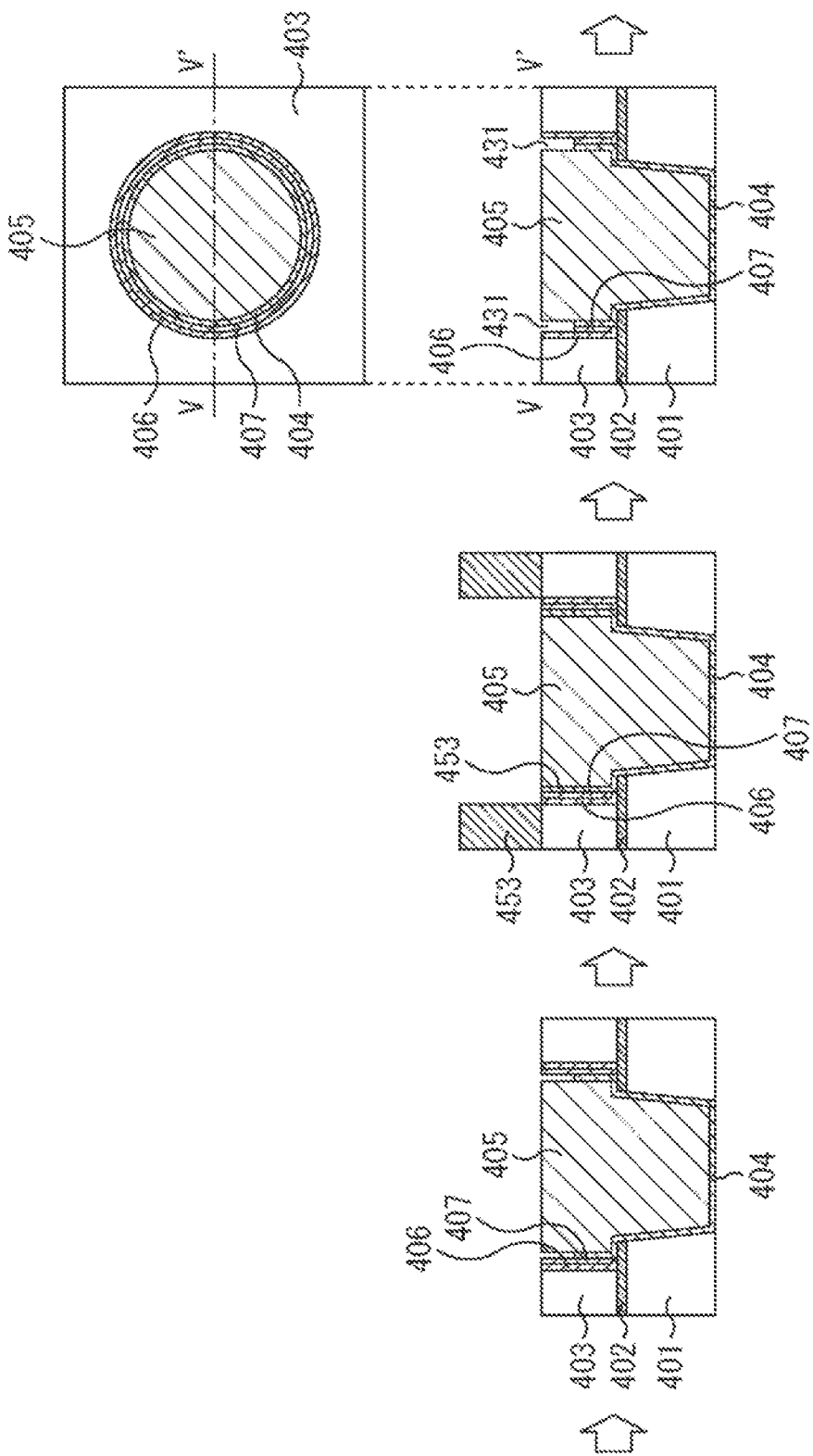

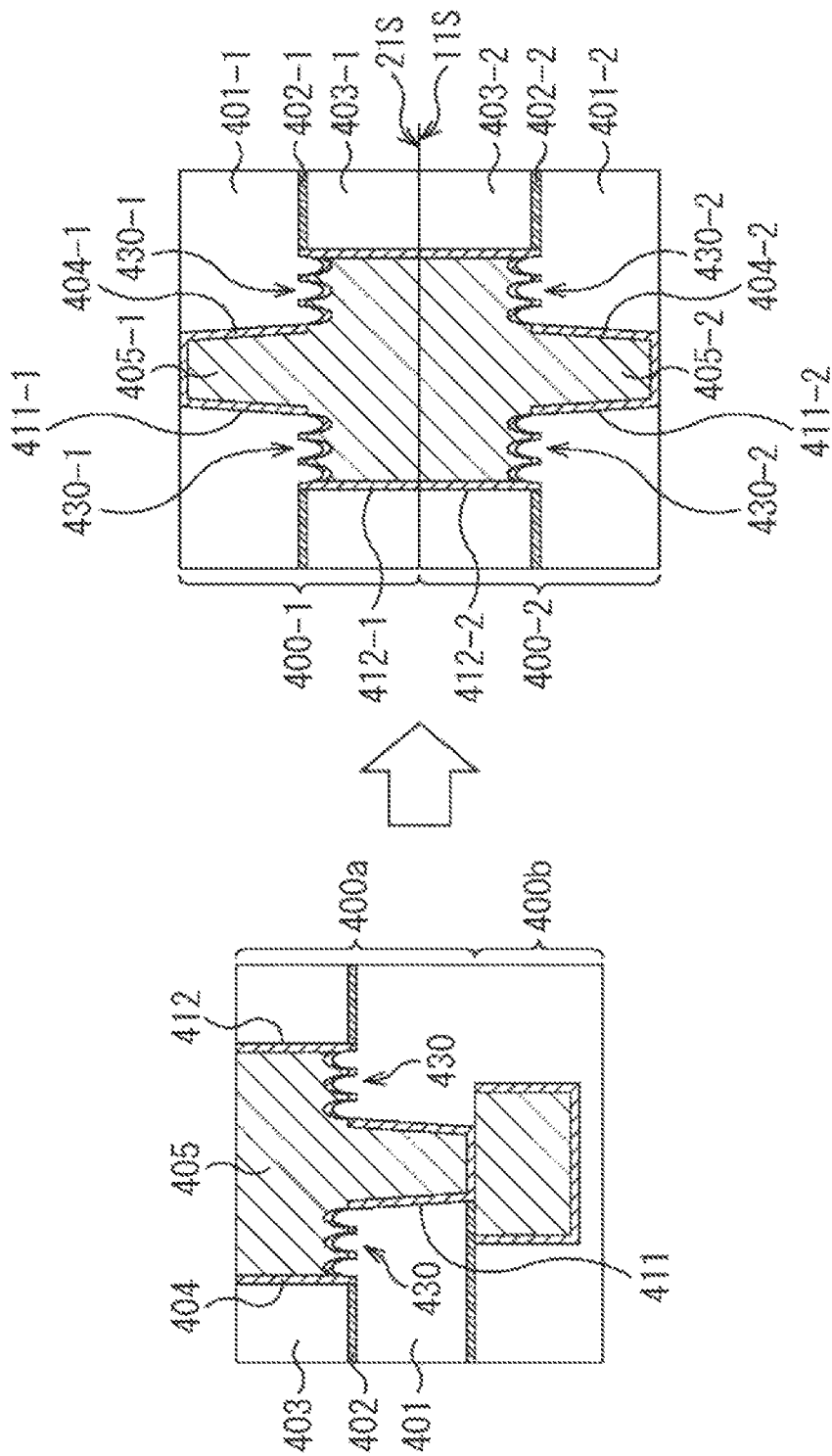

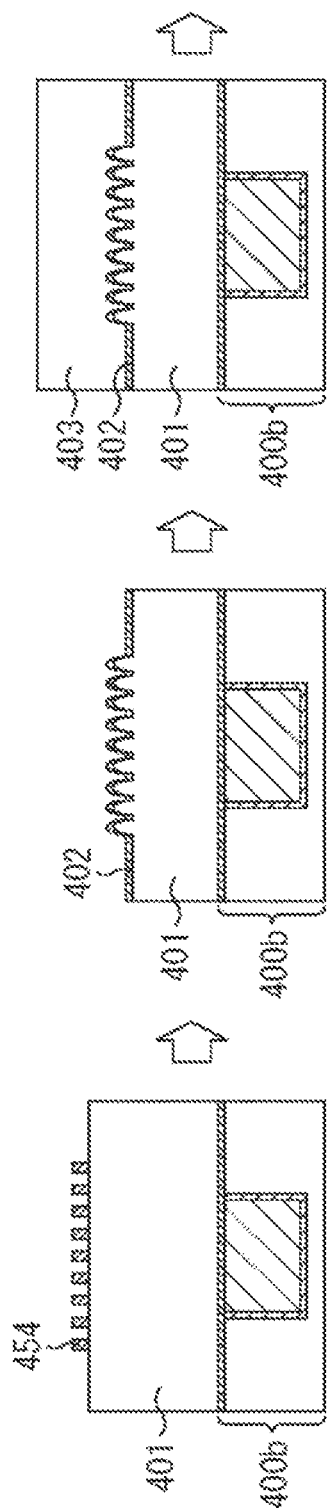

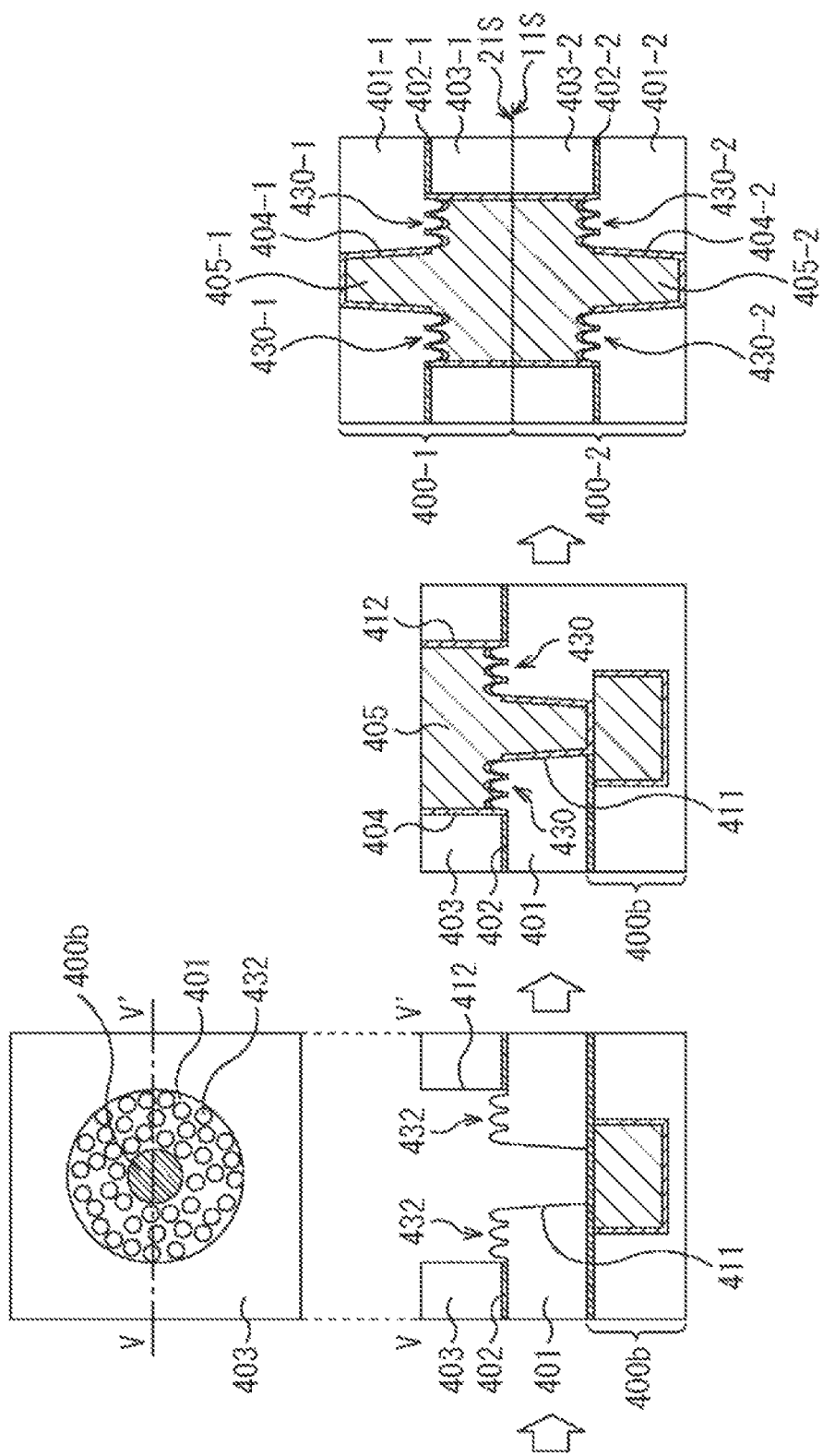

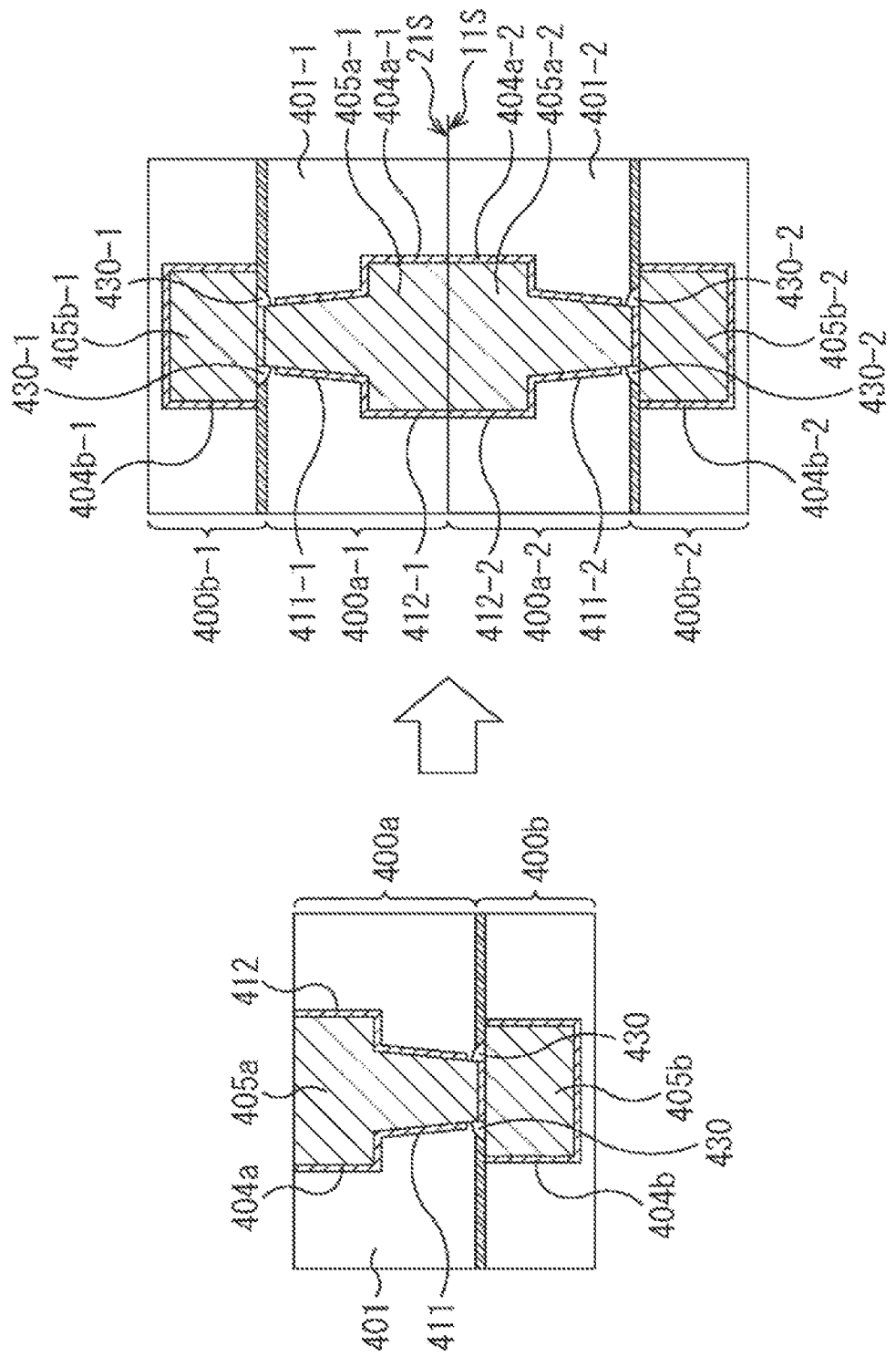

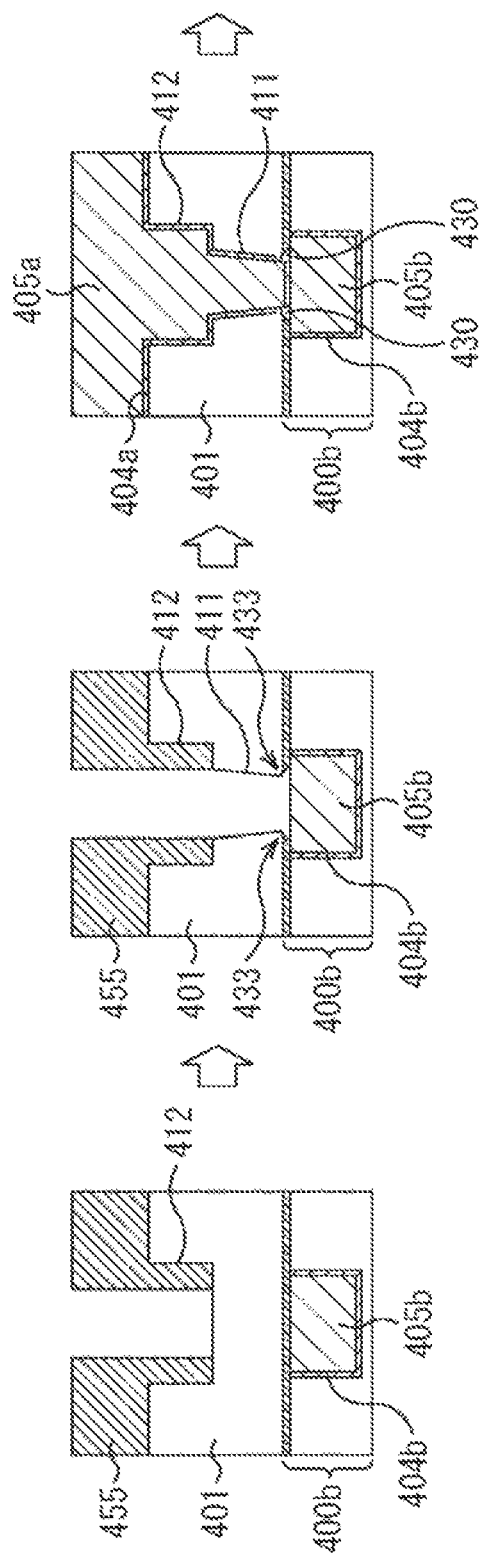

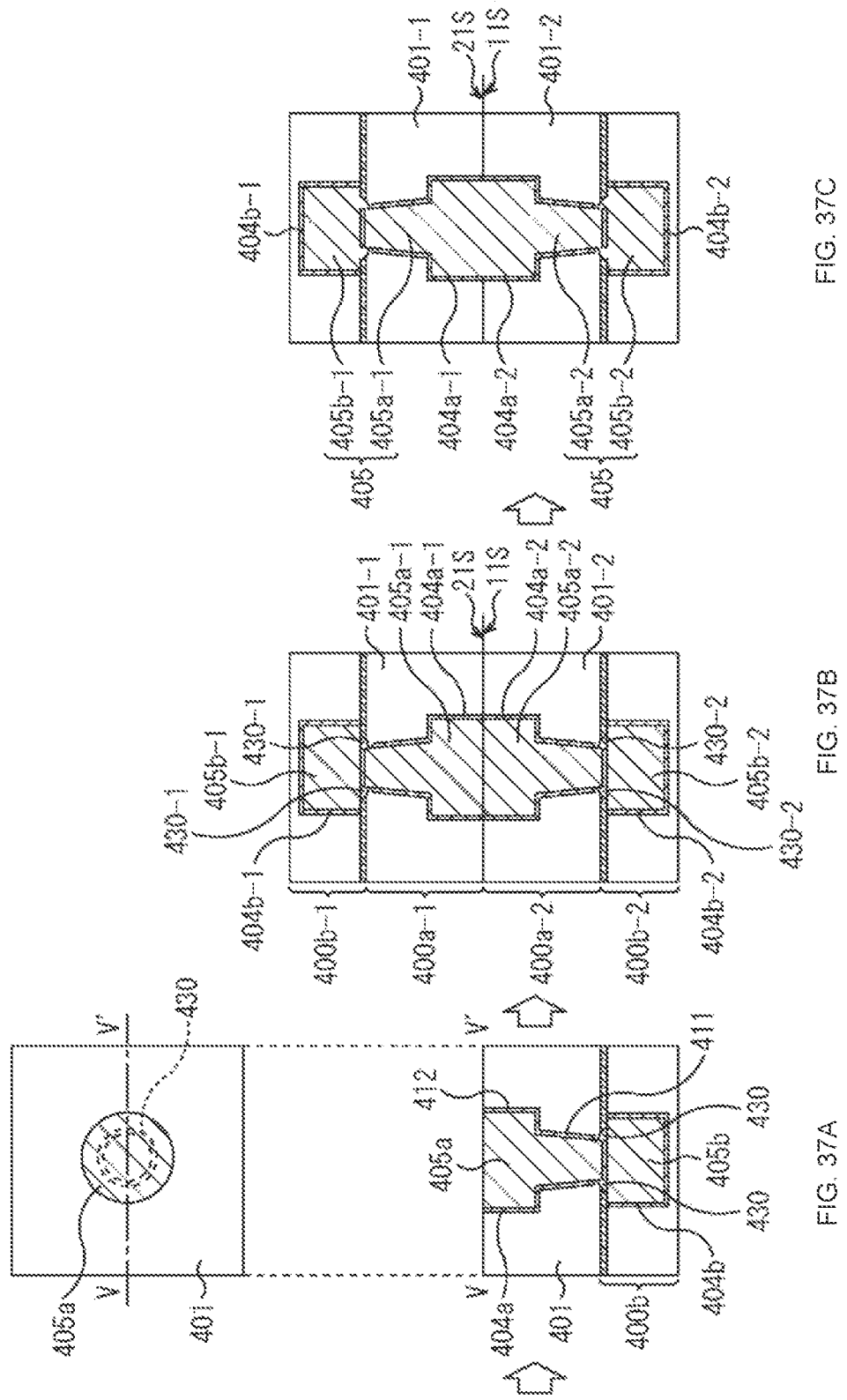

SEMICONDUCTOR DEVICE, MANUFACTURING METHOD, AND SOLID-STATE IMAGING DEVICE

CROSS REFERENCE TO RELATED APPLICATIONS

This application is a U.S. National Phase of International Patent Application No. PCT/JP2017/036649 filed on Oct. 10, 2017, which claims priority benefit of Japanese Patent Application No. 0016-207539 filed in the Japan Patent Office on Oct. 24, 2016. Each of the above-referenced applications is hereby incorporated herein by reference in its entirety.

TECHNICAL FIELD

The present technology relates to a semiconductor device, a manufacturing method, and a solid-state imaging device, and more particularly, to a semiconductor device, a manufacturing method, and a solid-state imaging device which are capable of suppressing a decrease in bonding strength and preventing a poor electrical connection or peeling when two substrates are bonded to each other.

BACKGROUND ART

In the past, high integration of semiconductor devices of a two-dimensional structure has been realized by introduction of micro processes and improvement of packaging density, but there is a physical limit to such high integration of a two-dimensional structure. In this regard, in order to further miniaturize semiconductor devices and to increase the pixel density, a semiconductor device of a three-dimensional structure has been developed.

Further, a Cu layer forming method for embedding copper (Cu) in a concave portion formed on a surface without a gap is disclosed in Patent Literature 1.

CITATION LIST

Patent Literature

Patent Literature 1: JP 2014-86537A

DISCLOSURE OF INVENTION

Technical Problem

Incidentally, in a semiconductor device of a three-dimensional structure, if a pumping phenomenon (Cu pumping) occurs due to thermal treatment after bonding when two substrates are bonded to each other, a bonding strength decreases due to stress of expanded copper (Cu), bonding becomes insufficient, and poor electrical connection or peeling is likely to occur.

The present technology was made in light of the foregoing, and it is desirable to be able to suppress a decrease in a bonding strength and prevent poor electrical connection or peeling when two substrates are bonded to each other.

Solution to Problem

A semiconductor device of a first aspect of the present technology is a semiconductor device, including: a first substrate including a first electrode including a metal; and a second substrate bonded to the first substrate and including a second electrode including a metal. An acute-angled concavo-convex portion is formed on a side surface of a groove in which the first electrode is formed and a side surface of a groove in which the second electrode metal-bonded to the first electrode is formed.

A solid-state imaging device according to the first aspect of the present technology is a solid-state imaging device corresponding to the semiconductor device of the first aspect of the present technology.

A manufacturing method of the first aspect of the present technology is a semiconductor device manufacturing method, including: forming side roughness in a part of a side surface of a groove in which an electrode including a metal is formed; forming a metal seed corresponding to a shape of the groove, part of which has the side roughness, in the groove; forming the metal in the groove in which the metal seed is formed, by metal plating growth; and bonding a first substrate including the electrode and a second substrate including the electrode to each other. When thermal treatment is performed on the first substrate and the second substrate, the expanded metal enters a space which is formed by insufficient metal plating by the metal seed corresponding to the side roughness in the metal plating growth.

A manufacturing method of the first aspect of the present technology is a semiconductor device manufacturing method, including: forming an acute-angled concavo-convex shape in a part of a side surface of a groove in which an electrode including a metal is formed; forming a metal seed corresponding to a shape of the groove in the groove; forming the metal in the groove in which the metal seed is formed, by metal plating growth; and bonding a first substrate including the electrode and a second substrate including the electrode to each other. When thermal treatment is performed on the first substrate and the second substrate, the expanded metal enters a space which is formed by insufficient metal plating by the metal seed corresponding to the concavo-convex shape in the metal plating growth.

A semiconductor device of a second aspect of the present technology is a semiconductor device, including: a first substrate including a first electrode including a metal; and a second substrate bonded to the first substrate and including a second electrode including a metal. A dent is formed in a part of a surface of a metal of a bonding surface of at least one of the first substrate or the second substrate.

A solid-state imaging device according to the second aspect of the present technology is a solid-state imaging device corresponding to the semiconductor device of the second aspect of the present technology.

A manufacturing method of the second aspect of the present technology is a semiconductor device manufacturing method, including: planarizing, by CMP, an upper surface of a stacked film in which an electrode including a metal and a dense pattern which is a metal pattern dense in an outer circumferential portion of the electrode are formed; and bonding a first substrate including the electrode and a second substrate including the electrode to each other. When thermal treatment is performed on the first substrate and the second substrate, the expanded metal enters a space formed by a dent formed by occurrence of erosion during the planarization by the CMP.

A semiconductor device of a third aspect of the present technology is a semiconductor device, including: a first substrate including a first electrode including a metal; and a second substrate bonded to the first substrate and including a second electrode including a metal. A shape of the electrode is deformed so that surface areas of the first electrode and the second electrode are enlarged.

A solid-state imaging device according to the third aspect of the present technology is a solid-state imaging device corresponding to the semiconductor device of the third aspect of the present technology.

A manufacturing method of the third aspect of the present technology is a semiconductor device manufacturing method, including: deforming a shape of an electrode including a metal so that a surface area of the electrode is enlarged when the electrode is formed in a stacked film; and bonding a first substrate including the electrode and a second substrate including the electrode to each other. When thermal treatment is performed on the first substrate and the second substrate, stress applied to an electrode peripheral portion and an electrode bonding portion is relieved by the surface area of the electrode being enlarged.

A semiconductor device of a fourth aspect of the present technology is a semiconductor device, including: a first substrate including a first electrode including a metal; and a second substrate bonded to the first substrate and including a second electrode including a metal. A part of a side surface or a bottom surface of a groove in which the first electrode is formed and a part of a side surface or a bottom surface of a groove in which the second electrode is formed form a shape for forming a space in which the metal is not present during bonding.

A solid-state imaging device according to the fourth aspect of the present technology is a solid-state imaging device corresponding to the semiconductor device of the fourth aspect of the present technology.

A manufacturing method of the fourth aspect of the present technology is a semiconductor device manufacturing method, including: forming, when a metal for forming an electrode is embedded in a groove formed in a stacked film, a space in which the metal is not present in a part of a side surface or a bottom surface of the groove; and bonding a first substrate including the electrode and a second substrate including the electrode to each other. When thermal treatment is performed on the first substrate and the second substrate, the expanded metal enters the space.

Advantageous Effects of Invention

According to the first to fourth aspects of the present technology, it is possible to suppress a decrease in a bonding strength and prevent poor electrical connection or peeling when two substrates are bonded to each other.

Note that the effects described herein are not necessarily limitative and may refer to any one of the effects described in this specification.

BRIEF DESCRIPTION OF DRAWINGS

FIGS. 2A, 2B, and 2C are cross-sectional views illustrating a state of a bonding portion when a pumping phenomenon occurs when two substrates are bonded to each other.

FIGS. 3A and 3B are main part cross-sectional views illustrating a structure of a solid-state imaging device of a first embodiment.

FIGS. 4A, 4B, and 4C are views illustrating a flow of a first manufacturing process of the solid-state imaging device of the first embodiment.

FIG. 5 is a view illustrating a flow of the first manufacturing process of the solid-state imaging device of the first embodiment.

FIGS. 6A, 6B, and 6C are views illustrating a flow of a second manufacturing process of the solid-state imaging device of the first embodiment.

FIGS. 9A and 9B are main part cross-sectional views illustrating a structure of a solid-state imaging device of a second embodiment.

FIGS. 10A, 10B, and 10C are views illustrating a flow of a manufacturing process of a solid-state imaging device of the second embodiment.

FIGS. 14A and 14B are views illustrating a structure of a solid-state imaging device of the third embodiment at the time of bonding and at the time of thermal treatment.

FIGS. 15A and 15B are views illustrating a structure of a solid-state imaging device of a related art at the time of bonding and at the time of thermal treatment.

FIGS. 25A, 25B, and 25C are views illustrating a flow of a fourth manufacturing process of the solid-state imaging device of the third embodiment.

FIGS. 26A, 26B, and 26C are views illustrating a flow of the fourth manufacturing process of the solid-state imaging device of the third embodiment.

FIGS. 27A and 27B are main part cross-sectional views illustrating a first structure of a solid-state imaging device of a fourth embodiment.

FIGS. 28A, 28B, and 28C are views illustrating a flow of a first manufacturing process of the solid-state imaging device of the fourth embodiment.

FIGS. 29A, 29B, and 29C are views illustrating a flow of the first manufacturing process of the solid-state imaging device of the fourth embodiment.

FIGS. 30A, 30B, and 30C are views illustrating a flow of the first manufacturing process of the solid-state imaging device of the fourth embodiment.

FIGS. 32A and 32B are main part cross-sectional views illustrating a second structure of a solid-state imaging device of the fourth embodiment.

FIGS. 33A, 33B, and 33C are views illustrating a flow of a second manufacturing process of the solid-state imaging device of the fourth embodiment.

FIGS. 34A, 34B, and 34C are views illustrating a flow of the second manufacturing process of the solid-state imaging device of the fourth embodiment.

FIGS. 35A and 35B are main part cross-sectional views illustrating a third structure of a solid-state imaging device of the fourth embodiment.

FIGS. 36A, 36B, and 36C are views illustrating a flow of a third manufacturing process of the solid-state imaging device of the fourth embodiment.

FIGS. 37A, 37B, and 37C are views illustrating a flow of the third manufacturing process of the solid-state imaging device of the fourth embodiment.

MODE(S) FOR CARRYING OUT THE INVENTION

Figure 1:
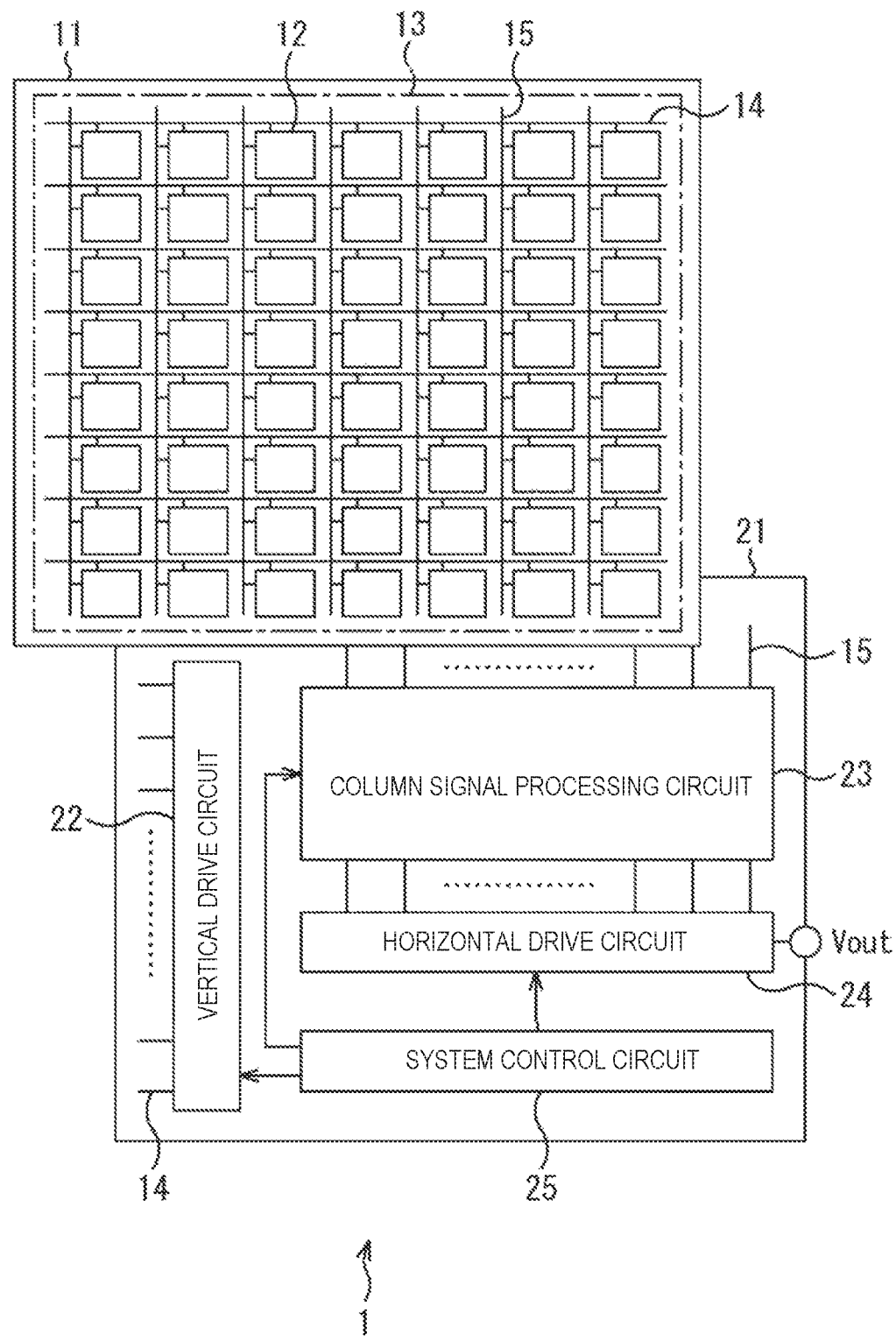
FIG. 1 is a view illustrating a configuration of an embodiment of a solid-state imaging device to which the present technology is applied.

Hereinafter, exemplary embodiments of the present technology will be described with reference to the appended drawings. Further, the description will proceed in the following order.
1. Schematic configuration example of solid-state imaging device
2. First embodiment: structure in which void is formed by insufficient metal plating
3. Second embodiment: structure in which space is formed by concavo-convex portion of part of metal surface
4. Third embodiment: structure in which surface area of electrode is enlarged
5. Fourth embodiment: structure in which space is formed on side surface of metal or bottom of wiring pattern
6. Configuration example of electronic device
7. Application examples

1. Schematic Configuration Example of Solid-State Imaging Device (Configuration Example of Solid-State Imaging Device)

FIG. 1 is a view illustrating an embodiment of a solid-state imaging device to which the present technology is applied.

In FIG. 1, a solid-state imaging device 1 is a semiconductor device of a three-dimensional structure including a first substrate 11 serving as a sensor substrate and a second substrate 21 serving as a circuit substrate bonded to the first substrate 11 in a stacked state. The solid-state imaging device 1 is configured as an image sensor such as, for example, a complementary metal oxide semiconductor (CMOS) image sensor.

In the solid-state imaging device 1, the first substrate 11 includes a pixel region 13 in which a plurality of pixels 12 each including a photoelectric conversion unit are regularly arranged two-dimensionally. In the pixel region 13, a plurality of pixel drive lines 14 are wired in a row direction, a plurality of vertical signal lines 15 are wired in a column direction, and one pixel 12 is arranged to be connected to one pixel drive line 14 and one vertical signal line 15.

Further, each pixel 12 includes a pixel circuit configured with a photoelectric conversion unit, a floating diffusion (FD), a plurality of transistors, and the like. Further, there are cases in which a plurality of pixels 12 share a part of the pixel circuit.

On the other hand, the second substrate 21 includes peripheral circuits such as a vertical drive circuit 22, a column signal processing circuit 23, a horizontal drive circuit 24, and a system control circuit 25.

The solid-state imaging device 1 has the above configuration.

Incidentally, the solid-state imaging device 1 is configured by bonding the first substrate 11 and the second substrate 21, but it is known that a so-called pumping phenomenon (Cu pumping) occurs in thermal treatment after the substrates are bonded, and copper (Cu) used for electrodes expands (bulge). Due to a local copper (Cu) bulging phenomenon (plastic deformation caused by thermal stress) caused by the thermal treatment, a wafer bonding strength decreases, bonding becomes insufficient, and poor electrical connection or peeling is likely to occur.

(Bonding Portion when Pumping Phenomenon Occurs)

FIGS. 2A, 2B, and 2C illustrate a state of a bonding portion of an electrode when a pumping phenomenon occurs when two substrates are bonded to each other.

As illustrated in FIG. 2A, a stacked film 900-1 in which an inter-layer insulating film 901-1, a liner insulating film 902-1, and an inter-layer insulating film 903-1 are stacked is formed on the upper substrate out of the two substrates to be bonded. In the stacked film 900-1, a metallic film 905-1 made of copper (Cu) is formed as an electrode. Further, a metal seed 904-1 is formed between the stacked film 900-1 and the metallic film 905-1.

On the other hand, on the lower substrate, similarly to the upper substrate, copper (Cu) serving as a metallic film 905-2 is formed in a stacked film 900-2 in which an inter-layer insulating film 901-2 to an inter-layer insulating film 903-2 are stacked.

FIG. 2B illustrates a structure of a bonding portion of the two substrates after bonding. Further, if thermal treatment is performed when the bonding portion is in the state illustrated in FIG. 2B, the state of the bonding portion becomes the state illustrated in FIG. 2C. In other words, a pumping phenomenon occurs due to the thermal treatment, and copper (Cu) serving as the metallic films 905-1 and 905-2 formed in the stacked films 900-1 and 900-2 of the upper and lower substrates expands (910-1 and 910-2 in FIG. 2C).

If such a pumping phenomenon occurs, a wafer bonding strength decreases, bonding becomes insufficient, and poor electrical connection or peeling is likely to occur as described above. In this regard, the present technology proposes four solutions capable of suppressing a decrease in a bonding strength and preventing poor electrical connection or peeling when two substrates are bonded to each other.

Hereinafter, the four solutions will be described on the basis of four embodiments, that is, first to fourth embodiments.

2. First Embodiment

First, a first embodiment will be described with reference to FIGS. 3A, 3B, 4A, 4B, 4C, 5, 6A, 6B, 6C, 7, 8A, and 8B. In the first embodiment, as a structure of a solid-state imaging device 1, a void is formed by plating copper (Cu) insufficiently in the bonding portion between the first substrate 11 and the second substrate 21.

Accordingly, a space in which there is no copper (Cu) is formed at the time of bonding, and expanded copper (Cu) enters the space during thermal treatment, so that stress is relieved. Accordingly, in the first embodiment, it is possible to suppress a decrease in a bonding strength and prevent poor electrical connection or peeling.

(Structure of Bonding Portion)

FIGS. 3A and 3B are main part cross-sectional views illustrating a structure of the solid-state imaging device 1 of the first embodiment. Hereinafter, a detailed configuration of the solid-state imaging device 1 of the first embodiment will be described with reference to the main part cross-sectional view. Further, FIG. 3A is a cross-sectional view before bonding, and FIG. 3B is a cross-sectional view after bonding.

As illustrated in FIG. 3A, a stacked film 100 in which an inter-layer insulating film 101, a liner insulating film 102, and an inter-layer insulating film 103 are stacked is formed in each of a first substrate 11 and a second substrate 21. As the inter-layer insulating film 101 and the inter-layer insulating film 103, for example, a PSiO film can be used. Further, as the liner insulating film 102, for example, a SiC film can be used.

In the stacked film 100, a via 111 is formed, and a metallic film 105 of copper (Cu) or the like is embedded in the via 111. Further, here, a case in which copper (Cu) is used as the metallic film 105 will be described as an example.

Here, in the stacked film 100, a metal seed 104 is formed between the via 111 and copper (Cu) serving as the metallic film 105. Here, in the stacked film 100, a concavo-convex portion is formed by side roughness in a side surface of the via 111 (a side surface of a wiring trench) on the inter-layer insulating film 103 side, that is, the bonding side, and the metal seed 104 serving as the Cu seed is formed in the concavo-convex portion.

Further, since the metal seed 104 corresponding to the side roughness (concavo-convex portion) is formed, the growth of copper (Cu) is insufficient at the time of copper plating growth of copper (Cu) serving as the metallic film 105, and a void 131 corresponding to the acute-angled concavo-convex portion of the side surface of via 111 is formed.

As described above, when the first substrate 11 and the second substrate 21 in which the void 131 is formed are bonded to each other, and a first bonding surface 11S and a second bonding surface 21S are bonded to each other, the structure illustrated in FIG. 3B is obtained. Further, in the first embodiment, for the sake of convenience of description, corresponding components are distinguished by adding "-1" to components of the first substrate 11 as reference numerals and adding "-2" to components of the second substrate 21 as reference numerals.

In other words, as illustrated in FIG. 3B, at the time of bonding, on the first bonding surface 11S side of the first substrate 11, the void 131-1 corresponding to the acute-angled concavo-convex portion of the side surface of the via 111-1 is formed in copper (Cu) serving as the metallic film 105-1 embedded in the via 111-1. On the other hand, on the second bonding surface 21S side of the second substrate 21, the void 131-2 corresponding to the acute-angled concavo-convex portion of the side surface of the via 111-2 is formed in the copper (Cu) serving as the metallic film 105-2 embedded in the via 111-2.

As the voids 131-1 and 131-2 are formed, a space 130 in which there is no copper (Cu) serving as the metallic films 105-1 and 105-2 at the time of bonding is formed, and expanded copper (Cu) enters the space 130 formed by the voids 131-1 and 131-2, so that stress is relieved. Accordingly, it is possible to suppress a decrease in bonding strength and prevent poor electrical connection or peeling.

(First Manufacturing Process)

Next, a flow of a first manufacturing process of the solid-state imaging device of the first embodiment will be described with reference to schematic views of FIGS. 4A, 4B, 4C, and 5.

Further, although not illustrated, in the first manufacturing process, the inter-layer insulating film 101, the liner insulating film 102, and the inter-layer insulating film 103 are stacked, so that the stacked film 100 is formed at a stage prior to the process illustrated in FIGS. 4A, 4B, 4C, and 5. Further, a lithography process and an etching process are performed, and the via 111 is formed in the stacked film 100.

Thereafter, in the first manufacturing process, first, a side roughness forming process is performed. In the side roughness forming process, as illustrated in FIG. 4A, side roughness 121 is formed on the side surface of the via 111 formed in the stacked film 100.

At this time, the side roughness 121 is formed only on the inter-layer insulating film 103 side in the stacked film 100, that is, the side surface of the via 111 on the bonding side (the side surface of a wiring trench). Due to the side roughness 121, the concavo-convex portion is formed on the side surface of the via 111 on the bonding side.

Then, a metal seed forming process is performed. In the metal seed forming process, as illustrated in FIG. 4B, the metal seed 104 is formed (deposited) in the via 111 formed in the stacked film 100. The metal seed 104 is a barrier metal, and in a case in which the metallic film 105 is copper (Cu), the metal seed 104 is a Cu seed.

At this time, the side roughness 121 is formed only on the side surface of the via 111 on the bonding side. Therefore, the metal seed 104 is formed flat on the side surface of the via 111 on the inter-layer insulating film 101 side and on the liner insulating film 102 side in the stacked film 100. On the other hand, since the side roughness 121 is formed on the inter-layer insulating film 103 side, that is, the side surface of the via 111 on the bonding side, the metal seed 104 is formed along (the concavo-convex portion of) the side roughness 121.

Then, a metallic film forming process is performed. In the metallic film forming process, as illustrated in FIG. 4C, copper (Cu) serving as the metallic film 105 is embedded in the via 111 formed in the stacked film 100. Here, copper (Cu) serving as the metallic film 105 is formed by a plating technique after it is sputtered. In other words, in the metallic film forming process, the Cu plating growth is performed.

At this time, since the metal seed 104 is formed along (the concavo-convex portion of) the side roughness 121 (the concavo-convex portion) on the side of the inter-layer insulating film 103, that is, the side surface of the via 111 on the bonding side, copper (Cu) grows insufficiently at the time of copper plating growth of copper (Cu) as the metallic film 105, and a void 131 corresponding to the acute-angled concavo-convex portion of the side surface of the via 111 is formed.

Next, a bonding process is performed. In the bonding process, as illustrated in FIG. 5, the first bonding surface 11S of the first substrate 11 and the second bonding surface 21S of the second substrate 21 are bonded. Accordingly, the metallic film 105-1 and the metallic film 105-2 are bonded (Cu—Cu bonded).

Here, on the first bonding surface 11S side, the void 131-1 corresponding to the acute-angled concavo-convex portion of the side surface of the via 111-1 is formed in the copper (Cu) serving as the metallic film 105-1 embedded in the via 111-1. On the other hand, on the second bonding surface 21S side, the void 131-2 corresponding to the acute-angled concavo-convex portion of the side surface of the via 111-2 is formed in the copper (Cu) serving as the metallic film 105-2 embedded in the via 111-2.

As described above, since the void 131-1 is formed on the first bonding surface 11S side, and a void 131-2 is formed on the second bonding surface 21S side, the space 130 in which there is no copper (Cu) serving as the metallic films 105-1 and 105-2 is formed due to the voids 131-1 and 131-2 at the time of bonding as illustrated in FIG. 5.

Thereafter, although not illustrated, a thermal treatment process is performed. In the thermal treatment process, thermal treatment is performed on the first substrate 11 and the second substrate 21 bonded in the bonding process. As a condition of the thermal treatment, for example, it can be performed at several hundred ° C. for several hours.

Here, in a case in which thermal treatment is applied to the copper (Cu) serving as the metallic films 105-1 and 105-2 embedded in the vias 111-1 and 111-2, the copper (Cu) expands as described above. Further, as illustrated in FIG. 5, in the structure at the time of bonding, the space 130 in which there is no copper (Cu) is formed due to the void 131-1 formed on the first bonding surface 11S side and the void 131-2 formed on the second bonding surface 21S side.

Therefore, at the time of thermal treatment, the expanded copper (Cu) enters the space 130, so that stress is relieved. Accordingly, it is possible to suppress a decrease in bonding strength and prevent poor electrical connection or peeling.

The first manufacturing process is performed as described above.

In the above description, the void 131 is formed by forming the side roughness 121 on the side surface of the via 111 and forming the metal seed 104, but the process for forming the void 131 is not limited thereto. A second manufacturing method will be described below as another process for forming the void 131.

(Second Manufacturing Process)

Here, a flow of a second manufacturing process of the solid-state imaging device of the first embodiment will be described with reference to schematic views of FIGS. 6A, 6B, 6C, and 7.

Further, although not illustrated, in the second manufacturing process, the inter-layer insulating film 101, the liner insulating film 102, and the inter-layer insulating film 103 are stacked at a stage prior to the process illustrated in FIGS. 6A, 6B, 6C, and 7, so that the stacked film 100 is formed. Further, a lithography process and an etching process are performed, and the via 111 is formed in the stacked film 100.

Thereafter, in the second manufacturing process, first, an electrode processing process is performed. In the electrode processing process, as illustrated in FIG. 6A, the stacked film 100 in which the via 111 is formed is coated with a photoresist 151, and a resist pattern is transferred onto the inter-layer insulating film 103 using the resist pattern as a mask.

By performing the electrode processing process, the acute-angled concavo-convex portion is formed on the side surface of the via 111 as illustrated in a top view of FIG. 6A. Here, at this time, the acute-angled concavo-convex portion is formed only on the inter-layer insulating film 103 side, that is, on the side surface of the via 111 on the bonding side (the side surface of the wiring trench) in the stacked film 100.

Next, the metal seed forming process is performed. In the metal seed forming process, as illustrated in FIG. 6B, the metal seed 104 serving as the Cu seed is formed (deposited) in the via 111 formed in the stacked film 100.

At this time, the acute-angled concavo-convex portion is formed only on the side surface of the via 111 on the bonding side. Therefore, the metal seed 104 is formed flat on the side surface of the via 111 on the inter-layer insulating film 101 side and the liner insulating film 102 side in the stacked film 100.

On the other hand, since the acute-angled concavo-convex portion is formed on the inter-layer insulating film 103 side, that is, the side surface of via 111 on the bonding side, the metal seed 104 is formed along the concavo-convex portion. A top view of FIG. 6B illustrates that the metal seed 104 is formed along the concavo-convex portion of the side surface of the via 111.

Next, a metallic film forming process is performed. In the metallic film forming process, as illustrated in FIG. 6C, the copper (Cu) serving as the metallic film 105 is embedded in the via 111 formed in the stacked film 100. Here, since the copper (Cu) serving as the metallic film 105 is formed by a plating technique after it is sputtered, the Cu plating growth is performed.

At this time, since the metal seed 104 corresponding to the acute-angled concavo-convex portion is formed on the inter-layer insulating film 103 side, that is, the side surface of the via 111 on the bonding side, the growth of the copper (Cu) serving as the metallic film 105 is insufficient in that part at the time of the copper plating growth of the copper (Cu), and a void 132 corresponding to the acute-angled concavo-convex portion of the side surface of the via 111 is formed. More specifically, as illustrated in a top view of FIG. 6C, the void 132 is formed for each dent of the side surface of the via 111.

Figure 7:
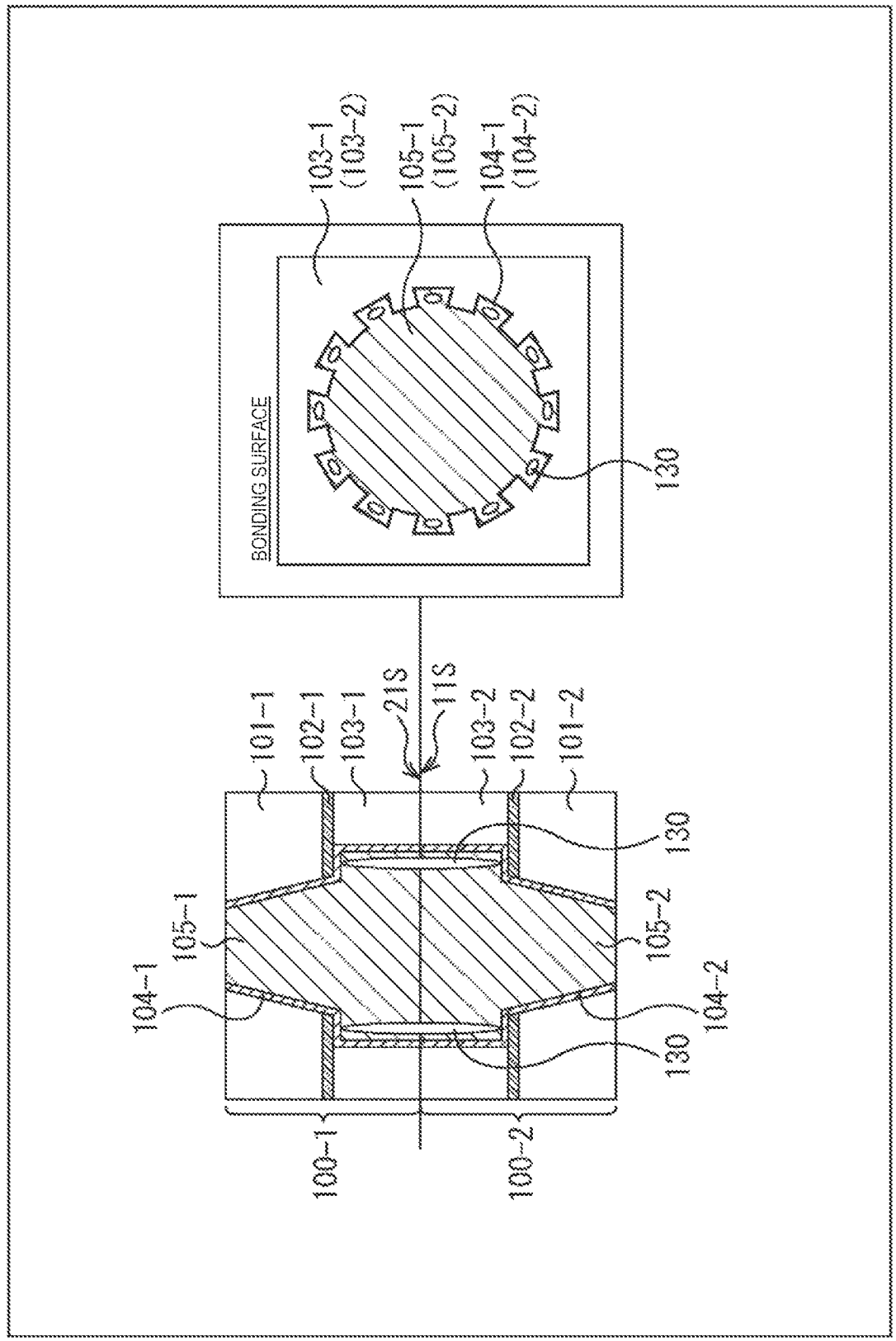
FIG. 7 is a view illustrating a flow of the second manufacturing process of the solid-state imaging device of the first embodiment.

Next, a bonding process is performed. In the bonding process, as illustrated in FIG. 7, the first bonding surface 11S of the first substrate 11 and the second bonding surface 21S of the second substrate 21 are bonded to each other. Accordingly, the metallic film 105-1 and the metallic film 105-2 are bonded (Cu—Cu bonding).

Here, on the first bonding surface 11S side, the void 132-1 corresponding to the acute-angled concavo-convex portion of the side surface of the via 111-1 is formed in the copper (Cu) serving as the metallic film 105-1 embedded in the via 111-1. On the other hand, on the second bonding surface 21S side, the void 132-2 corresponding to the acute-angled concavo-convex portion of the side surface of the via 111-2 is formed in the copper (Cu) serving as the metallic film 105-2 embedded in the via 111-2.

As described above, since the void 132-1 is formed on the first bonding surface 11S side, and the void 132-2 is formed on the second bonding surface 21S side, the space 130 in which there is no copper (Cu) serving as the metallic films 105-1 and 105-2 is formed due to the voids 132-1 and 132-2 as illustrated in FIG. 7.

Thereafter, although not illustrated, a thermal treatment process is performed. In the thermal treatment process, the thermal treatment is performed on the first substrate 11 and the second substrate 21 bonded in the bonding process. As a condition of the thermal treatment, for example, it can be performed at several hundred ° C. for several hours.

Further, as illustrated in FIG. 7, in the structure at the time of bonding, the space 130 in which there is no copper (Cu) is formed due to the void 132-1 formed on the first bonding surface 11S side and the void 132-2 formed on the second bonding surface 21S side.

Therefore, at the time of thermal treatment, the copper (Cu) serving as the metallic films 105-1 and 105-2 embedded in the vias 111-1 and 111-2 expands and enters the space 130, so that stress is relieved. Accordingly, it is possible to suppress a decrease in bonding strength and prevent poor electrical connection or peeling.

The second manufacturing process is performed as described above.

Figure 8B:
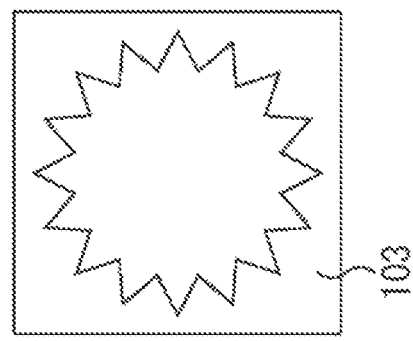
FIGS. 8A and 8B are views illustrating an example of an upper shape of a bonding surface of a substrate.
Figure 8A:
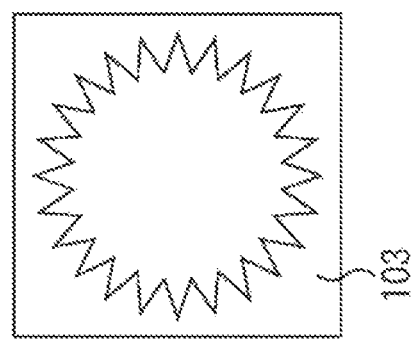

Further, in the second manufacturing process, the acute-angled concavo-convex portion formed on the side surface of the via 111 on the bonding side in the electrode processing process (FIG. 6A) is not limited to an upper shape illustrated in the top view of FIG. 6A and may have an upper shape illustrated in FIG. 8A or FIG. 8B. In other words, when the Cu seed serving as the metal seed 104 is formed (deposited), it is formed (deposited) under a condition with a poor coverage (a condition in which bias is reduced), and thus at the time of the Cu plating growth of the copper (Cu) serving as the metallic film 105, the growth of the copper (Cu) is insufficient, and it is likely to lead to the void 132, so that any shape can be used as long as such conditions are satisfied.

Further, in the above description, the first substrate 11 and the second substrate 21 to be bonded have been described as having the same structure, but the respective substrates may have different structures. For example, the first substrate 11 may have the structure of FIG. 5, whereas the second substrate 21 may have the structure of FIG. 7. Further, the void (space) may be formed only in one of the first substrate 11 and the second substrate 21.

Further, for example, a design method of the acute-angled concavo-convex portion formed on the side surface of the via 111 on the bonding side can be performed as follows. In other words, it is possible to predict an amount of expansion (an increase in volume) of copper (Cu) after the thermal treatment in advance and decide a type of concavo-convex portion to be used from the predicted value. Further, when the predicted value is obtained, conditions such as a temperature at the time of thermal treatment or a volume expansion coefficient of copper (Cu) can be taken into account.

The first embodiment has been described above.

3. Second Embodiment

Next, a second embodiment will be described with reference to FIGS. 9A 9B, 10A, 10B, 10C, 11, and 12. In the second embodiment, as the structure of the solid-state imaging device 1, the concavo-convex portion is formed in a part of a surface of copper (Cu) which is Cu—Cu bonded in the bonding portion between the first substrate 11 and the second substrate 21.

Accordingly, a space in which there is no copper (Cu) is formed at the time of bonding, and the expanded copper (Cu) enters the space at the time of thermal treatment, so that stress is relieved. Accordingly, in the second embodiment, it is possible to suppress a decrease in bonding strength and prevent poor electrical connection or peeling.

(Structure of Bonding Portion)

FIGS. 9A and 9B are main part cross-sectional views illustrating the structure of the solid-state imaging device of the second embodiment. A detailed configuration of the solid-state imaging device 1 of the second embodiment will be described below with reference to the main part cross-sectional view. Further FIG. 9A is a cross-sectional view before bonding, and FIG. 9B is a cross-sectional view after bonding.

As illustrated in FIG. 9A, a stacked film 200 in which an inter-layer insulating film 201, a liner insulating film 202, and an inter-layer insulating film 203 are stacked is formed in each of the first substrate 11 and the second substrate 21. As the inter-layer insulating film 201 and the inter-layer insulating film 203, for example, a PSiO film can be used. Further, as the liner insulating film 202, for example, a SiC film can be used.

Further, in the second embodiment, for the sake of convenience of description, corresponding components are also distinguished by adding "–1" to components of the first substrate 11 as reference numerals and adding "–2" to components of the second substrate 21 as reference numerals.

In the stacked film 200-1, a via 211-1 is formed, and a metallic film 205-1 of copper (Cu) or the like is embedded in the via 211-1. Further, here, a case in which copper (Cu) is used as the metallic film 205-1 will be described as an example. Further, in the stacked film 200-1, a metal seed 204-1 is formed between the via 211-1 and the metallic film 205-1.

Here, a concave portion 231-1 is formed in a part of the surface of the copper (Cu) serving as the metallic film 205-1 embedded in the via 211-1. Here, the concave portion 231-1 may include a part of the metal seed 204-1 or the inter-layer insulating film 203-1.

Further, similarly to the first substrate 11, in the stacked film 200-2 of the second substrate 21, a via 211-2 is formed, and a metallic film 205-2 of copper (Cu) or the like is embedded in the via 211-2. Further, a concave portion 231-2 is formed in a part of the surface of the copper (Cu) serving as the metallic film 205-2.

As described above, in the first substrate 11, the concave portion 231-1 is formed in a part of the surface of the copper (Cu) serving as the metallic film 205-1, and in the second substrate 21, the concave portion 231-2 is formed in a part of the surface of the copper (Cu) serving as the metallic film 205-2.

Then, the first substrate 11 and the second substrate 21 are bonded to each other, and the first bonding surface 11S in which the concave portion 231-1 is formed and the second bonding surface 21S in which the concave portion 231-2 is formed are bonded, and thus a structure illustrated in FIG. 9B is obtained.

In other words, as illustrated in FIG. 9B, on the first bonding surface 11S side of the first substrate 11, the concave portion 231-1 is formed in a part of the surface of the copper (Cu) serving as the metallic film 205-1 embedded in the via 211-1. On the other hand, on the second bonding surface 21S side of the second substrate 21, the concave portion 231-2 is formed in a part of the surface of the copper (Cu) serving as the metallic film 205-2 embedded in the via 211-2.

As the concave portions 231-1 and 231-2 are formed, the space 230 in which there is no copper (Cu) serving as the metallic films 205-1 and 205-2 is formed at the time of bonding, and thus the expanded copper (Cu) enters the space 230 formed by the concave portions 231-1 and 231-2 at the time of thermal treatment after bonding, so that the stress is relieved. Accordingly, it is possible to suppress a decrease in bonding strength and prevent poor electrical connection or peeling.

(Manufacturing Process)

Next, a flow of a manufacturing process of the solid-state imaging device of the second embodiment will be described with reference to a schematic view of FIGS. 10A, 10B, and 10C.

Here, in a damascene technique, in a case in which a Cu—Cu bonding pad is formed, a dense pattern is arranged on a pad outer circumferential portion, and when copper (Cu) is planarized using a technique such as a chemical mechanical polishing (CMP), erosion occurs, and a dent is formed in the dense pattern of the pad outer circumference portion, and thus a case in which the dent is used as the concave portion (concave portion 231) described above will be described.

Further, although not illustrated, in the manufacturing process, the stacked film 200 in which the inter-layer insulating film 201, the liner insulating film 202, and the inter-layer insulating film 203 are stacked is formed at a stage prior to the process illustrated in FIGS. 10A, 10B, and 10C. Further, a lithography process and an etching process are performed, and a via 211 is formed in the stacked film 200. Further, a metal seed forming process is performed, and a metal seed 204 is formed in the via 211.

Thereafter, in the manufacturing process, a metallic film forming process is first performed. In the metallic film forming process, the copper (Cu) serving as the metallic film 205 is formed to cover the stacked film 200 as illustrated in FIG. 10A, and the copper (Cu) serving as the metallic film 205 is embedded in the via 211 formed in the stacked film 200. Here, the copper (Cu) serving as the metallic film 105 is formed by a plating technique (Cu plating) after it is sputtered.

Then, a planarization process is performed. In the planarization process, the copper (Cu) serving as the metallic film 205 formed on the upper surface of the stacked film 200 is removed by a technique such as CMP as illustrated in FIG. 10B. At that time, as described above, erosion occurs in the dense pattern of the pad outer circumference portion, and a dent is formed.

Figure 11:
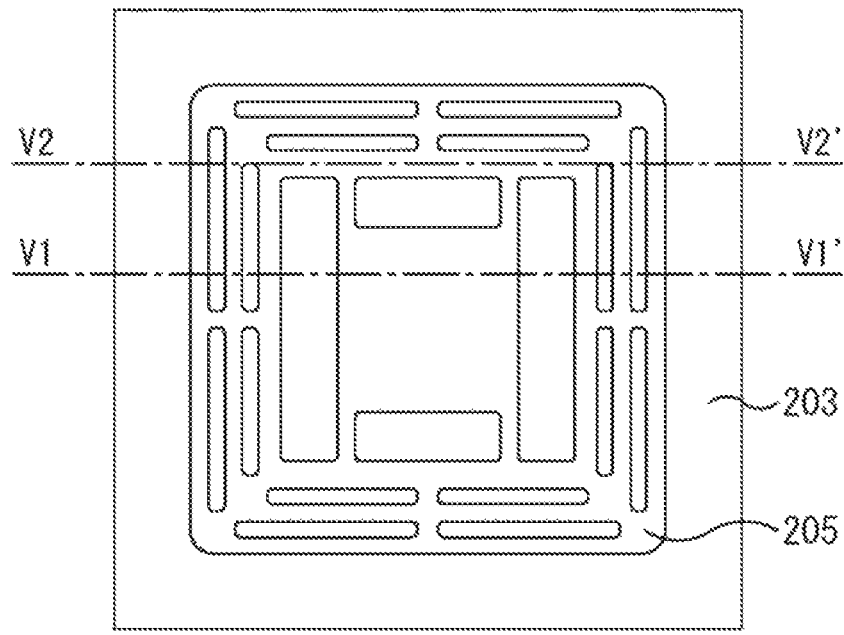
FIG. 11 is a top view illustrating a configuration example of a Cu pad of a bonding surface.

Here, two cross-sectional views illustrated in FIG. 10B correspond to a V1-V1' cross section and a V2-V2' cross section of the top view of (the Cu pad of) the bonding surface illustrated in FIG. 11. As illustrated in the top view of FIG. 11, a pattern in which LS s are densely formed (dense pattern) is formed on the Cu pad outer circumferential portion.

Further, in the V1-V1' cross section illustrated on the upper side of FIG. 10B, erosion occurs in a region in which the Cu pad outer circumferential portion patterns illustrated in FIG. 11 are dense, so that a dent is formed. In the second embodiment, the dent can be used as a concave portion 232.

Further, in the V2-V2' cross section illustrated on the lower side of FIG. 10B, erosion occurs in a portion in which a bridge of the Cu pad outer circumferential portion illustrated in FIG. 11 is formed (a region in which patterns are dense), so that a dent is formed. In the second embodiment, the dent can be used as the concave portion 232.

Next, a bonding process is performed. In the bonding process, as illustrated in FIG. 10C, the first bonding surface 11S of the first substrate 11 and the second bonding surface 21S of the second substrate 21 are bonded. Accordingly, the metallic film 205-1 and the metallic film 205-2 are bonded (Cu—Cu bonded).

Here, on the first bonding surface 11S side, the concave portion 232-1 corresponding to the erosion at the time of CMP is formed in the copper (Cu) serving as the metallic film 205-1 embedded in the via 211-1. On the other hand, on the second bonding surface 21S side, the concave portion 232-2 corresponding to the erosion at the time of CMP is formed in the copper (Cu) serving as the metallic film 205-2 embedded in the via 211-2.

As described above, since the concave portion 232-1 is formed on the first bonding surface 11S side, and the concave portion 232-2 is formed on the second bonding surface 21S side, the space 230 in which there is no copper (Cu) serving as the metallic films 205-1 and 205-2 is formed due to the concave portions 232-1 and 232-2 at the time of bonding as illustrated in FIG. 10C.

Thereafter, although not illustrated, a thermal treatment process is performed. In the thermal treatment process, the thermal treatment is performed on the first substrate 11 and the second substrate 21 bonded in the bonding process. As a condition of the thermal treatment, for example, it can be performed at several hundred ° C. for several hours.

Here, as illustrated in FIG. 10C, in the structure at the time of bonding, the space 230 in which there is no copper (Cu) is formed due the concave portion 232-1 formed on the first bonding surface 11S side and the concave portion 232-2 formed on the second bonding surface 21S side.

Therefore, at the time of thermal treatment, the copper (Cu) serving as the metallic films 205-1 and 205-2 embedded in the vias 211-1 and 211-2 expands and enters the space 230, so that stress is relieved. Accordingly, it is possible to suppress a decrease in bonding strength and prevent poor electrical connection or peeling.

The manufacturing process is performed as described above.

Further, a size and a shape of the concave portion 232 formed by the occurrence of erosion at the time of CMP can be adjusted in accordance with, for example, a density, a width, and an arrangement of the dense pattern illustrated in the top view of FIG. 11. In other words, it is possible to control the dent caused by the erosion in accordance with the density of the dense pattern or the like.

Figure 12:
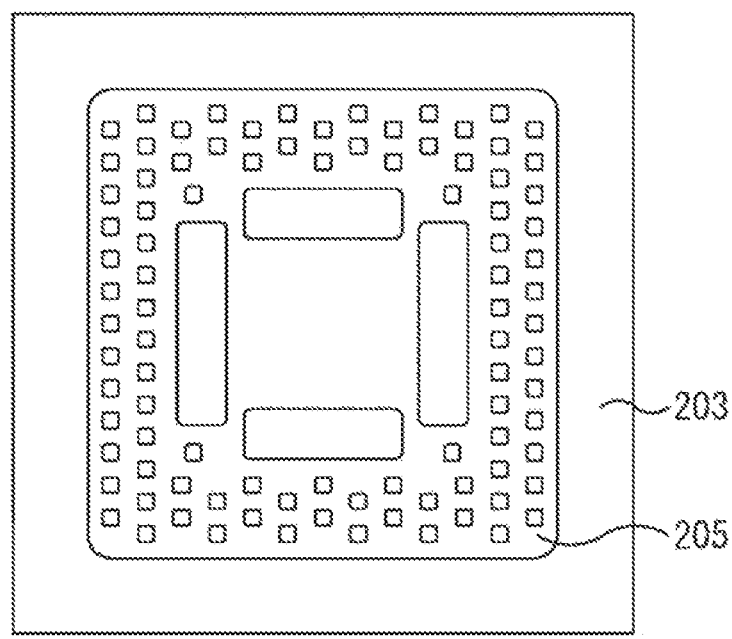
FIG. 12 is a top view illustrating a configuration example of a Cu pad of a bonding surface.

Here, in the above description, as the dense pattern, the pattern in which LS s are dense as illustrated in the top view of FIG. 11 has been described, but the dense pattern is any other pattern such as a dot. FIG. 12 illustrates an example in which the dense pattern is a dot pattern. Even in the case of a pattern in which dots are dense, it is possible to form the concave portion 232 corresponding to the erosion.

Further, in the manufacturing process described above, the case in which the erosion is used has been described, but for example, as illustrated in FIGS. 9A and 9B, the concave portion 231 may be formed by processing a part of the copper (Cu) serving as the metallic film 205 embedded in the via 211. Further, in the above description, the first substrate 11 and the second substrate 21 to be bonded have been described as having the same structure, but the respective substrates may have different structures (different concave portions may be formed). Further, the concave portion may be formed only in one of the first substrate 11 and the second substrate 21.

The second embodiment has been described above.

4. Third Embodiment

Next, a third embodiment will be described with reference to FIGS. 13, 14A, 14B, 15A, 15B, 16A, 16B, 17, 18A, 18B, 18O, 19A, 19B, 19O, 20A, 20B, 20C, 21A, 21B, 22A, 22B, 22C, 23A, 23B, 23C, 24, 25A, 25B, 25C, 26A, 26B, and 26C. In the third embodiment, as the structure of the solid-state imaging device 1, a surface area of an electrode (an electrode via portion) is enlarged in the bonding portion between the first substrate 11 and the second substrate 21.

Accordingly, stress applied to the periphery of the electrode and an electrode bonding portion by the expanded copper (Cu) at the time of thermal treatment after bonding is relieved. Accordingly, in the third embodiment, it is possible to suppress a decrease in bonding strength and prevent poor electrical connection or peeling. In particular, it is possible to suppress a variation in a transistor characteristic and poor bonding caused by a pumping phenomenon.

(Structure of Bonding Portion)

Figure 13:
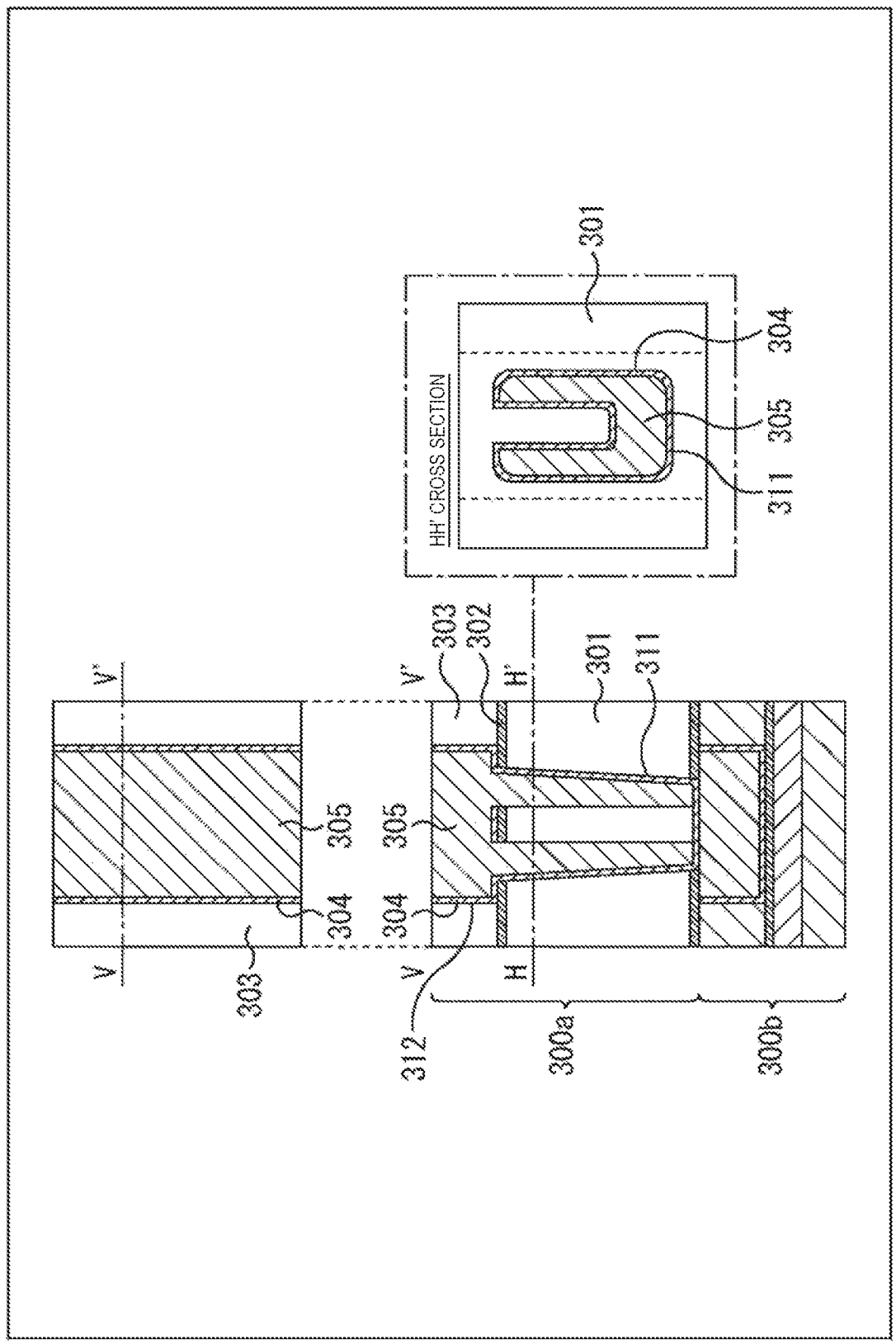
FIG. 13 is a main part cross-sectional view illustrating a structure of a solid-state imaging device of a third embodiment.

FIG. 13 is a main part cross-sectional view illustrating a structure of a solid-state imaging device of the third embodiment. A detailed configuration of the solid-state imaging device 1 of the third embodiment will be described below with reference to the main part cross-sectional view. Further, FIG. 13 illustrates a cross-sectional view (a longitudinal cross-sectional view) illustrating a VV' cross section and a cross-sectional view (a lateral cross-sectional view) illustrating a HH' cross section together with a top view.

As illustrated in FIG. 13, a stacked film 300a in which an inter-layer insulating film 301, a liner insulating film 302, and an inter-layer insulating film 303 are stacked is formed in each of the first substrate 11 and the second substrate 21. As the inter-layer insulating film 301 and the inter-layer insulating film 303, for example, a PSiO film can be used. Further, as the liner insulating film 302, for example, a SiC film can be used.

The stacked film 300a forms a stacked film together with a stacked film 300b including a lower electrode and the like formed thereon. In the stacked film 300a, a via 311 and a trench 312 are formed, and a metallic film 305 of copper (Cu) or the like is embedded in the via 311 and the trench 312. Further, here, a case in which copper (Cu) is used as the metallic film 305 will be described as an example. Further, in the stacked film 300a, a metal seed 304 is formed between the via 311 and the trench 312 and the metallic film 305.

Here, as illustrated in the top view of FIG. 13, the copper (Cu) serving as the metallic film 305 is embedded in the trench 312 having a rectangular shape. On the other hand, as illustrated in the HH' cross section, the metallic film 305 and the metal seed 304 in the via 311 have a concave shape. As described above, since the shape of the via 311 (the electrode via portion) has a concave shape, for example, the surface area of the electrode can be enlarged as compared with a case in which the shape of the electrode via portion is a circular shape.

Then, when the first substrate 11 and the second substrate 21 with the enlarged surface areas of the electrodes are bonded together, and so the first bonding surface 11S and the second bonding surface 21S are bonded, the structure illustrated in FIGS. 14A and 14B is obtained.

Further, in the third embodiment, for the sake of convenience of description, corresponding components are also distinguished by adding "-1" to components of the first substrate 11 as reference numerals and adding "-2" to components of the second substrate 21 as reference numerals.

In other words, as illustrated in FIG. 14B, at the time of bonding, on the first bonding surface 11S side of the first substrate 11, the copper (Cu) serving as the metallic film 305-1 in the via 311-1 and the copper Cu seed serving as the metal seed 304-1 have the concave shape on the HH' cross section, and the surface area of the electrode is enlarged. On the other hand, on the second bonding surface 21S side of the second substrate 21, the copper (Cu) serving as the metallic film 305-2 in the via 311-2 and the Cu seed serving as the metal seed 304-2 have the concave shape on the HH' cross section, and the surface area of the electrode is enlarged.

Thus, since the surface area of the electrode is enlarged in each of the substrates to be bonded, the copper (Cu) expands at the time of thermal treatment after bonding, but it is possible to reduce stress per unit area in the surface which is in contact with the electrode (stress indicated by arrows in FIG. 14B).

Therefore, the stress applied to the periphery of the electrode and the electrode bonding portion by the expanded copper (Cu) at the time of thermal treatment is relieved. Accordingly, it is possible to suppress a decrease in bonding strength and prevent poor electrical connection or peeling. In particular, it is possible to suppress a variation in a transistor characteristic and poor bonding caused by a pumping phenomenon.

Further, for comparison, FIGS. 15A and 15B illustrate a state at the time of bonding in a case in which the metallic film 905 and the metal seed 904 in the via on the HH' cross section have a circular shape, but in a case in which the shape on the cross section is a circular shape, since the surface area of the electrode becomes narrower than in a case in which it has a concave shape, stress per unit area in the surface which is in contact with the electrode is unable to be reduced (stress indicated by arrows in FIG. 15B). For this reason, the pumping phenomenon occurs as described above.

Figure 16A:
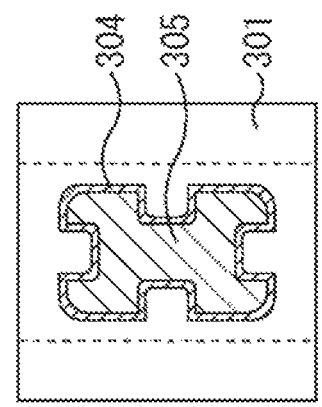
FIGS. 16A and 16B are views illustrating an example of a shape on an HH' cross section for expanding a surface area of an electrode.
Figure 16B:
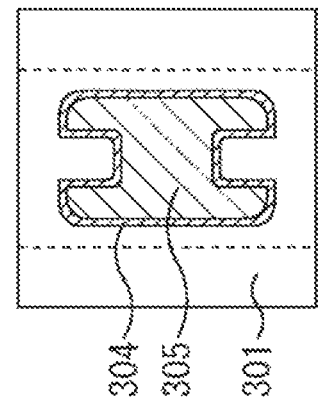

Further, in the above description, the case in which the shape of the metallic film 305 in the via 311 on the HH' cross section is a concave shape has been described, but any shape can be used as long as the surface area of the electrode can be enlarged. For example, as illustrated in FIGS. 16A and 16B, it is also possible to enlarge the surface area of the electrode by increasing the number of concavo-convex portions or changing a length. In other words, the shape of the metallic film 305 on the HH' cross section can be formed to have one or more concave or convex portions.

Figure 17:
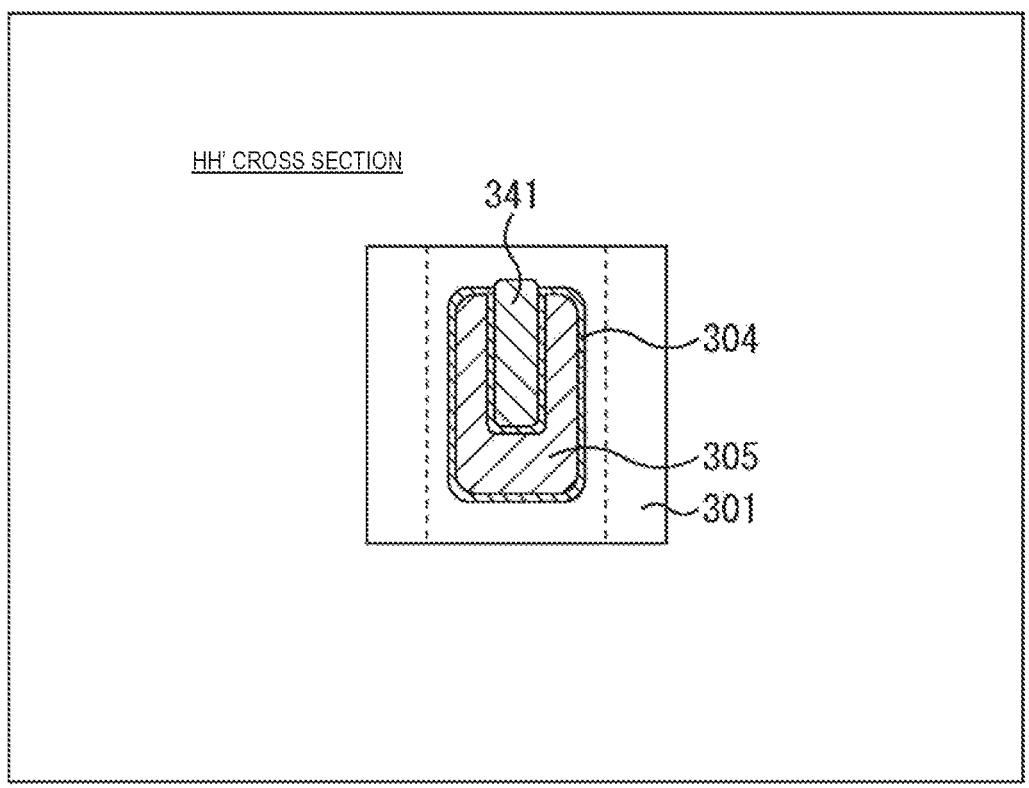
FIG. 17 is a view illustrating an example of a shape on an HH' cross section in a case in which a low thermal expansion material is used.

Further, in a case in which the shape of the metallic film 305 in the via 311 on the HH' cross section is a concave shape, a material of a region which is in contact with or adjacent to the concave portion may be changed. For example, as illustrated in FIG. 17, a low thermal expansion material 341 can be embedded to be sandwiched by a metallic film 305 having a concave shape.

Accordingly, since the stress is concentrated on the region using the low thermal expansion material 341 as compared with before the low thermal expansion material 341 is inserted, the stress in the bonding portion can be further relieved. Further, the details of the case in which the low thermal expansion material 341 is embedded will be described in a third manufacturing process (FIGS. 22A, 22B, 22C, 23A, 23B, 23C, and 24) and a fourth manufacturing process (FIGS. 25A, 25B, 25C, 26A, 26B, and 26C) which will be described later.

Further, in each of the substrates to be bonded, it is desirable to set a constraint that an electrode cross-sectional area in a direction parallel to substrate plane, that is, a cross-sectional area of the HH' cross section of the metallic film 305 is constant. This is for the purpose of suppressing a variation in a sum of electric resistance of the electrode portion and stress generated by the electrode portion. Further, since the metallic film 305 embedded in the via 311 and the trench 312 is in contact with other materials via the metal seed 304, it is possible to reduce a risk of the occurrence of device defects caused by deformation of the shape of the electrode.

(First Manufacturing Process)

First, a flow of a first manufacturing process of the solid-state imaging device of the third embodiment will be described with reference to schematic views of FIGS. 18A, 18B, 18C, 19A, 19B, and 19C.

Further, FIGS. 18A, 18B, 18C, 19A, 19B, and 19C are a top view and a cross-sectional view (a longitudinal cross-sectional view) illustrating a VV' cross section thereof. A relation between the illustrated drawings is similarly applied to second to fourth manufacturing processes to be described later.

Further, although not illustrated, in the first manufacturing process, the inter-layer insulating film 301 is formed in the stacked film 300b at a stage prior to the process illustrated in FIGS. 18A, 18B, 18C, 19A, 19B, and 19C.

Figure 18:
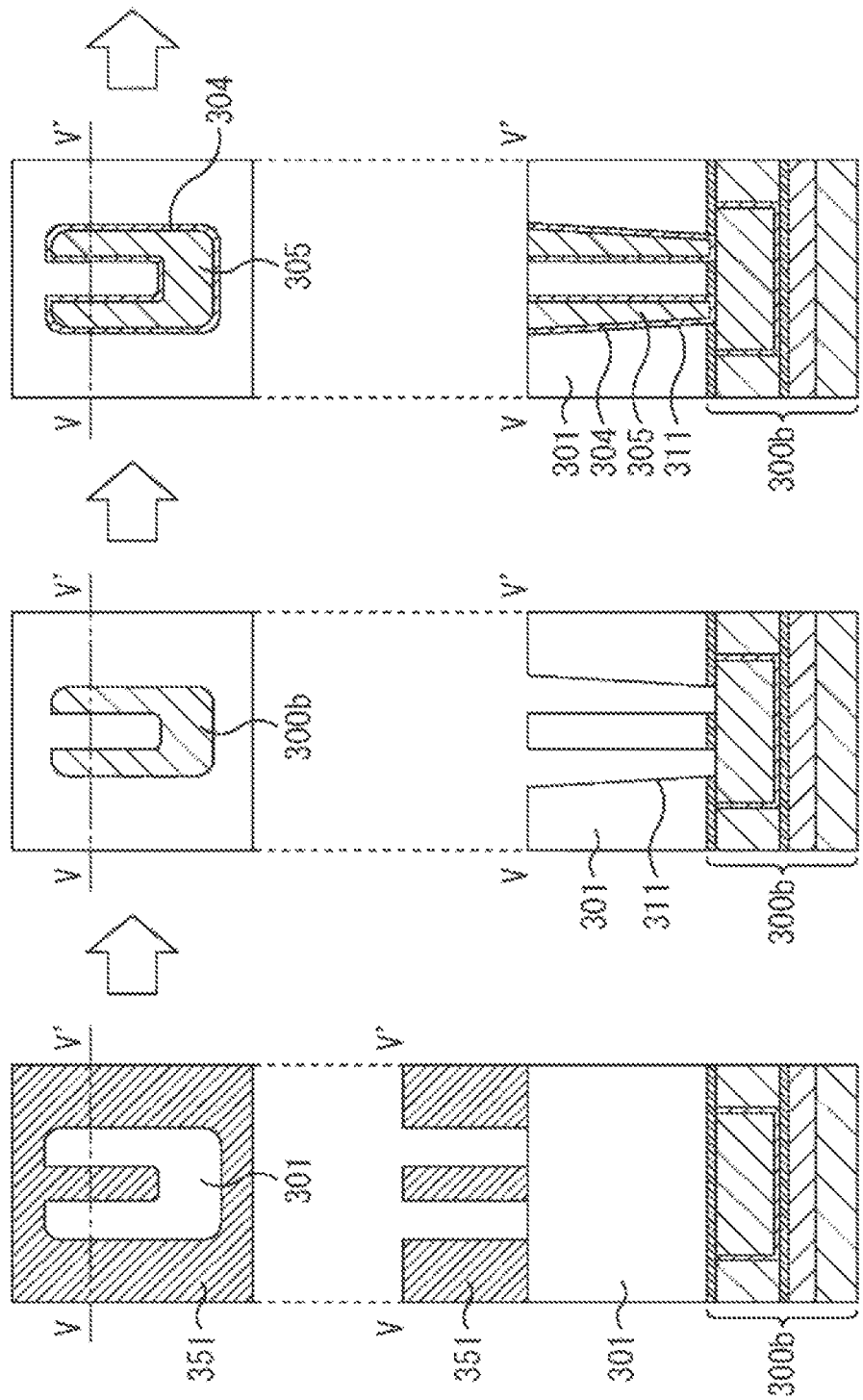
FIGS. 18A, 18B, and 18C are views illustrating a flow of a first manufacturing process of the solid-state imaging device of the third embodiment.

Thereafter, in the first manufacturing process, first, a first lithography process is performed. In the first lithography process, as illustrated in FIG. 18A, the inter-layer insulating film 301 is coated with a photoresist 351, and a resist pattern for forming the via 311 is formed. An upper surface of the photoresist 351 has a concave pattern as illustrated in the top view of FIG. 18A.

Then, a first etching process is performed. In the first etching process, as illustrated in FIG. 18B, a resist pattern is transferred onto the inter-layer insulating film 301 by dry etching using the resist pattern formed in the first lithography process of FIG. 18A as a mask. Accordingly, the via 311 is formed in the inter-layer insulating film 301. An upper surface of the via 311 has a concave shape as illustrated in the top view of FIG. 18B.

Then, a first metallic film forming process is performed. In the first metallic film forming process, as illustrated in FIG. 18C, first, the metal seed 304 such as the Cu seed is formed in the via 311 formed in the inter-layer insulating film 301, and then the metallic film 305 of copper (Cu) or the like is formed. Further, as illustrated in the top view of FIG. 18C, the copper (Cu) serving as the metallic film 305 is embedded in the via 311 having a concave shape.

Figure 19:
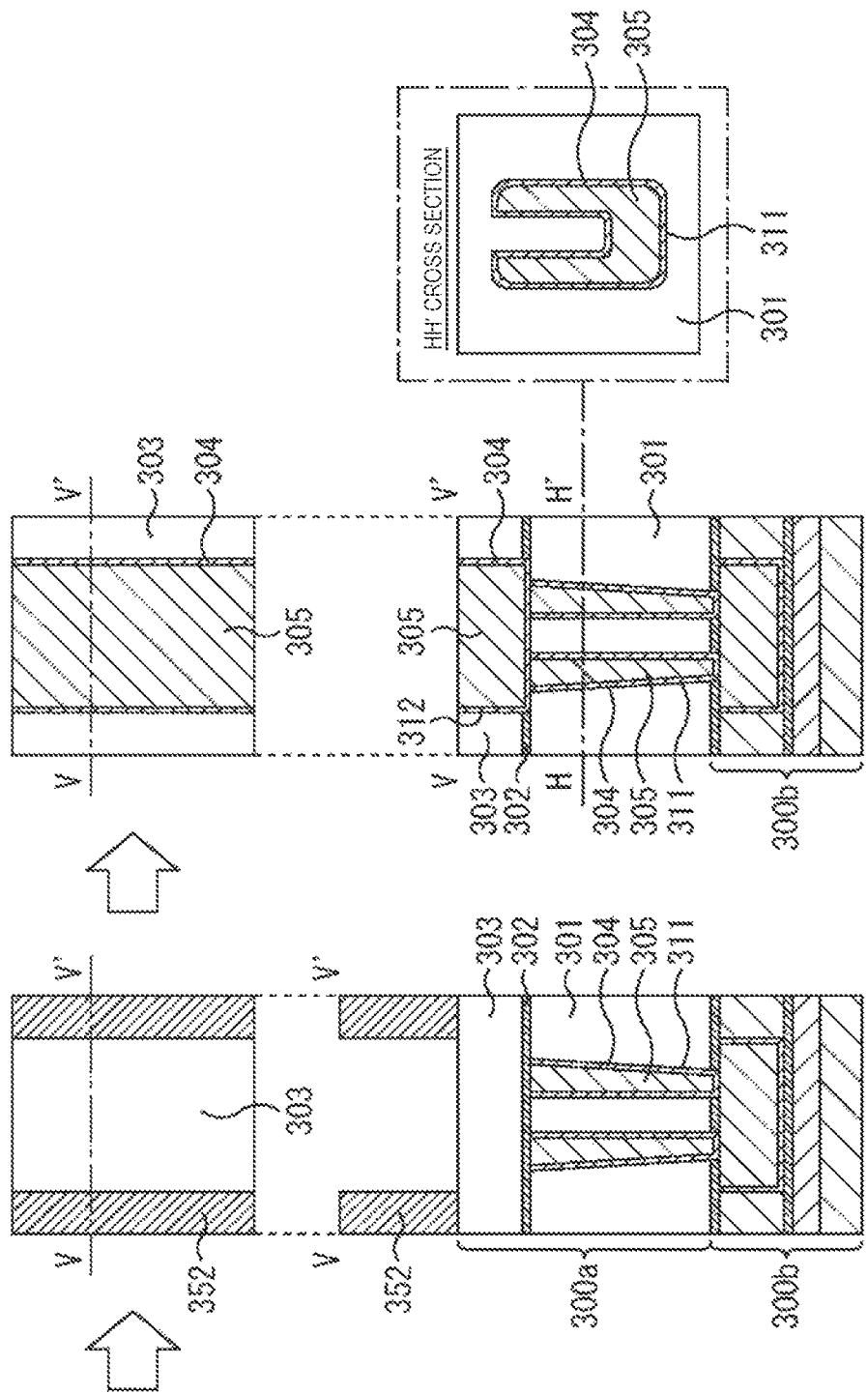
FIGS. 19A and 19B are views illustrating a flow of the first manufacturing process of the solid-state imaging device of the third embodiment.

Then, a second lithography process is performed. Further, although not illustrated, the liner insulating film 302 and the inter-layer insulating film 303 are stacked on the inter-layer insulating film 301 after the first metallic film forming process at a stage prior to the second lithography process. Further, in the second lithography process, as illustrated in FIG. 19A, the inter-layer insulating film 303 is coated with a photoresist 352, and patterning for forming the trench 312 is performed. An upper surface of the photoresist 352 has a rectangular pattern as illustrated in the top view of FIG. 19A.

Further, since it is similar to the first etching process described above, although not illustrated, a second etching process is performed after the second lithography process, and the trench 312 is formed in the liner insulating film 302 and the inter-layer insulating film 303 by etching using the resist pattern formed in the second lithography process.

Then, a second metallic film forming process is performed. In the second metallic film forming process, as illustrated in FIG. 19B, the metal seed 304 such as the Cu seed is formed in the trench 312 formed in the liner insulating film 302 and the inter-layer insulating film 303, and then the metallic film 305 of copper (Cu) or the like is formed.

Further, as illustrated in the top view of FIG. 19B, the copper (Cu) serving as the metallic film 305 is embedded in the trench 312 having a rectangular shape. Further, as illustrated in the cross-sectional view (the lateral cross-sectional view) illustrating the HH' cross section, the metallic film 305 and the metal seed 304 in the via 311 have a concave shape.

Thereafter, although not illustrated, a bonding process and a thermal treatment process are performed. In the bonding process, the first bonding surface 11S of the first substrate 11 and the second bonding surface 21S of the second substrate 21 are bonded to each other, similarly to FIG. 14B. Further, in the thermal treatment process, the thermal treatment is performed on the first substrate 11 and the second substrate 21 bonded in the bonding process. As a condition of the thermal treatment, for example, it can be performed at several hundred □C for several hours.

Here, as illustrated in the cross-sectional view (lateral sectional view) illustrating the HH' cross section of FIG. 19B, the copper (Cu) serving as the metallic film 305 in the via 311 and the Cu seed serving as the metal seed 304 have a concave shape, and thus the surface area of the electrode via portion is enlarged. In other words, as compared with the lateral sectional views of FIGS. 14A, 14B, 15A, and 15B, the surface area of the electrode via portion is enlarged by changing the shape of the electrode via portion from a circular shape of a related art to a concave shape.

Therefore, stress applied to the periphery of the electrode and an electrode bonding portion by the expanded copper (Cu) at the time of thermal treatment is relieved. Accordingly, it is possible to suppress a decrease in bonding strength and prevent poor electrical connection or peeling. In particular, it is possible to suppress a variation in a transistor characteristic and poor bonding caused by a pumping phenomenon.

The first manufacturing process is performed as described above.

(Second Manufacturing Process)

Next, a flow of a second manufacturing process of the solid-state imaging device of the third embodiment will be described with reference to schematic views of FIGS. 20A, 20B, 20C, 21A, and 21B.

Further, although not illustrated in the drawing, in the second manufacturing process, the stacked film 300a in which the inter-layer insulating film 301, the liner insulating film 302, and the inter-layer insulating film 303 are stacked is formed on the stacked film 300b at a stage prior to the process illustrated in FIGS. 20A, 20B, 20C, 21A, and 21B.

Figure 20:
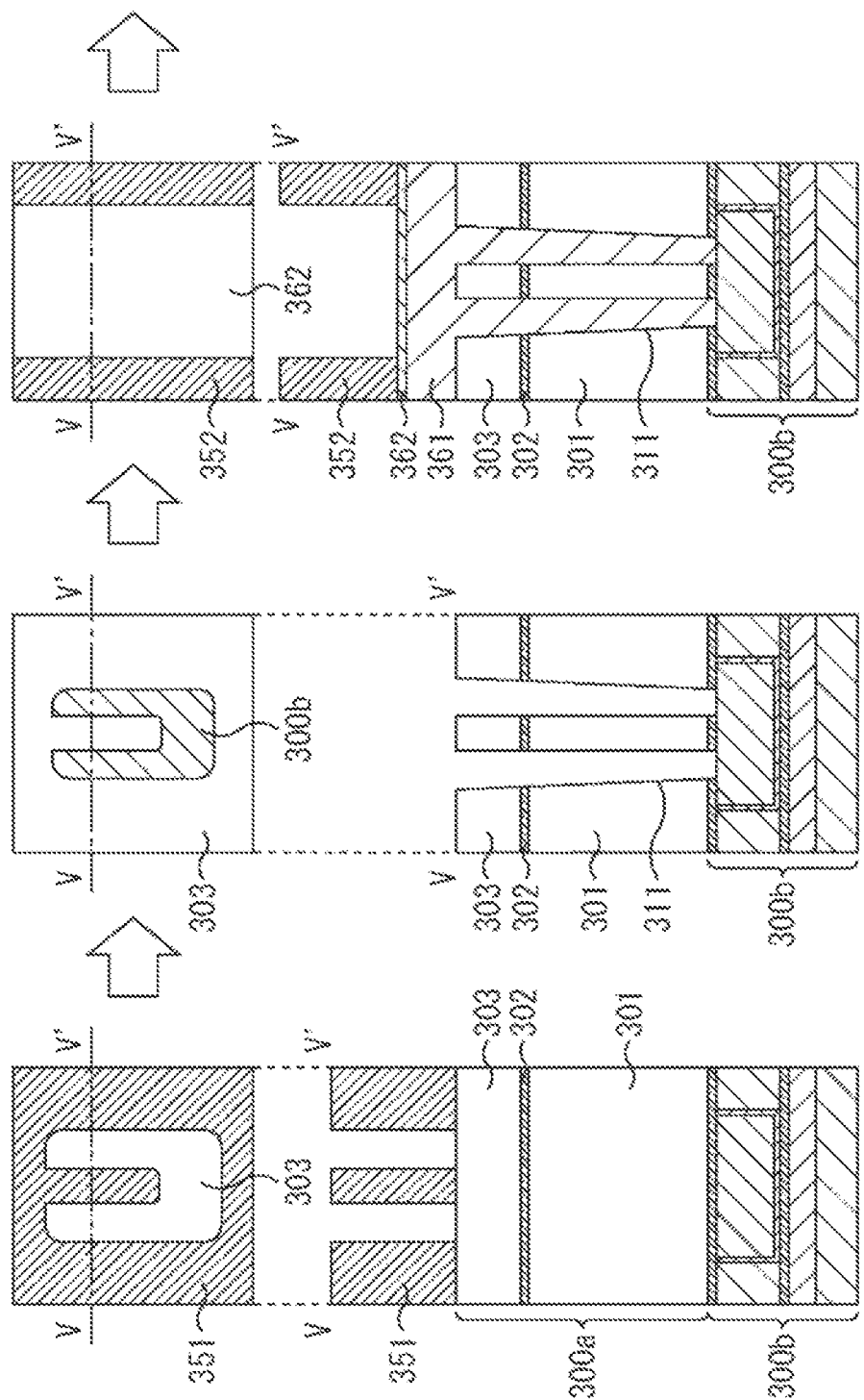
FIGS. 20A, 20B, and 20C are views illustrating a flow of a second manufacturing process of the solid-state imaging device of the third embodiment.

Thereafter, in the second manufacturing process, first, a first lithography process is performed. In the first lithography process, as illustrated in FIG. 20A, the inter-layer insulating film 303 is coated with a photoresist 351, and a resist pattern for forming the via 311 is formed. An upper surface of the photoresist 351 has a concave pattern as illustrated in the top view of FIG. 20A.

Then, a first etching process is performed. In the first etching process, as illustrated in FIG. 20B, a resist pattern is transferred onto the stacked film 300a by dry etching using the resist pattern formed in the first lithography process as a mask. Accordingly, the via 311 is formed in the stacked film 300a. An upper surface of the via 311 has a concave shape as illustrated in the top view of FIG. 20B.

Next, a second lithography process is performed. In the second lithography process, as illustrated in FIG. 20C, an embedding material 361 is embedded in the via 311 formed in the stacked film 300a, and an upper layer film 362 is formed on the embedding material 361. Then, the upper layer film 362 is coated with a photoresist 352, and a resist pattern for forming the trench 312 is formed. An upper surface of the photoresist 352 has a rectangular pattern as illustrated in the top view of FIG. 20C.

Figure 21:
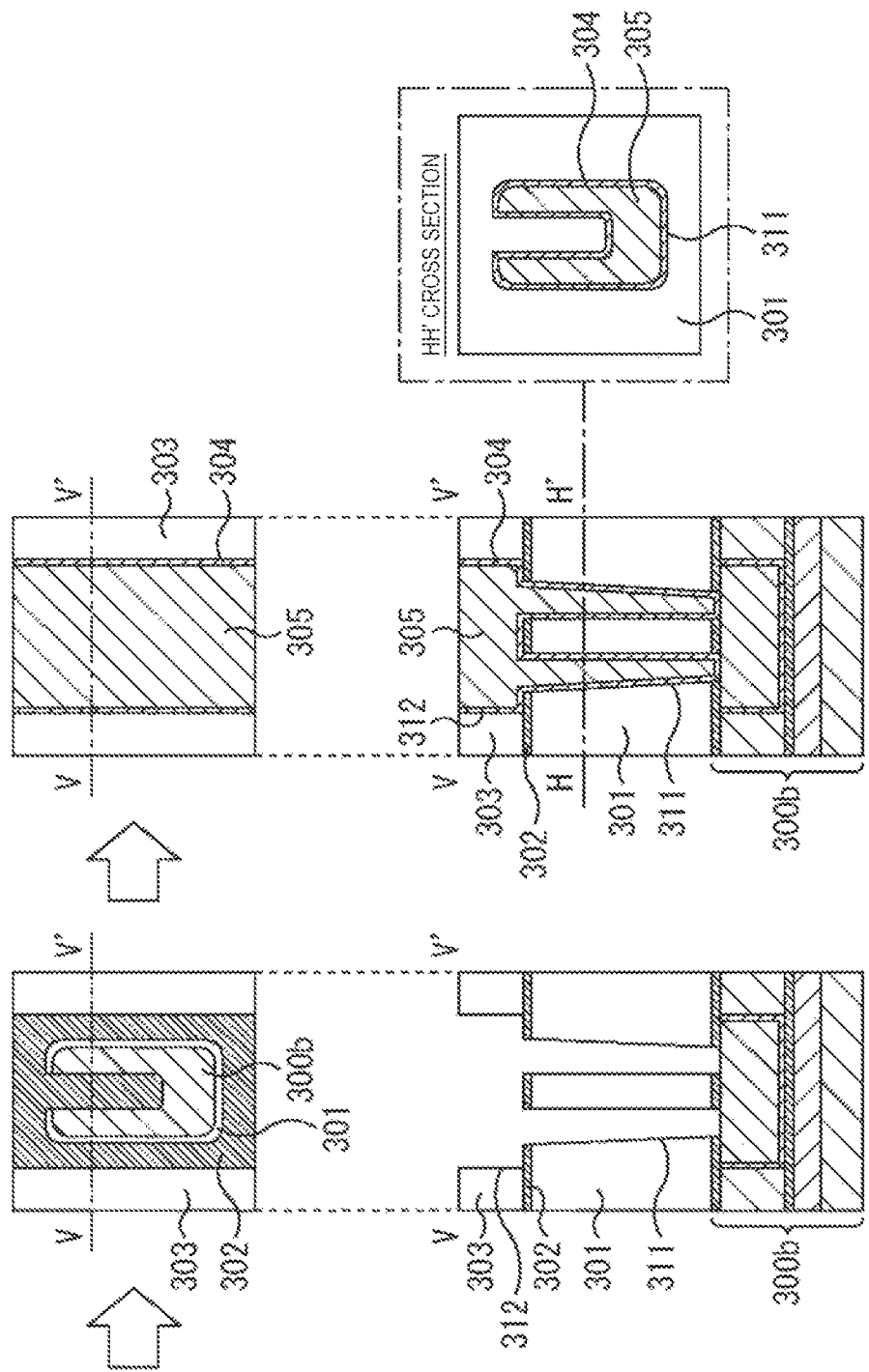
FIGS. 21A and 21B are views illustrating a flow of the second manufacturing process of the solid-state imaging device of the third embodiment.

Then, a second etching process is performed. In the second etching process, as illustrated in FIG. 21A, a resist pattern is transferred onto the inter-layer insulating film 303 by dry etching using the resist pattern formed in the second lithography process of FIG. 20C as a mask. Accordingly, the trench 312 is formed in the inter-layer insulating film 303. An upper surface of the trench 312 has a rectangular shape as illustrated in the top view of FIG. 21A.

Next, a metallic film forming process is performed. In the metallic film forming process, as illustrated in FIG. 21B, the metal seed 304 such as the Cu seed is formed in the via 311 and the trench 312 formed in the stacked film 300a, and then the metallic film 305 of copper (Cu) or the like is formed.

Further, as illustrated in the top view of E of FIG. 21B, the copper (Cu) serving as the metallic film 305 is embedded in the via 311 having the concave shape together with the trench 312 having a rectangular shape. In other words, as illustrated in the cross-sectional view (the lateral cross-sectional view) illustrating the HH' cross section, the metallic film 305 and the metal seed 304 in the via 311 have a concave shape.

Thereafter, although not illustrated, a bonding process and a thermal treatment process are performed. In the bonding process, the first bonding surface 11S of the first substrate 11 and the second bonding surface 21S of the second substrate 21 are bonded to each other, similarly to B FIG. 14B. Further, in the thermal treatment process, the thermal treatment is performed on the first substrate 11 and the second substrate 21 bonded in the bonding process. As a condition of the thermal treatment, for example, it can be performed at several hundred ° C. for several hours.

Here, as illustrated in the cross-sectional view (lateral sectional view) illustrating the HH' cross section of FIG. 21B, the copper (Cu) serving as the metallic film 305 in the via 311 and the Cu seed serving as the metal seed 304 have a concave shape, and thus the surface area of the electrode via portion is enlarged.

Therefore, stress applied to the periphery of the electrode and an electrode bonding portion by the expanded copper (Cu) at the time of thermal treatment is relieved. Accordingly, it is possible to suppress a decrease in bonding strength and prevent poor electrical connection or peeling. In particular, it is possible to suppress a variation in a transistor characteristic and poor bonding caused by a pumping phenomenon.

The second manufacturing process is performed as described above.

(Third Manufacturing Process)

Next, a flow of a third manufacturing process of the solid-state imaging device of the third embodiment will be described with reference to schematic views of FIGS. 22A, 22B, 22C, 23A, 23B, 23C, and 24.

Further, although not illustrated, in the third manufacturing process, the inter-layer insulating film 301 is formed on the stacked film 300b at a stage prior to the process illustrated in FIGS. 22A, 22B, 22C, 23A, 23B, 23C, and 24.

Figure 22:
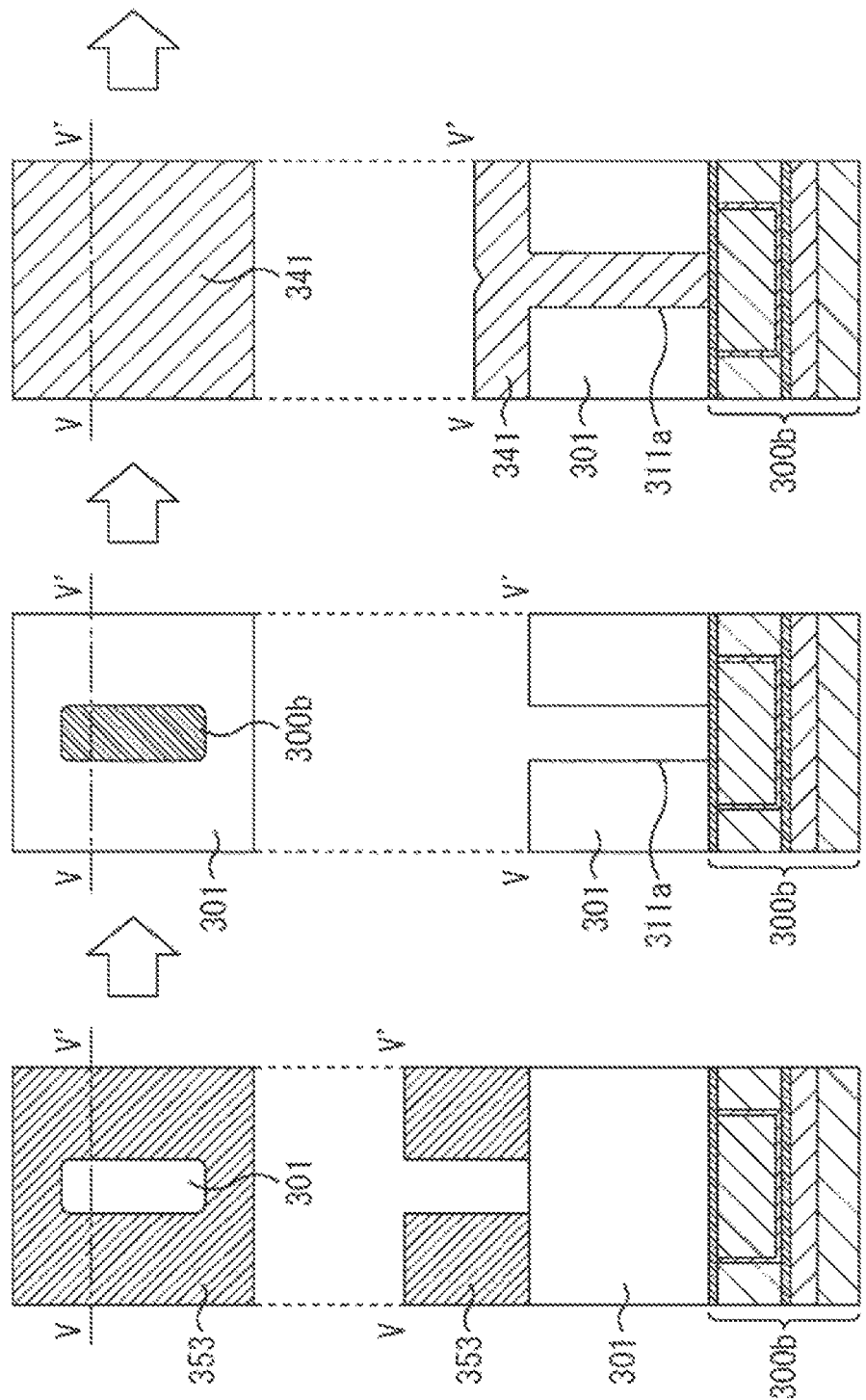
FIGS. 22A, 22B, and 22C are views illustrating a flow of a third manufacturing process of the solid-state imaging device of the third embodiment.

Thereafter, in the third manufacturing process, first, a first lithography process is performed. In the first lithography process, as illustrated in FIG. 22A, the inter-layer insulating film 301 is coated with a photoresist 353, and a resist pattern for forming the via 311a is formed. An upper surface of the photoresist 353 has a rectangular pattern as illustrated in the top view of FIG. 22A.

Then, a first etching process is performed. In the first etching process, as illustrated in FIG. 22B, a resist pattern is transferred onto the inter-layer insulating film 301 by dry etching using the resist pattern formed in the first lithography process of FIG. 22A as a mask. Accordingly, the via 311a is formed in the inter-layer insulating film 301. An upper surface of the via 311a has a rectangular shape as illustrated in the top view of FIG. 22B.

Next, a low thermal expansion material embedding process is performed. In the low thermal expansion material embedding process, as illustrated in FIG. 22C, the low thermal expansion material 341 is embedded in the via 311a formed in the inter-layer insulating film 301. Here, for example, the following materials can be used as the inter-layer insulating film 301 serving as the inter-layer insulating film and the low thermal expansion material 341.

In other words, in a case in which a Low-k material (BD coefficient of thermal expansion=11 ppm/K) represented by SiOCH is used as the inter-layer insulating film 301, SiO2 (TEOS coefficient of thermal expansion=0.6 ppm/K) such as TEOS can be used as the low thermal expansion material 341. Here, in a case in which SiO2 having a low coefficient of thermal expansion is selected as the inter-layer insulating film 301, it should be noted that there is no insulating film which can be selected as the low thermal expansion material 341 among insulating films commonly used in a semiconductor field.

Figure 23:
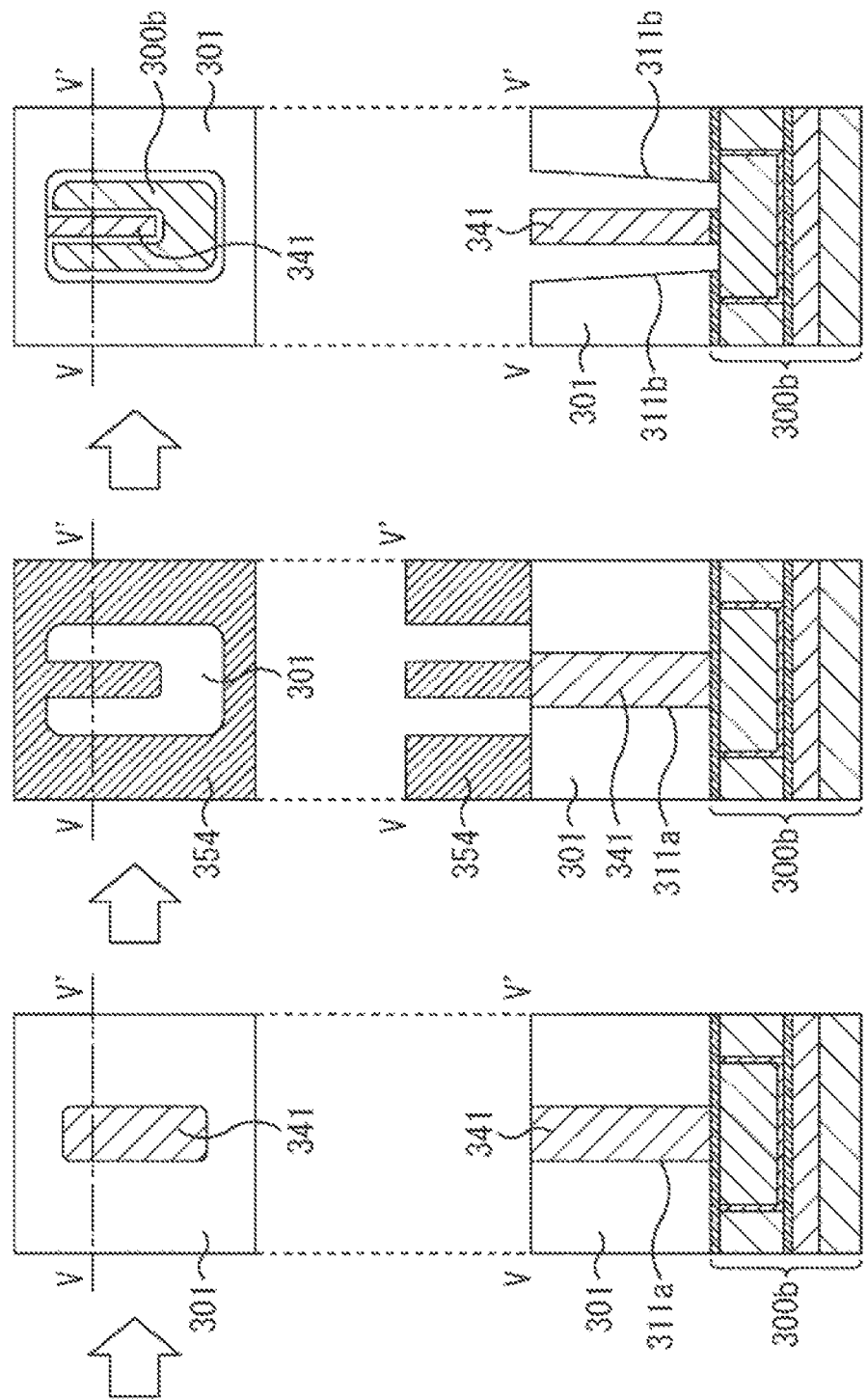
FIGS. 23A, 23B, and 23C are views illustrating a flow of the third manufacturing process of the solid-state imaging device of the third embodiment.

Next, a planarization process is performed. In the planarization process, as illustrated in FIG. 23A, an extra low thermal expansion material 341 other than the inside of the via 311a is removed using a technique such as, for example, CMP. Accordingly, as illustrated in a top view of FIG. 23A, the low thermal expansion material 341 is embedded in the via 311a formed in the inter-layer insulating film 301.

Next, a second lithography process is performed. In the second lithography process, as illustrated in FIG. 23B, the inter-layer insulating film 301 is coated with a photoresist 354, and a resist pattern for forming the via 311b is formed. An upper surface of the photoresist 354 has a concave pattern as illustrated in the top view of FIG. 23B.

Then, a second etching process is performed. In the second etching process, as illustrated in FIG. 23C, a resist pattern is transferred onto the inter-layer insulating film 301 by dry etching using the resist pattern formed in the second lithography process of FIG. 23B as a mask. Accordingly, the via 311b is formed in the inter-layer insulating film 301.

An upper surface of the via 311b has a concave shape as illustrated in a top view of FIG. 23C. In other words, in the inter-layer insulating film 301, the via 311b is formed to sandwich the low thermal expansion material 341 embedded in the via 311a.

Further, since it is similar to the first manufacturing process described above (FIG. 18C and FIG. 19A), although not illustrated, after the second etching process, the first metallic film forming process is performed, the metal seed 304 (Cu seed) and the metallic film 305 (copper (Cu)) are formed in the via 311b. Then, after the liner insulating film 302 and the inter-layer insulating film 303 are stacked, a third lithography process and a third etching process are further performed. Accordingly, the trench 312 is formed in the liner insulating film 302 and the inter-layer insulating film 303.

Then, a second metallic film forming process is performed. In the second metallic film forming process, as illustrated in FIG. 24, the metallic film 305 of copper (Cu) or the like is formed after the metal seed 304 such as the Cu seed is formed in the trench 312 formed in the liner insulating film 302 and the inter-layer insulating film 303.

Figure 24:
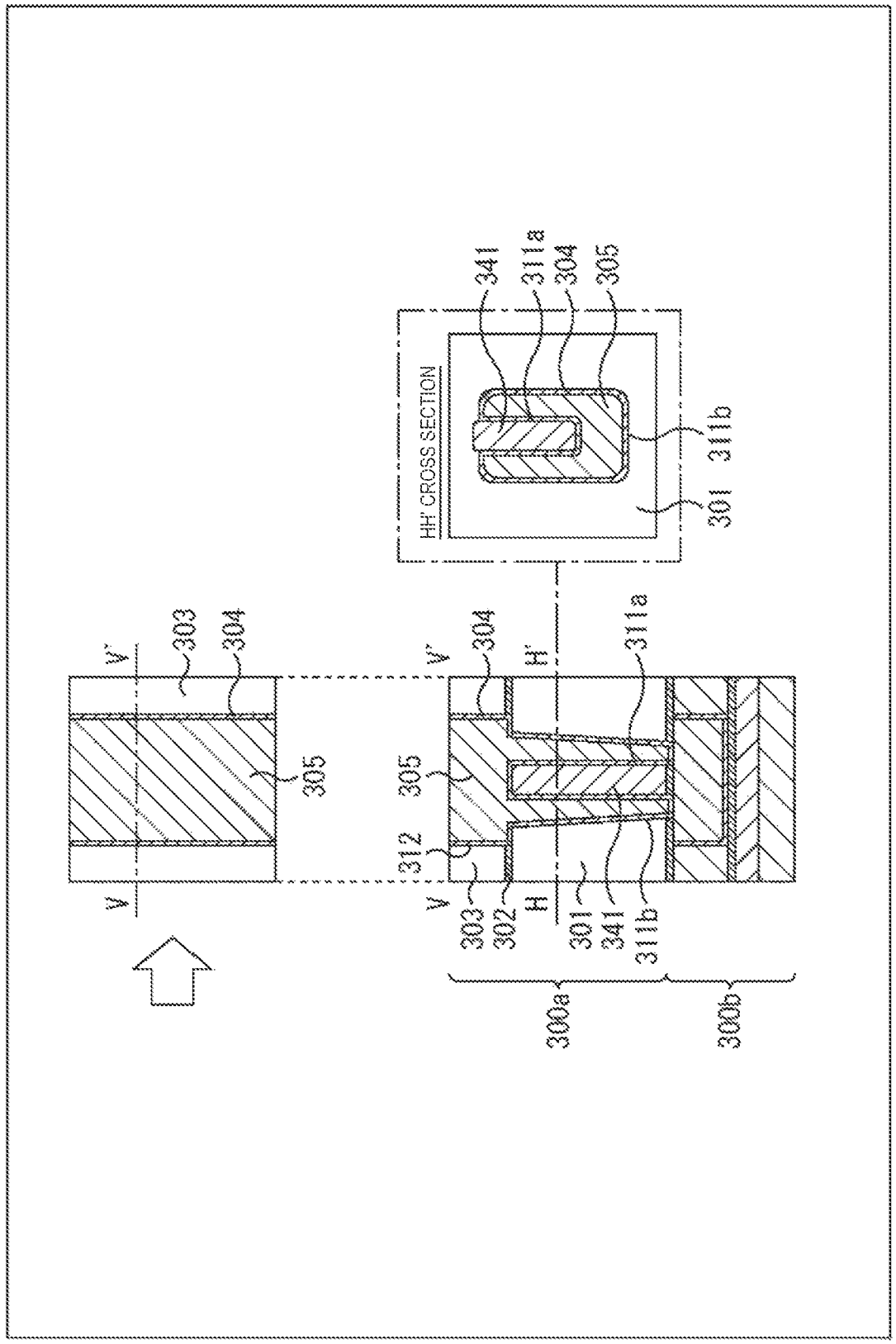
FIG. 24 is a view illustrating a flow of the third manufacturing process of the solid-state imaging device of the third embodiment.

Further, as illustrated in a top view of FIG. 24, the copper (Cu) serving as the metallic film 305 is embedded in the trench 312 having a rectangular shape. Further, as illustrated in the cross-sectional view (the lateral cross-sectional view) illustrating the HH' cross section, the metallic film 305 and the metal seed 304 in the via 311b have a concave shape, and the low thermal expansion material 341 is embedded in a rectangular shape in the via 311a formed to be interposed by the via 311b.

Thereafter, although not illustrated, a bonding process and a thermal treatment process are performed. In the bonding process, the first bonding surface 11S of the first substrate 11 and the second bonding surface 21S of the second substrate 21 are bonded to each other, similarly to FIG. 14B. Further, in the thermal treatment process, the thermal treatment is performed on the first substrate 11 and the second substrate 21 bonded in the bonding process. As a condition of the thermal treatment, for example, it can be performed at several hundred ° C. for several hours.

Here, as illustrated in the cross-sectional view (lateral sectional view) illustrating the HH' cross section of FIG. 24, the copper (Cu) serving as the metallic film 305 in the via 311b and the Cu seed serving as the metal seed 304 have a concave shape, and thus the surface area of the electrode via portion is enlarged. Further, the low thermal expansion material 341 having a rectangular shape is embedded in the via 311a, and a material of a region which is in contact with the electrode concave portion changes.

Therefore, stress applied to the periphery of the electrode and an electrode bonding portion by the expanded copper (Cu) at the time of thermal treatment is relieved. Further, since the stress is concentrated on the region using the low thermal expansion material 341 as compared with before the low thermal expansion material 341 is inserted, the stress in the bonding portion can be further relieved. Accordingly, it is possible to suppress a decrease in bonding strength and prevent poor electrical connection or peeling. In particular, it is possible to suppress a variation in a transistor characteristic and poor bonding caused by a pumping phenomenon.

The third manufacturing process is performed as described above.

(Fourth Manufacturing Process)

Finally, a flow of a fourth manufacturing process of the solid-state imaging device of the third embodiment will be described with reference to schematic views of FIGS. 25A, 25B, 25C, 26A, 26B, and 26C.

Further, although not illustrated, in the fourth manufacturing process, the inter-layer insulating film 301 is formed on the stacked film 300b at a stage prior to the process illustrated in FIGS. 25A, 25B, 25C, 26A, 26B, and 26C.

Thereafter, in the fourth manufacturing process, first, a first lithography process is performed. In the first lithography process, as illustrated in FIG. 25A, the inter-layer insulating film 301 is coated with a photoresist 353, and a resist pattern for forming the via 311a is formed. An upper surface of the photoresist 353 has a rectangular pattern as illustrated in a top view of FIG. 25A.

Further, since it is similar to the third manufacturing process (FIG. 22B and FIG. 23A), although not illustrated, after the first lithography process, the first etching process and the low thermal expansion material embedding process are performed, and the low thermal expansion material 341 is embedded in the via 311a formed in the inter-layer insulating film 301.

Next, a planarization process is performed. In the planarization process, as illustrated in FIG. 25B, the low thermal expansion material 341 other than the inside of the via 311a is removed using a technique such as, for example, CMP. Accordingly, as illustrated in a top view of FIG. 25B, the low thermal expansion material 341 is embedded in the via 311a formed in the inter-layer insulating film 301.

Next, a film stacking process is performed. In the film stacking process, as illustrated in FIG. 25C, the liner insulating film 302 and the inter-layer insulating film 303 are stacked on the inter-layer insulating film 301 in which the low thermal expansion material 341 is embedded.

Next, a second lithography process is performed. In the second lithography process, as illustrated in FIG. 26A, the stacked film 300 is coated with a photoresist 354, and a resist pattern for forming the via 311b is formed. An upper surface of the photoresist 354 has a concave pattern as illustrated in a top view of FIG. 26A.

Then, a second etching process is performed. In the second etching process, as illustrated in FIG. 26B, a resist pattern is transferred onto the stacked film 300a by dry etching using the resist pattern formed in the second lithography process of FIG. 26A as a mask. Accordingly, the via 311b is formed in the stacked film 300a.

An upper surface of the via 311b has a concave shape as illustrated in a top view of FIG. 26B. In other words, in the inter-layer insulating film 301 of the stacked film 300a, the via 311b is formed to sandwich the low thermal expansion material 341 embedded in the via 311a.

Further, since it is similar to the second manufacturing process (FIG. 20C and FIG. 21A), although not illustrated, a third lithography process and a third etching process are performed after the second etching process, and the trench 312 is formed in the inter-layer insulating film 303.

Then, a metallic film forming process is performed. In the metallic film forming process, as illustrated in FIG. 26C, the metal seed 304 such as the Cu seed is formed in the via 311 and trench 312 formed in the stacked film 300, and then the metallic film 305 of copper (Cu) or the like is formed.

Further, as illustrated in the top view of FIG. 26C, the copper (Cu) serving as the metallic film 305 is embedded in the via 311b having a concave shape together with the trench 312 having a rectangular shape. In other words, as illustrated in the cross-sectional view (the lateral cross-sectional view) illustrating the HH' cross section, the metallic film 305 and the metal seed 304 in the via 311 have a concave shape, and the low thermal expansion material 341 is embedded in a rectangular shape in the via 311a formed to be interposed by the via 311b.

Thereafter, although not illustrated, a bonding process and a thermal treatment process are performed. In the bonding process, the first bonding surface 11S of the first substrate 11 and the second bonding surface 21S of the second substrate 21 are bonded to each other, similarly to FIG. 14B. Further, in the thermal treatment process, the thermal treatment is performed on the first substrate 11 and the second substrate 21 bonded in the bonding process. As a condition of the thermal treatment, for example, it can be performed at several hundred □C for several hours.

Here, as illustrated in the cross-sectional view (lateral sectional view) illustrating the HH' cross section of FIG. 26C, the copper (Cu) serving as the metallic film 305 in the via 311*b* and the Cu seed serving as the metal seed 304 have a concave shape, and thus the surface area of the electrode via portion is enlarged. Further, the low thermal expansion material 341 having a rectangular shape is embedded in the via 311*a*, and a material of a region which is in contact with the electrode concave portion changes.

Therefore, stress applied to the periphery of the electrode and an electrode bonding portion by the expanded copper (Cu) at the time of thermal treatment is relieved. Further, since the stress is concentrated on the region using the low thermal expansion material 341 as compared with before the low thermal expansion material 341 is inserted, the stress in the bonding portion can be further relieved. Accordingly, it is possible to suppress a decrease in bonding strength and prevent poor electrical connection or peeling. In particular, it is possible to suppress a variation in a transistor characteristic and poor bonding caused by a pumping phenomenon.

The fourth manufacturing process is performed as described above.

The third embodiment has been described above.

5. Fourth Embodiment

Finally, a fourth embodiment will be described with reference to FIGS. 27A, 27B, 28A, 28B, 28C, 29A, 29B, 29C, 30A, 30B, 30C, 31A, 31B, 32A, 32B, 33A, 33B, 33C, 34A, 34B, 34C, 35A, 35B, 36A, 36B, 36C, 37A, 37B, and 37C. In the fourth embodiment, as the structure of the solid-state imaging device 1, a space is formed in a part of a side surface of copper (Cu) or a bottom of a wiring pattern in the bonding portion between the first substrate 11 and the second substrate 21.

Accordingly, a space in which there is no copper (Cu) is formed at the time of bonding, and the expanded copper (Cu) enters the space at the time of thermal treatment, so that stress is relieved. Accordingly, in the fourth embodiment, it is possible to suppress a decrease in bonding strength and prevent poor electrical connection or peeling.

(First Structure of Bonding Portion)

FIGS. 27A and 27B are main part cross-sectional views illustrating a first structure of the solid-state imaging device of the fourth embodiment. A detailed configuration of the solid-state imaging device 1 of the fourth embodiment will be described with reference to the main part cross-sectional view. Further, FIG. 27A is a cross-sectional view before bonding, and FIG. 27B is a cross-sectional view after bonding.

As illustrated in FIG. 27A, a stacked film 400 in which an inter-layer insulating film 401, a liner insulating film 402, and an inter-layer insulating film 403 are stacked is formed in each of the first substrate 11 and the second substrate 21. As the inter-layer insulating film 401 and the inter-layer insulating film 403, for example, a PSiO film can be used. Further, as the liner insulating film 402, for example, a SiC film can be used.

In the stacked film 400, a via 411 for a connection hole with a lower electrode and a wiring trench 412 are formed, and a metallic film 405 of copper (Cu) or the like is embedded in the via 411 and the trench 412. Further, here, as an example, a case in which copper (Cu) is used as the metallic film 405 will be described.

In the stacked film 400, a metal seed 404 is formed between the via 411 for the connection hole and the metallic film 405. Further, in the stacked film 400, in addition to the metal seed 404, a first side film 406 and a second side film 407 are formed between the wiring trench 412 and the metallic film 405.

Here, the periphery of the copper (Cu) serving as the metallic film 405 formed in the trench 412 of the stacked film 400 is surrounded by the first side film 406, the second side film 407, and the metal seed 404 in order from the outer circumferential side, but since upper surfaces of the metal seed 404 and the second side film 407 are at a position lower than upper surfaces of the metallic film 405 and the first side film 406, a space 431 is formed therein.

If the first substrate 11 and the second substrate 21 each having the space 431 formed therein are bonded to each other, and the first bonding surface 11S and the second bonding surface 21S are bonded to each other, a structure illustrated in FIG. 27B is obtained.

Further, in the fourth embodiment, for the sake of convenience of description, corresponding components are also distinguished by adding "−1" to components of the first substrate 11 as reference numerals and adding "−2" to components of the second substrate 21 as reference numerals.

In other words, as illustrated in FIG. 27B, at the time of bonding, on the first bonding surface 11S side of the first substrate 11, the upper surfaces of the metal seed 404-1 and the second side film 407-1 are at a position lower than the upper surfaces of the metallic film 405-1 and the first side film 406-1, and thus the space 431-1 is formed therein. On the other hand, on the second bonding surface 21S side of the second substrate 21, the upper surfaces of the metal seed 404-2 and the second side film 407-2 are at a position lower than the upper surfaces of the metallic film 405-2 and the first side film 406-2, and thus the space 431-2 is formed therein.

As the spaces 431-1 and 431-2 are formed, a space 430 in which there is no copper (Cu) serving as the metallic films 405-1 and 405-2 is formed at the time of bonding, and thus at the time of thermal treatment after bonding, the expanded copper (Cu) enters the space 430 formed by the spaces 431-1 and 431-2, so that stress is relieved. Accordingly, it is possible to suppress a decrease in bonding strength and prevent poor electrical connection or peeling.

(First Manufacturing Process)

Next, a flow of a first manufacturing process of the solid-state imaging device of the fourth embodiment will be described with reference to schematic views of FIGS. 28A, 28B, 28C, 29A, 29B, 29C, 30A, 30B, 30C, 31A, and 31B.

Further, although not illustrated, in the first manufacturing process, the stacked film 400 in which the inter-layer insulating film 401, the liner insulating film 402, and the inter-layer insulating film 403 are stacked is formed by a PCVD technique at a stage prior to the process illustrated in FIGS. 28A, 28B, 28C, 29A, 29B, 29C, 30A, 30B, 30C, 31A, and 31B.

Thereafter, in the first manufacturing process, first, a first lithography process is performed. In the first lithography process, as illustrated in FIG. 28A, the inter-layer insulating film 403 is coated with a photoresist 451, and a resist pattern for forming the wiring trench 412 is formed.

Then, a first etching process is performed. In the first etching process, as illustrated in FIG. 28B, a resist pattern is transferred onto the inter-layer insulating film 403 by dry etching using the resist pattern formed in the first lithography process of FIG. 28A as a mask. Accordingly, the wiring trench 412 is formed.

Next, a side film forming process is performed. In the side film forming process, as illustrated in FIG. 28C, the first side film 406 of Ru or the like and the second side film 407 of PSiN or the like are formed on the side surface of the trench 412.

Here, the first side film 406 such as Ru is formed on the side surface of the trench 412 by, for example, about 10 nm by a sputtering technique, the second side film 407 of PSiN or the like is then formed on the entire surface by, for example, 50 nm using a PCVD technique, the second side film 407 is left only on the side surface using dry etching, and then the first side film 406 is removed by entire surface etch back, so that the first side film 406 remains on the side surface and below the second side film 407.

Next, a second lithography process is performed. In the second lithography process, as illustrated in FIG. 29A, the inter-layer insulating film 403 and the side surfaces of the trench 412 are coated with a photoresist 452, and a resist pattern for forming the via 411 for the connection hole with the lower electrode is formed.

Then, a second etching process is performed. In the second etching process, as illustrated in FIG. 29B, the inter-layer insulating film 401 and the liner insulating film 402 are processed by dry etching using the resist pattern formed in the second lithography process of FIGS. 29A, 29B, and 29C as a mask. Thus, the via 411 for the connection hole is formed.

Next, a metallic film forming process is performed. In the metallic film forming process, the metal seed 404 and the metallic film 405 are embedded in the trench 412 formed for a wiring and the via 411 formed for the connection hole as illustrated at FIG. 29C. Here, after the metal seed 404 such as the Cu seed is formed, the metallic film 405 of copper (Cu) or the like is formed.

Further, here, the metallic film 405 of copper (Cu) or the like is formed by a plating technique after it is sputtered. Further, the metal seed 404 is a barrier metal, and for example, Ta/TaN (10/15 nm) can be used.

Next, a planarization process is performed. In the planarization process, as illustrated in FIG. 30A, an extra metal seed 404 and the metallic films 405 other than the inside of the via 411 and the trench 412 are removed using a technique such as, for example CMP. In doing so, the metal seed 404 of Ta/TaN or the like is excessively polished to be lower than the upper surface of the metallic film 405 of copper (Cu) or the like.

Next, a third lithography process is performed. In the third lithography process, as illustrated in FIG. 30B, the inter-layer insulating film 403 and the metal seed 404 are coated with a photoresist 453, and a resist pattern for processing the second side film 407 is formed.

Then, a third etching process is performed. In the third etching process, as illustrated in FIG. 30C, the second side film 407 is processed by dry etching using the resist pattern formed in the third lithography process of FIG. 30B as a mask. Accordingly, the second side film 407 of SiN or the like is removed, and the space 431 can be formed on the side surface of the metallic film 405 of copper (Cu) or the like.

Here, as illustrated in a top view of FIG. 30C, the periphery of the copper (Cu) serving as the metallic film 405 formed in the stacked film 400 is surrounded by the first side film 406 of Ru or the like, the second side film 407 of SiN or the like, the metal seed 404 of Ta/TaN or the like, but since the upper surfaces of the metal seed 404 and the second side film 407 are at the position lower than the upper surfaces of the metallic film 405 and the first side film 406, the space 431 is formed therein. For example, the upper surface of the metal seed 404 or the like can be formed to be 10 nm or more lower than the upper surface of the metallic film 405.

Next, a bonding process is performed. In the bonding process, as illustrated in FIG. 31A, the first bonding surface 11S of the first substrate 11 and the second bonding surface 21S of the second substrate 21 are bonded to each other.

Figures 31A, 31B:
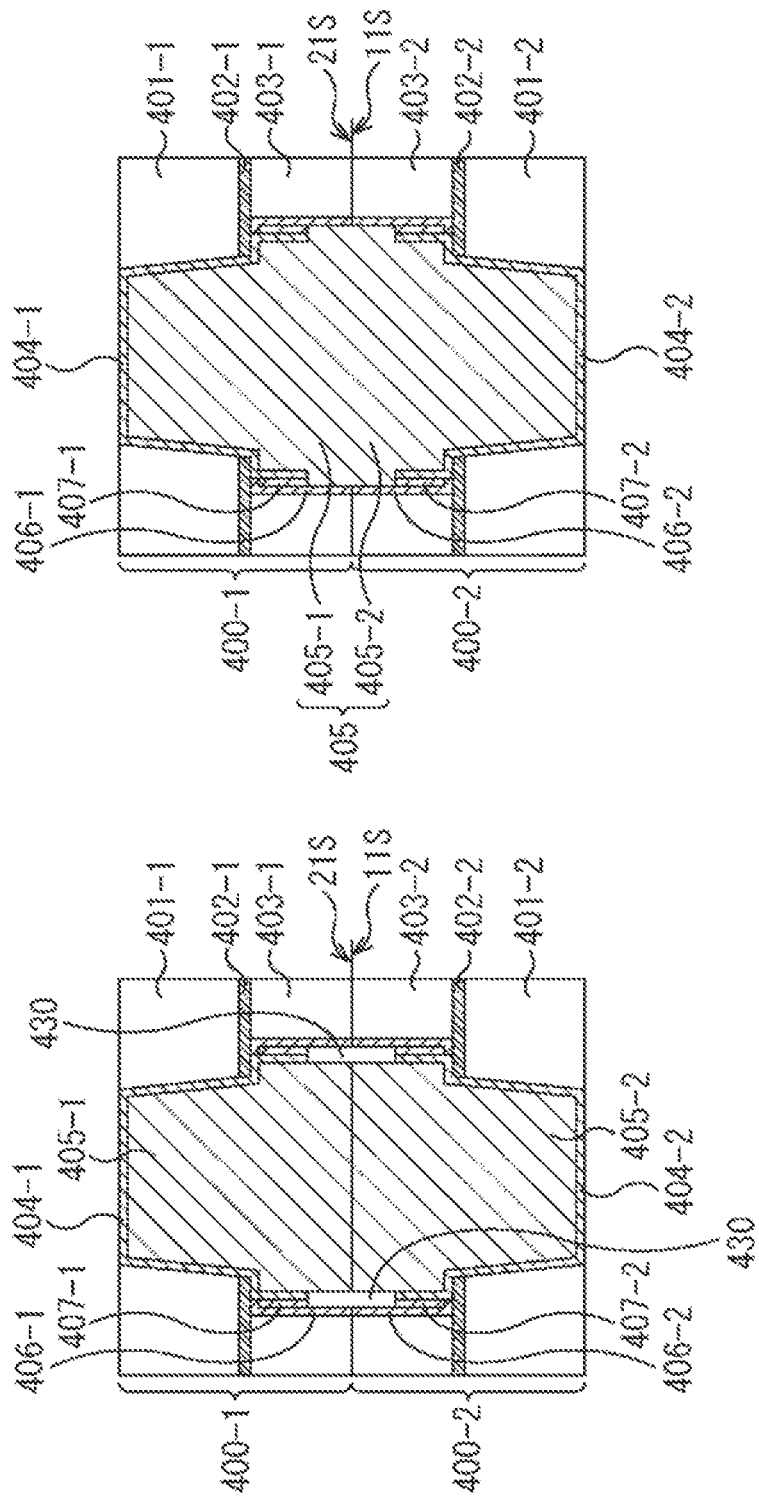
FIGS. 31A and 31B are views illustrating a flow of the first manufacturing process of the solid-state imaging device of the fourth embodiment.

Then, in the bonding process, as the first bonding surface 11S and the second bonding surface 21S are bonded to each other, the space 430 is formed due to the space 431-1 formed on the first bonding surface 11S side and the space 431-2 formed on the second bonding surface 21S side as illustrated by FIG. 31A.

Next, a thermal treatment process is performed. In the thermal treatment process, the thermal treatment is performed on the first substrate 11 and the second substrate 21 bonded in the bonding process FIG. 31A. As a condition of the thermal treatment, for example, it can be performed at several hundred □C for several hours.

Here, as illustrated in FIG. 31A, in the structure at the time of bonding, the space 430 are formed due to the space 431-1 formed on the first bonding surface 11S side and the space 431-2 formed on the second bonding surface 21S side. Therefore, at the time of thermal treatment, the copper (Cu) serving as the metallic films 405-1 and 405-2 expands and enters the space 430 as illustrated in FIG. 31B, so that stress is relieved.

In other words, if the thermal treatment (annealing) is performed after the bonding, an increase in volume caused by thermal expansion of the copper (Cu) moves to the space 430, so that Cu pumping does not occur, and an excellent bonding characteristic is obtained. Accordingly, it is possible to suppress a decrease in bonding strength and prevent poor electrical connection or peeling.

The first manufacturing process is performed as described above.

Further, in the first manufacturing process, when the space 431 (the spaces 431-1 and 431-2) is formed in the side surface of the metallic film 405 of copper (Cu) or the like, a part of the metal seed 404 of Ta/TaN or the second side film 407 of SiN remains, but the whole of the metal seed 404 of Ta/TaN or the second side film 407 of SiN may be removed depending on the condition of the thermal treatment. In that case, the space 431 can be expanded.

Further, in the first manufacturing process, the metal seed 404 of Ta/TaN or the like is removed by excessive polishing in the planarization process of FIG. 30A, but the metal seed 404 may be etched and processed in the third etching process of FIG. 30C in a state in which there is no groove of the metal seed 404 of Ta/TaN or the like without performing the process.

(Second Structure of Bonding Portion)

FIGS. 32A and 32B are main part cross-sectional views illustrating a second structure of the solid-state imaging device of the fourth embodiment. A detailed configuration of the solid-state imaging device 1 of the fourth embodiment will be described with reference to the main part cross-sectional view. Further, FIG. 32A is a cross-sectional view before bonding, and FIG. 32B is a cross-sectional view after bonding.

As illustrated in FIG. 32A, stacked films such as a stacked film 400a and stacked film 400b are formed in the first substrate 11 and the second substrate 21, respectively. Further, an inter-layer insulating film 401, a liner insulating film 402, and an inter-layer insulating film 403 are stacked in the stacked film 400a. As the inter-layer insulating film 401 and the inter-layer insulating film 403, for example, a PSiO film can be used. Further, as the liner insulating film 402, for example, a SiC film can be used.

In the stacked film 400a, a via 411 for a connection hole with a lower electrode and a wiring trench 412 are formed, and a metallic film 405 of copper (Cu) or the like is embedded in the via 411 and the trench 412. Further, here, as an example, a case in which copper (Cu) is used as the metallic film 405 will be described. Further, in the stacked film 400a, a metal seed 404 is formed between the via 411 and the trench 412 and the metallic film 405.

Here, in the stacked film 400a, a groove pattern including a fine concavo-convex portion is formed on the upper surface of the inter-layer insulating film 401, and a fine concavo-convex portion is formed on the bottom of the wiring trench 412 accordingly. Therefore, due to the concavo-convex portion, the metallic film 405 of copper (Cu) or the like is not completely embedded when the metallic film is formed, and the space 430 is formed therein.

Therefore, if the first substrate 11 with the space 430 formed therein and the second substrate 21 with the space 430 formed therein are bonded to each other, and the first bonding surface 11S and the second bonding surface 21S are bonded to each other, a structure illustrated in FIG. 32B is obtained.

In other words, as illustrated in FIG. 32B, at the time of bonding, on the first bonding surface 11S side of the first substrate 11, the fine concavo-convex portion is formed on the bottom of the wiring trench 412-1, and thus the space 430-1 is formed there. On the other hand, on the second bonding surface 21S side of the second substrate 21, the fine concavo-convex portion is formed on the bottom of the wiring trench 412-2, and thus the space 430-2 is formed therein.

As described above, as the spaces 430-1 and 430-2 in which there is no copper (Cu) serving as the metallic films 405-1 and 405-2 are formed at the time of bonding, at the time of thermal treatment after bonding, the expanded copper Cu) enters the spaces 430-1 and 430-2, so that stress is relieved. Accordingly, it is possible to suppress a decrease in bonding strength and prevent poor electrical connection or peeling.

(Second Manufacturing Process)

Next, a flow of a second manufacturing process of the solid-state imaging device of the fourth embodiment will be described with reference to schematic views of FIGS. 33A, 33B, 33C, 34A, 34B, and 34C.

Further, although not illustrated, in the second manufacturing process, the inter-layer insulating film 401 is formed on the stacked film 400b including the lower electrode at a stage prior to the process illustrated in FIGS. 33A, 33B, 33C, 34A, 34B, and 34C.

Thereafter, in the second manufacturing process, first, a first lithography process is performed. In the first lithography process, as illustrated in FIG. 33A, the inter-layer insulating film 401 is coated with a photoresist 454, a resist pattern for forming the groove pattern including the fine concavo-convex portion is formed.

Then, a first etching process is performed. In the first etching process, as illustrated in FIG. 33B, the inter-layer insulating film 401 is processed using the resist pattern formed in the first lithography process of FIG. 33A as a mask until the resist mask is completely removed, and thus a shoulder of the resist pattern transferred onto the inter-layer insulating film 401 falls, and then the liner insulating film 402 is formed by the PCVD technique.

Next, a stacked film forming process is performed. In the stacked film forming process, as illustrated in FIG. 33C, the inter-layer insulating film 403 is formed on the stacked film by a PCVD technique. Further, at this time, a planarization process using a technique such as CMP is performed, and the upper surface of the inter-layer insulating film 403 is planarized.

Next, a second lithography process and a second etching process are performed. Although not illustrated, in the second lithography process, a photoresist is applied, and a resist pattern for forming the wiring trench 412 is formed. Then, in the second etching process, dry etching is performed using the resist pattern as a mask, and thus the wiring trench 412 is formed in the inter-layer insulating film 403 as illustrated in FIG. 34A.

Further, in the second lithography process, a photoresist is coated, and a resist pattern for forming the via 411 for the connection hole with the lower electrode is formed. Then, in the second etching process, dry etching is performed using the resist pattern as a mask, so that the via 411 for the connection hole is formed in the inter-layer insulating film 401 as illustrated in FIG. 34A.

Here, as illustrated in the top view of FIG. 34A, a groove pattern 432 including the fine concavo-convex portion is formed on the upper surface of the inter-layer insulating film 401 in which the via 411 for the connection hole is formed.

Next, a metallic film forming process is performed. In the metallic film forming process, the metal seed 404 and the metallic film 405 are embedded in the wiring trench 412 and the via 411 for the connection hole as illustrated in FIG. 34B. Further, here, after the metal seed 404 such as the Cu seed is formed, a metallic film 405 of copper (Cu) or the like is formed.

Further, as the groove pattern 432 is formed on the upper surface of the inter-layer insulating film 401, the fine concavo-convex portion is formed on the bottom of the wiring trench 412. Therefore, the metallic film 405 is not completely embedded due to the concavo-convex portion when the metallic film is formed, and the space 430 is formed therein.

Next, a bonding process is performed. In the bonding process, as illustrated in FIG. 34C, the first bonding surface 11S of the first substrate 11 and the second bonding surface 21S of the second substrate 21 are bonded to each other.

Then, as the first bonding surface 11S and the second bonding surface 21S are bonded to each other in the bonding process, the space 430-1 is formed on the first bonding surface 11S side as illustrated by FIG. 34C, and the space 430-2 is formed on the second bonding surface 21S side.

Next, a thermal treatment process is performed. In the thermal treatment process, the thermal treatment is performed on the first substrate 11 and the second substrate 21 bonded in the bonding process of F in FIG. As a condition of the thermal treatment, for example, it can be performed at several hundred ° C. for several hours.

As illustrated in FIG. 34C, in the structure at the time of bonding, the space 430-1 is formed on the first bonding surface 11S side, and the space 430-2 is formed on the second bonding surface 21S side. Therefore, at the time of thermal treatment, on the first bonding surface 11S side, the copper (Cu) serving as the metallic film 405-1 expands and enters the space 430-1, so that stress is relieved. On the other hand, on the second bonding surface 21S side, the copper (Cu) serving as the metallic film 405-2 expands and enters the space 430-2, so that stress is relieved.

In other words, since the first substrate 11 with the electrode structure having the space 430-1 formed therein and the second substrate 21 with the electrode structure having the space 430-2 formed therein are bonded, although the copper (Cu) expands in the thermal treatment after bonding, the Cu pumping is suppressed since the spaces 430-1 and 430-2 are formed on the bottom of the wiring, and thus an excellent bonding characteristic can be obtained. Accordingly, it is possible to suppress a decrease in bonding strength and prevent poor electrical connection or peeling.

The second manufacturing process is performed as described above.

(Third Structure of Bonding Portion)

FIGS. 35A and 35B are main part cross-sectional views illustrating a third structure of the solid-state imaging device of the fourth embodiment. A detailed configuration of the solid-state imaging device 1 of the fourth embodiment will be described with reference to the main part cross-sectional view. Further, FIG. 35A is a cross-sectional view before bonding, and FIG. 35B is a cross-sectional view after bonding.

As illustrated in FIG. 35A, the stacked films such as the stacked film 400a and the stacked film 400b are formed in the first substrate 11 and the second substrate 21, respectively. Further, the inter-layer insulating film 401 is stacked on the stacked film 400a. As the inter-layer insulating film 401, for example, a PSiO film can be used.

In the stacked film 400a, the via 411 for the connection hole with the lower electrode and the wiring trench 412 are formed, and the metallic film 405a of copper (Cu) or the like is embedded in the via 411 and the trench 412. Further, here, a case in which copper (Cu) is used as the metallic film 405a will be described as an example.

Further, in the stacked film 400a, the metal seed 404a is formed between the via 411 and the trench 412 and the metallic film 405a. Further, in the stacked film 400b, the metallic film 405b and the metal seed 404b are formed, and the lower electrode is formed.

Here, in the stacked film 400a, since the bottom of the via 411 for the connection hole is formed in a wine glass shape, the metallic film 405a of copper (Cu) or the like does not enter the metallic film when the metallic film is formed, and the space 430 is formed.

Therefore, if the first substrate 11 with the space 430 formed therein and the second substrate 21 with the space 430 formed therein are bonded to each other, and the first bonding surface 11S and the second bonding surface 21S are bonded to each other, a structure illustrated in FIG. 35B is obtained.

In other words, as illustrated in FIG. 35B, at the time of bonding, on the first bonding surface 11S side of the first substrate 11, the bottom of the via 411-1 for the connection hole is formed in a wine glass shape, and thus the space 430-1 is formed therein. On the other hand, on the second bonding surface 21S side of the second substrate 21, the bottom of the via 411-2 for the connection hole is formed in a wine glass shape, and thus the space 430-2 is formed therein.

As described above, as the spaces 430-1 and 430-2 in which there is no copper (Cu) serving as the metallic films 405-1 and 405-2 are formed at the time of bonding, at the time of thermal treatment after bonding, the expanded copper Cu) enters the spaces 430-1 and 430-2, so that stress is relieved. Accordingly, it is possible to suppress a decrease in bonding strength and prevent poor electrical connection or peeling.

(Third Manufacturing Process)

Next, a flow of a third manufacturing process of the solid-state imaging device of the fourth embodiment will be described with reference to the schematic views of FIGS. 36A, 36B, 36C, 37A, 37B, and 37C.

Further, although not illustrated, in the third manufacturing process, the inter-layer insulating film 401 is formed on the stacked film 400b including the lower electrode at a stage prior to the process illustrated in FIGS. 36A, 36B, 36C, 37A, 37B, and 37C. Further, in the inter-layer insulating film 401, the wiring trench 412 is formed in a first lithography process and a first etching process.

Thereafter, in the third manufacturing process, first, a second lithography process is performed. In the second lithography process, as illustrated in FIG. 36A, the inter-layer insulating film 401 is coated with a photoresist 455, and a resist pattern for forming the via 411 for the connection hole with the lower electrode is formed.

Then, a second etching process is performed. In the second etching process, as illustrated in FIG. 36B, dry etching is performed using the resist pattern formed in the second lithography process of FIG. 36A as a mask, so that the via 411 for the connection hole is formed on the inter-layer insulating film 401.

At this time, as excessive over etching is performed, electrons are charged on the resist side surface, and thus here, the bottom of the via 411 for the connection hole is formed in a wine glass shape using an electronic shading effect that the trajectory of ions bends. Therefore, a convex portion 433 is formed on the bottom of the via 411.

Next, a metallic film forming process is performed. In the metallic film forming process, the metal seed 404a and the metallic film 405a are embedded in the wiring trench 412 and the via 411 for the connection hole as illustrated in FIG. 36C. Further, here, after the metal seed 404a such as the Cu seed is formed, the metallic film 405a of copper (Cu) or the like is formed.

Next, a planarization process is performed. In the planarization process, as illustrated in FIG. 37A, the extra metal seed 404a and the metallic film 405a other than the via 411 and the trench 412 are removed using a technique such as, for example, CMP. At that time, since the bottom of the via 411 for the connection hole is formed in a wine glass shape, and the convex portion 433 is formed, the metallic film 405a of copper (Cu) or the like does not enter it, and the space 430 can be formed.

Next, a bonding process is performed. In the bonding process, as illustrated in FIG. 37B, the first bonding surface 11S of the first substrate 11 and the second bonding surface 21S of the second substrate 21 are bonded to each other.

Further, in the bonding process, the space 430-1 is formed on the first bonding surface 11S side, and the space 430-2 is formed on the second bonding surface 21S side as illustrated in FIG. 37B.

Next, a thermal treatment process is performed. In the thermal treatment process, the thermal treatment is performed on the first substrate 11 and the second substrate 21 bonded in the bonding process of FIG. 37B. As a condition of the thermal treatment, for example, it can be performed at several hundred □C for several hours.

Here, as illustrated in FIG. 37B, in the structure at the time of bonding, the space 430-1 is formed on the first bonding surface 11S side, and the space 430-2 is formed on the second bonding surface 21S side. Therefore, as illustrated in FIG. 37C, at the time of thermal treatment, on the first bonding surface 11S side, the copper (Cu) serving as the metallic film 405a-1 expands and enters the space 430-1, so that stress is relieved. On the other hand, on the second bonding surface 21S side, the copper (Cu) serving as the metallic film 405a-2 also expands and enters the space 430-2, so that stress is relieved.

In other words, as the first substrate 11 with the electrode structure having the space 430-1 formed therein and the second substrate 21 with the electrode structure having the space 430-2 formed therein are bonded to each other, although the copper (Cu) expands in the thermal treatment after bonding, the Cu pumping is suppressed due to the spaces 430-1 and 430-2 on the bottom of the wiring, so that an excellent bonding characteristic can be obtained. Accordingly, it is possible to suppress a decrease in bonding strength and prevent poor electrical connection or peeling.

The third manufacturing process is performed as described above.

The fourth embodiment has been described above.

6. Configuration Example of Electronic Device

The solid-state imaging device 1 serving as the above-described semiconductor device can be applied to an electronic device such as a camera system such as a digital camera or a video camera, a mobile phone with an imaging function, or other devices with an imaging function.

Figure 38:
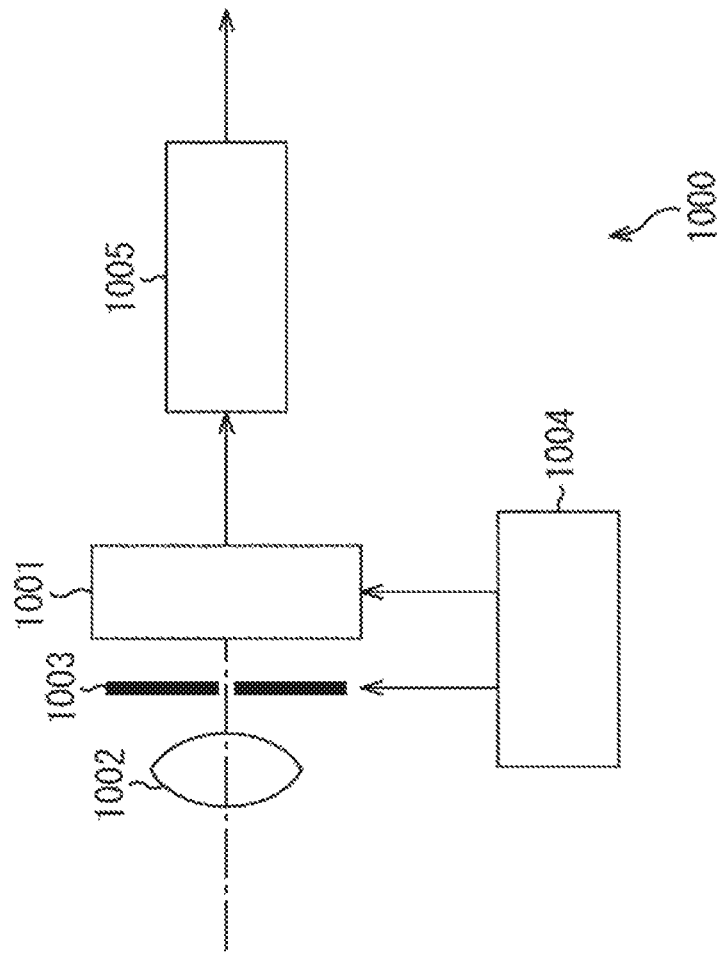
FIG. 38 is a view illustrating a configuration example of an electronic device using a solid-state imaging device to which the present technology is applied.

FIG. 38 is a view illustrating a configuration example of an electronic device using the solid-state imaging device to which the present technology is applied. FIG. 38 illustrates a configuration example of an imaging device 1000 serving as a video camera capable of taking still images or moving images as an example of such an electronic device.

In FIG. 38, the imaging device 1000 includes a solid-state imaging device 1001, an optical system 1002 that guides incident light to a light receiving sensor unit of the solid-state imaging device 1001, a shutter device 1003, a drive circuit 1004 that drives the solid-state imaging device 1001, and a signal processing circuit 1005 that processes an output signal of the solid-state imaging device 1001.

The solid-state imaging device 1 (FIG. 1) described above is applied as the solid-state imaging device 1001. The optical system (optical lens) 1002 causes an image light (incident light) from a subject to be formed on an imaging plane of the solid-state imaging device 1001. Accordingly, signal charges are accumulated in the solid-state imaging device 1001 for a certain period. The optical system 1002 may be an optical lens system including a plurality of optical lenses.

The shutter device 1003 controls a light irradiation period and a light shielding period for the solid-state imaging device 1001. The drive circuit 1004 supplies a drive signal to the solid-state imaging device 1001 and the shutter device 1003, and controls a signal output operation of the solid-state imaging device 1001 to the signal processing circuit 1005 and a shutter operation of the shutter device 1003 in accordance with the supplied drive signal (timing signal). In other words, the drive circuit 1004 performs a signal transfer operation from the solid-state imaging device 1001 to the signal processing circuit 1005 through the supply of the drive signal (timing signal).

The signal processing circuit 1005 performs various kinds of signal processing on the signal transferred from the solid-state imaging device 1001. For example, the video signal obtained by the signal processing is stored in a storage medium such as a memory at a subsequent stage or output to a monitor.

According to the electronic device using the solid-state imaging device to which the present technology is applied, the solid-state imaging device 1 capable of suppressing a decrease in bonding strength and preventing poor electrical connection or peeling when the two substrates are stacked and bonded to each other can be used as the solid-state imaging device 1001.

7. Application Example

The technology according to the present disclosure can be applied to various products. For example, the technology according to an embodiment of the present disclosure may be applied to a patient in-vivo information acquisition system using a capsule type endoscope.

Figure 39:
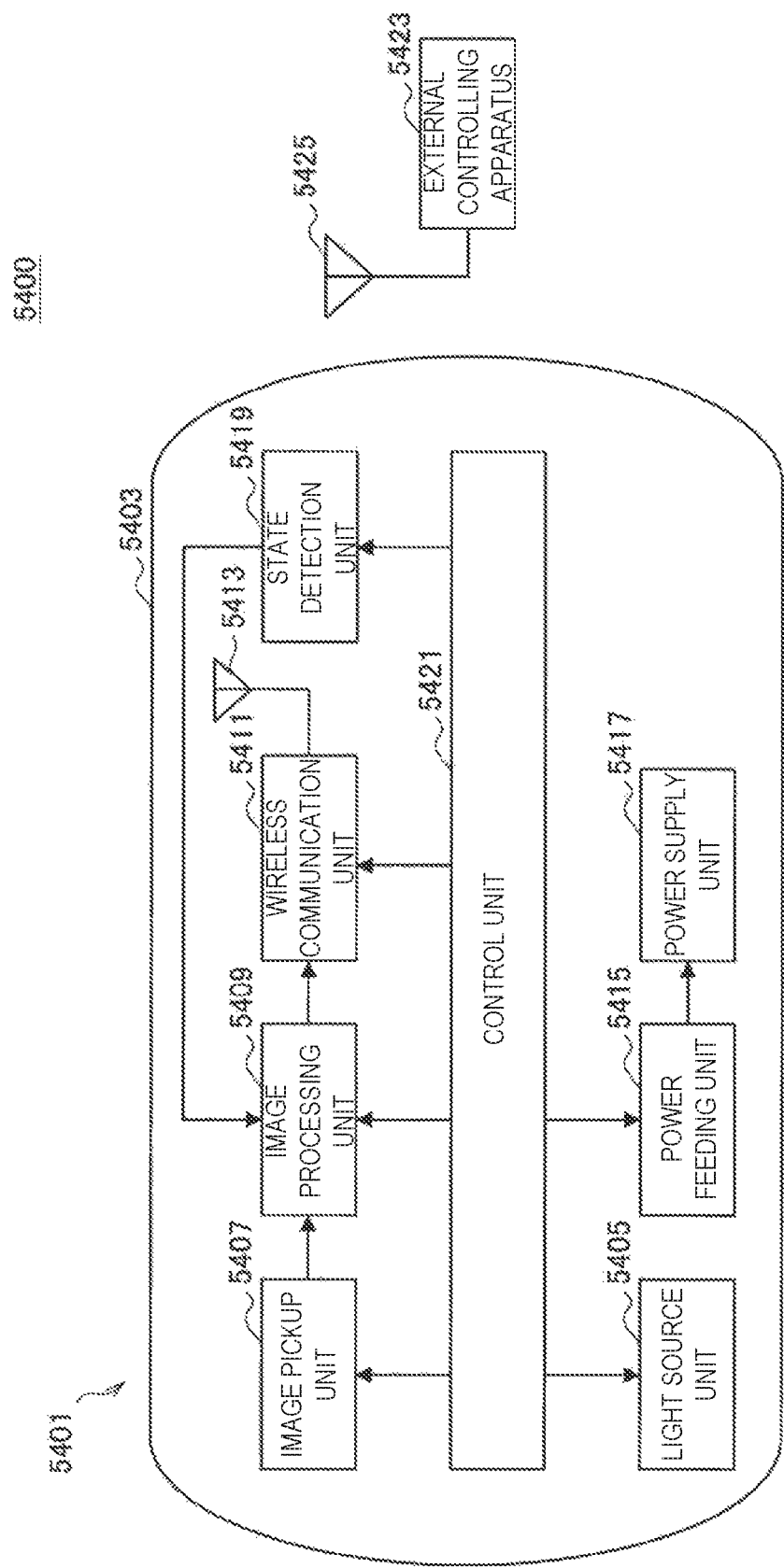
FIG. 39 is a block diagram depicting an example of a schematic configuration of an in-vivo information acquisition system.

FIG. 39 is a view depicting an example of a schematic configuration of an in-vivo information acquisition system 5400 to which the technology according to an embodiment of the present disclosure can be applied. Referring to FIG. 39, the in-vivo information acquisition system 5400 includes a capsule type endoscope 5401, and an external controlling apparatus 5423 which integrally controls operation of the in-vivo information acquisition system 5400. Upon inspection, the capsule type endoscope 5401 is swallowed by a patient. The capsule type endoscope 5401 has an image pickup function and a wireless communication function. For a period of time before the capsule type endoscope 5401 is discharged naturally from the patient, while it moves in the inside of an organ such as the stomach or the intestines by peristaltic motion, it successively picks up an image in the inside of each organ (hereinafter referred to as in-vivo image) at predetermined intervals and successively transmits information of the in-vivo images in wireless fashion to the external controlling apparatus 5423 located outside the body. The external controlling apparatus 5423 generates image data for displaying the in-vivo images on a display apparatus (not depicted) on the basis of the information of the received in-vivo images. In this manner, in the in-vivo information acquisition system 5400, a picked up image illustrating a state of the inside of the body of the patient can be obtained at any time after the capsule type endoscope 5401 is swallowed until it is discharged.

A configuration and functions of the capsule type endoscope 5401 and the external controlling apparatus 5423 are described in more detail. As depicted, the capsule type endoscope 5401 has functions of a light source unit 5405, an image pickup unit 5407, an image processing unit 5409, a wireless communication unit 5411, a power feeding unit 5415, a power supply unit 5417, a state detection unit 5419 and a control unit 5421 incorporated in a housing 5403 of the capsule type.

The light source unit 5405 includes a light source such as, for example, a light emitting diode (LED) and irradiates light upon an image pickup field of view of the image pickup unit 5407.

The image pickup unit 5407 includes an image pickup element and an optical system formed from a plurality of lenses provided at a preceding stage to the image pickup element. Reflected light (hereinafter referred to as observation light) of light irradiated upon a body tissue which is an observation target is condensed by the optical system and enters the image pickup element. The image pickup element receives and photoelectrically converts the observation light to generate an electric signal corresponding to the observation light, namely, an image signal corresponding to an observation image. The image signal generated by the image pickup unit 5407 is provided to the image processing unit 5409. It is to be noted that, as the image pickup element of the image pickup unit 5407, various known image pickup elements such as a complementary metal oxide semiconductor (CMOS) image sensor or a charge coupled device (CCD) image sensor may be used.

The image processing unit 5409 includes a processor such as a central processing unit (CPU) or a graphics processing unit (GPU) and performs various signal processes for an image signal generated by the image pickup unit 5407. The signal processes may be minimal processes for transmitting an image signal to the external controlling apparatus 5423 (for example, compression of image data, conversion of the frame rate, conversion of the data rate, and/or conversion of the format). Since the image processing unit 5409 is configured so as to perform only the minimal processes, the image processing unit 5409 can be implemented in a smaller size with lower power consumption. Therefore, the image processing unit 5409 is suitable for the capsule type endoscope 5401. However, if the space in the housing 5403 or the power consumption affords, then the image processing unit 5409 may perform a further signal process (for example, a noise removal process or some other image quality improving process). The image processing unit 5409 provides an image signal, for which the signal processes have been performed, as RAW data to the wireless communication unit 5411. It is to be noted that, when information regarding a state (motion, posture or the like) of the capsule type endoscope 5401 is acquired by the state detection unit 5419, the image processing unit 5409 may provide an image signal in a tied manner with the information to the wireless communication unit 5411. This makes it possible to associate the position inside the body at which an image is picked up, an image pickup direction of the image or the like with the picked up image.

The wireless communication unit 5411 includes a communication apparatus which can transmit and receive various kinds of information to and from the external controlling apparatus 5423. The communication apparatus includes an antenna 5413, a processing circuit which performs a modulation process and so forth for transmission and reception of a signal, and so forth. The wireless communication unit 5411 performs a predetermined process such as a modulation process for an image signal for which the signal processes have been performed by the image processing unit 5409, and transmits the resulting image signal to the external controlling apparatus 5423 through the antenna 5413. Further, the wireless communication unit 5411 receives a control signal relating to driving control of the capsule type endoscope 5401 from the external controlling apparatus 5423 through the antenna 5413. The wireless communication unit 5411 provides the received control signal to the control unit 5421.

The power feeding unit 5415 includes an antenna coil for power reception, a power regeneration circuit for regenerating electric power from electric current generated in the antenna coil, a voltage booster circuit and so forth. The power feeding unit 5415 generates electric power using the principle of non-contact charging. Specifically, if a magnetic field (electromagnetic wave) of a predetermined frequency is provided from the outside to the antenna coil of the power feeding unit 5415, then induced electromotive force is generated in the antenna coil. The electromagnetic wave may be a carrier transmitted from the external controlling apparatus 5423 through an antenna 5425. Electric power is regenerated from the induced electromotive force by the power regeneration circuit, and the potential of the electric power is suitably adjusted by the voltage booster circuit to generate electric power for charging. The electric power generated by the power feeding unit 5415 is stored into the power supply unit 5417.

The power supply unit 5417 includes a secondary battery and stores electric power generated by the power feeding unit 5415. In FIG. 39, in order to avoid complicated illustration, an arrow mark indicative of a supplying destination of electric power from the power supply unit 5417 and so forth are not depicted. However, electric power stored in the power supply unit 5417 is supplied to the light source unit 5405, the image pickup unit 5407, the image processing unit 5409, the wireless communication unit 5411, the state detection unit 5419 and the control unit 5421 and can be used for driving of them.

The state detection unit 5419 includes a sensor for detecting a state of the capsule type endoscope 5401 such as an acceleration sensor and/or a gyro sensor. The state detection unit 5419 can acquire information relating to a state of the capsule type endoscope 5401 from a result of detection by the sensor. The state detection unit 5419 provides the acquired information regarding a state of the capsule type endoscope 5401 to the image processing unit 5409. The image processing unit 5409 can tie the information regarding a state of the capsule type endoscope 5401 with an image signal as described hereinabove.

The control unit 5421 includes a processor such as a CPU and operates in accordance with a predetermined program to integrally control operation of the capsule type endoscope 5401. The control unit 5421 suitably controls driving of the light source unit 5405, the image pickup unit 5407, the image processing unit 5409, the wireless communication unit 5411, the power feeding unit 5415, the power supply unit 5417 and the state detection unit 5419 in accordance with a control signal transmitted thereto from the external controlling apparatus 5423 to implement such functions of the components as described above.

The external controlling apparatus 5423 may be a processor such as a CPU or a GPU, a microcomputer or a control board in which a processor and a storage element such as a memory are mixedly incorporated. The external controlling apparatus 5423 is configured such that it has an antenna 5425 and can transmit and receive various kinds of information to and from the capsule type endoscope 5401 through the antenna 5425. Specifically, the external controlling apparatus 5423 transmits a control signal to the control unit 5421 of the capsule type endoscope 5401 to control operation of the capsule type endoscope 5401. For example, an irradiation condition of light upon an observation target of the light source unit 5405 can be changed in accordance with a control signal from the external controlling apparatus 5423. Further, an image pickup condition (for example, a frame rate, an exposure value or the like of the image pickup unit 5407) can be changed in accordance with a control signal from the external controlling apparatus 5423. Further, the substance of processing by the image processing unit 5409 or a condition for transmitting an image signal from the wireless communication unit 5411 (for example, a transmission interval, a transmission image number or the like) may be changed in accordance with a control signal from the external controlling apparatus 5423.

Further, the external controlling apparatus 5423 performs various image processes for an image signal transmitted from the capsule type endoscope 5401 to generate image data for displaying a picked up in-vivo image on the display apparatus. As the image processes, various known signal processes may be performed such as, for example, a development process (demosaic process), an image quality improving process (bandwidth enhancement process, super-resolution process, noise reduction (NR) process, and/or image stabilization process) and/or an enlargement process (electronic zoom process) or the like. The external controlling apparatus 5423 controls driving of the display apparatus (not depicted) to cause the display apparatus to display a picked up in-vivo image on the basis of generated image data. Alternatively, the external controlling apparatus 5423 may control a recording apparatus (not depicted) to record generated image data or control a printing apparatus (not depicted) to output generated image data by printing.

The example of the in-vivo information acquisition system 5400 to which the technology according to the present disclosure can be applied has been described above. Among the components described above, the solid-state imaging device 1 can be used as the image pickup element of the image pickup unit 5407. According to the solid-state imaging device 1, it is possible to suppress a decrease in bonding strength and prevent poor electrical connection or peeling when the two substrates are stacked and bonded to each other.

The technology according to the present disclosure can be applied to various products. For example, the technology according to the present disclosure is implemented as apparatuses mounted on any type of mobile bodies such as automobiles, electric vehicles, hybrid electric vehicles, motorcycles, bicycles, personal mobilities, airplanes, drones, ships, robots, construction machines, and agricultural machines (tractors).

Figure 40:
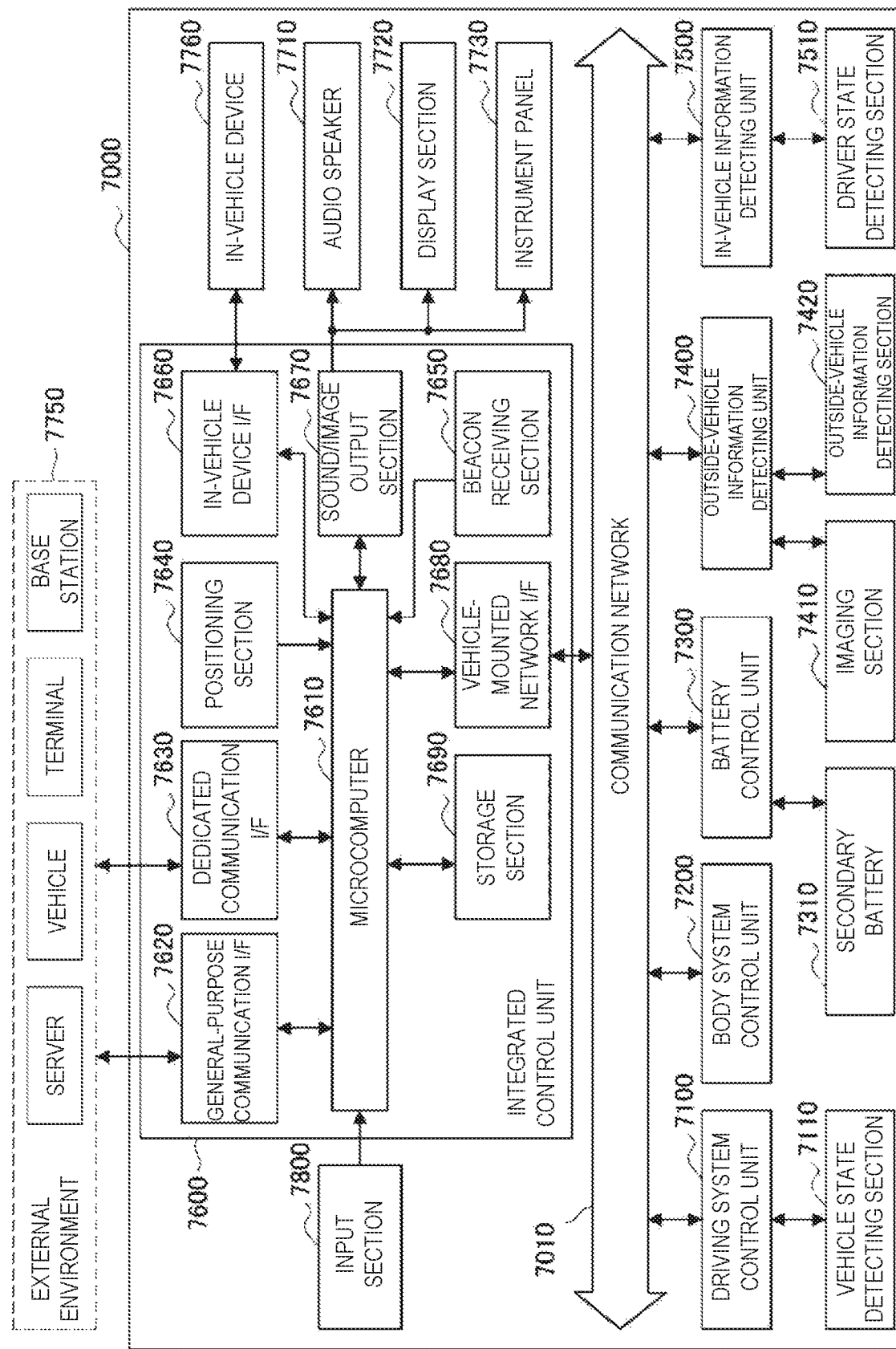
FIG. 40 is a block diagram depicting an example of schematic configuration of a vehicle control system.

FIG. 40 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 40, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay, or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 40 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 41:
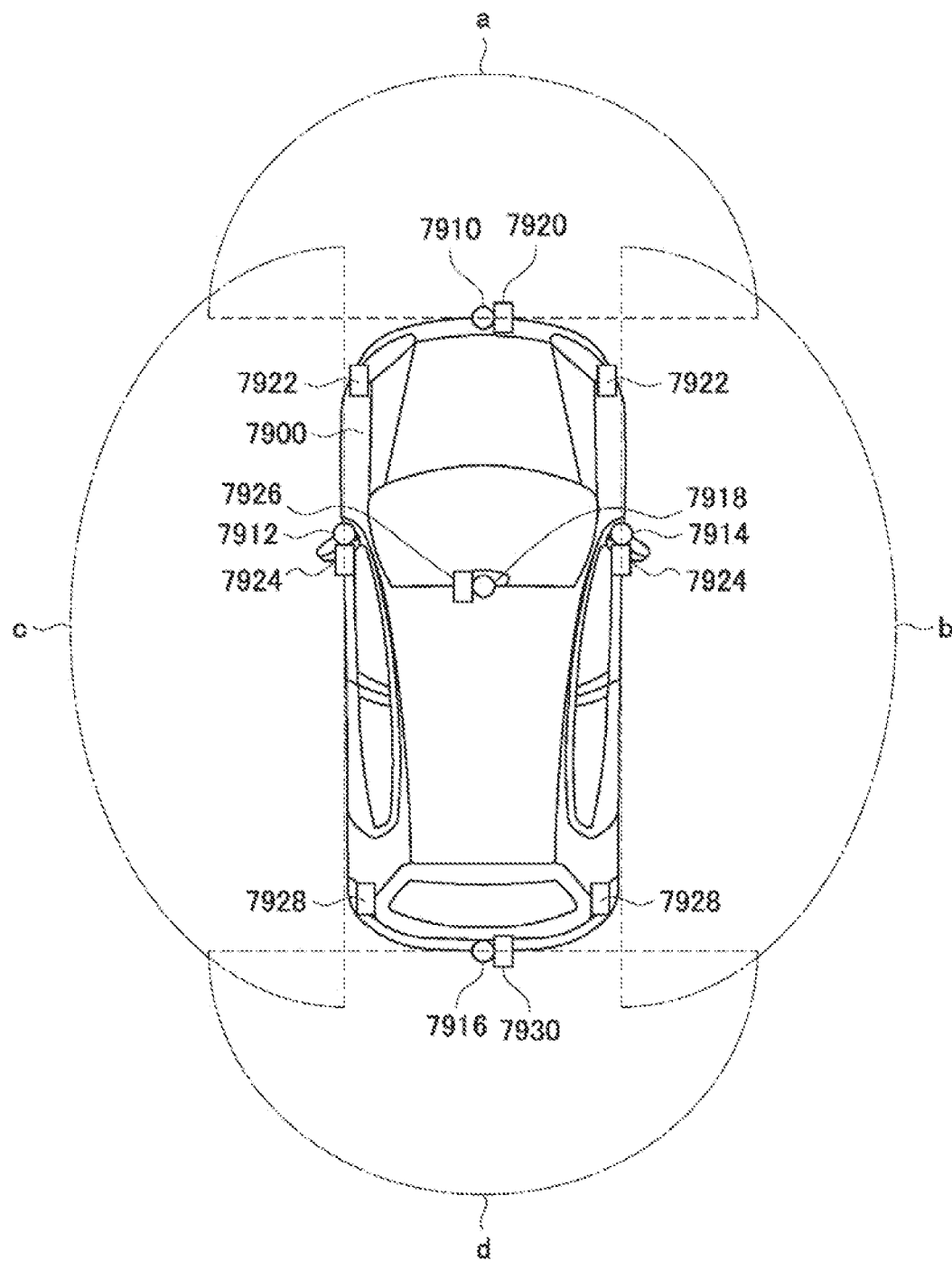
FIG. 41 is a diagram of assistance in explaining an example of installation positions of an outside-vehicle information detecting section and an imaging section.

FIG. 41 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 41 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 40, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM), worldwide interoperability for microwave access (WiMAX), long term evolution (LTE)), LTE-advanced (LTE-A), or the like, or another wireless communication protocol such as wireless LAN (referred to also as wireless fidelity (Wi-Fi), Bluetooth, or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 40, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 40 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the vehicle control system 7000 described above, the solid-state imaging device 1 can be used as the image pickup element of the image pickup unit 7410. According to the solid-state imaging device 1, it is possible to suppress a decrease in bonding strength and prevent poor electrical connection or peeling when the two substrates are stacked and bonded to each other.

Additionally, the present technology may also be configured as below.

(1)

A semiconductor device, including:

a first substrate including a first electrode including a metal; and a second substrate bonded to the first substrate and including a second electrode including a metal, in which an acute-angled concavo-convex portion is formed on a side surface of a groove in which the first electrode is formed and a side surface of a groove in which the second electrode metal-bonded to the first electrode is formed.

(2)

The semiconductor device according to (1), in which side roughness is formed in a part of the side surface of the groove, and a metal seed corresponding to a shape of the groove, part of which has the side roughness, is formed between the groove and the metal.

(3)

The semiconductor device according to (1), in which a part of the side surface of the groove has an acute-angled concavo-convex shape, and a metal seed corresponding to the shape of the groove is formed between the groove and the metal.

(4)

A semiconductor device manufacturing method, including:

forming side roughness in a part of a side surface of a groove in which an electrode including a metal is formed;

forming a metal seed corresponding to a shape of the groove, part of which has the side roughness, in the groove;

forming the metal in the groove in which the metal seed is formed, by metal plating growth; and bonding a first substrate including the electrode and a second substrate including the electrode to each other, in which, when thermal treatment is performed on the first substrate and the second substrate, the expanded metal enters a space which is formed by insufficient metal plating by the metal seed corresponding to the side roughness in the metal plating growth.

(5)

A semiconductor device manufacturing method, including:

forming an acute-angled concavo-convex shape in a part of a side surface of a groove in which an electrode including a metal is formed;

forming a metal seed corresponding to a shape of the groove in the groove;

forming the metal in the groove in which the metal seed is formed, by metal plating growth; and bonding a first substrate including the electrode and a second substrate including the electrode to each other, in which, when thermal treatment is performed on the first substrate and the second substrate, the expanded metal enters a space which is formed by insufficient metal plating by the metal seed corresponding to the concavo-convex shape in the metal plating growth.

(6)

A semiconductor device, including:

a first substrate including a first electrode including a metal; and a second substrate bonded to the first substrate and including a second electrode including a metal, in which a dent is formed in a part of a surface of a metal of a bonding surface of at least one of the first substrate or the second substrate.

(7)

The semiconductor device according to (6), in which a dense pattern which is a dense metal pattern is formed on an outer circumferential portion of at least one of the first electrode or the second electrode, and the dent is formed on a surface of the dense pattern due to occurrence of erosion during planarization by chemical mechanical polishing (CMP).

(8)

The semiconductor device according to (7), in which a size and a shape of the dent formed due to the occurrence of the erosion are adjusted in accordance with a density, a width, and an arrangement of the dense pattern.

(9)

A semiconductor device manufacturing method, including:

planarizing, by CMP, an upper surface of a stacked film in which an electrode including a metal and a dense pattern which is a metal pattern dense in an outer circumferential portion of the electrode are formed; and bonding a first substrate including the electrode and a second substrate including the electrode to each other, in which, when thermal treatment is performed on the first substrate and the second substrate, the expanded metal enters a space formed by a dent formed by occurrence of erosion during the planarization by the CMP.

(10)

A semiconductor device, including:

a first substrate including a first electrode including a metal; and a second substrate bonded to the first substrate and including a second electrode including a metal, in which a shape of the electrode is deformed so that surface areas of the first electrode and the second electrode are enlarged.

(11)

The semiconductor device according to (10), in which, in the first substrate, the first electrode is formed in a first stacked film, a cross-sectional area of the first electrode in a direction parallel to a bonding surface of the first substrate is constant, in the second substrate, the second electrode is formed in a second stacked film, and a cross-sectional area of the second electrode in a direction parallel to a bonding surface of the second substrate is constant.

(12)

The semiconductor device according to (10) or (11), in which a cross section of the first electrode includes one or more concave or convex portions, and a cross section of the second electrode includes one or more concave or convex portions.

(13)

The semiconductor device according to (12), in which a material of a lower coefficient of thermal expansion than a material used in the concave portion is used in a region which is in contact with the concave portion.

(14)

A semiconductor device manufacturing method, including:

deforming a shape of an electrode including a metal so that a surface area of the electrode is enlarged when the electrode is formed in a stacked film; and bonding a first substrate including the electrode and a second substrate including the electrode to each other, in which, when thermal treatment is performed on the first substrate and the second substrate, stress applied to an electrode peripheral portion and an electrode bonding portion is relieved by the surface area of the electrode being enlarged.

(15)

A semiconductor device, including:

a first substrate including a first electrode including a metal; and a second substrate bonded to the first substrate and including a second electrode including a metal, in which a part of a side surface or a bottom surface of a groove in which the first electrode is formed and a part of a side surface or a bottom surface of a groove in which the second electrode is formed form a shape for forming a space in which the metal is not present during bonding.

(16)

The semiconductor device according to (15), in which a film having an upper surface whose position is lower than an upper surface of the metal is formed between the side surface of the groove and the metal.

(17)

The semiconductor device according to (15), in which a part of a bottom of the groove has a concavo-convex shape.

(18)

The semiconductor device according to (15), in which a part of a bottom of the groove is formed in a wine glass shape.

(19)

A semiconductor device manufacturing method, including:

forming, when a metal for forming an electrode is embedded in a groove formed in a stacked film, a space in which the metal is not present in a part of a side surface or a bottom surface of the groove; and bonding a first substrate including the electrode and a second substrate including the electrode to each other, in which, when thermal treatment is performed on the first substrate and the second substrate, the expanded metal enters the space.

(20)

A solid-state imaging device, including:

the semiconductor device according to any one of (1) to (3), (6) to (8), (10) to (13), and (15) to (18), in which the first substrate is a sensor substrate including a pixel region in which a plurality of pixels each including a photoelectric conversion portion are two-dimensionally arranged, and the second substrate is a circuit substrate including a predetermined circuit.

REFERENCE SIGNS LIST 1 solid-state imaging device
11 first substrate
11S first bonding surface
12 pixel
13 pixel region
14 pixel drive line
15 vertical signal line
21 second substrate
21S second bonding surface
22 vertical drive circuit
23 column signal processing circuit
24 horizontal drive circuit
25 system control circuit
100, 200, 300, 400 stacked film
101, 201, 301, 401 inter-layer insulating film
102, 202, 302, 402 liner insulating film
103, 203, 303, 403 inter-layer insulating film
104, 204, 304, 404 metal seed
105, 205, 305, 405 metallic film
111, 211, 311, 411 via
112, 212, 312, 412 trench
121 side roughness
130 space
131, 132 void
230 space
231, 232 concave portion
341 low thermal expansion material
430 space 431 space
432 groove pattern
433 convex portion
1000 imaging device
1001 solid-state imaging device

The invention claimed is:

1. A semiconductor device, comprising:
   a first substrate including a first electrode including a metal; and
   a second substrate bonded to the first substrate and including a second electrode including the metal,
      wherein an acute-angled concavo-convex portion is formed on a side surface of a first groove in which the first electrode is formed and a side surface of a second groove in which the second electrode metal-bonded to the first electrode is formed.

2. The semiconductor device according to claim 1, wherein
   side roughness is formed in a part of the side surface of the first groove, and
   a metal seed corresponding to a shape of the first groove, part of which has the side roughness, is formed between the first groove and the metal.

3. The semiconductor device according to claim 1, wherein
   a part of the side surface of the first groove has an acute-angled concavo-convex shape, and
   a metal seed corresponding to a shape of the first groove is formed between the first groove and the metal.

4. A semiconductor device manufacturing method, comprising:
   forming side roughness in a part of a side surface of a groove in which an electrode including a metal is formed;
   forming a metal seed corresponding to a shape of the groove, part of which has the side roughness, in the groove;
   forming the metal in the groove in which the metal seed is formed, by metal plating growth; and
   bonding a first substrate including the electrode and a second substrate including the electrode to each other,
      wherein, when thermal treatment is performed on the first substrate and the second substrate, the metal expands and enters a space which is formed by insufficient metal plating by the metal seed corresponding to the side roughness in the metal plating growth.

5. A semiconductor device manufacturing method, comprising:
   forming an acute-angled concavo-convex shape in a part of a side surface of a groove in which an electrode including a metal is formed;
   forming a metal seed corresponding to a shape of the groove in the groove;
   forming the metal in the groove in which the metal seed is formed, by metal plating growth; and
   bonding a first substrate including the electrode and a second substrate including the electrode to each other,
      wherein, when thermal treatment is performed on the first substrate and the second substrate, the metal expands and enters a space which is formed by insufficient metal plating by the metal seed corresponding to the acute-angled concavo-convex shape in the metal plating growth.

6. A solid-state imaging device, comprising:
   the semiconductor device according to claim 1, wherein
      the first substrate is a sensor substrate including a pixel region in which a plurality of pixels each including a photoelectric conversion portion is two-dimensionally arranged, and
      the second substrate is a circuit substrate including a predetermined circuit.

* * * * *